United States Patent
Nishi

(10) Patent No.: US 6,690,450 B2
(45) Date of Patent: Feb. 10, 2004

(54) EXPOSURE METHOD, EXPOSURE APPARATUS, METHOD FOR PRODUCING EXPOSURE APPARATUS, AND METHOD FOR PRODUCING DEVICE

(75) Inventor: Kenji Nishi, Yokohama (JP)

(73) Assignee: Nikon Corporation, Tokyo (JP)

(*) Notice: Subject to any disclaimer, the term of this patent is extended or adjusted under 35 U.S.C. 154(b) by 62 days.

(21) Appl. No.: 09/770,190

(22) Filed: Jan. 29, 2001

(65) Prior Publication Data

US 2001/0015795 A1 Aug. 23, 2001

(30) Foreign Application Priority Data

Jan. 31, 2000 (JP) .................................. 2000-027407

(51) Int. Cl.[7] .................... G03B 27/52; G03B 27/42; G03B 27/58; G03B 27/62
(52) U.S. Cl. .................... 355/30; 53/72; 53/76
(58) Field of Search .................... 355/53, 30, 67, 355/72–75; 356/399–401; 250/548

(56) References Cited

U.S. PATENT DOCUMENTS

| | | | | |
|---|---|---|---|---|
| 4,989,031 A | * | 1/1991 | Kamiya | 355/30 |
| 5,508,518 A | * | 4/1996 | Kendall | 250/492.2 |
| 5,559,584 A | * | 9/1996 | Miyaji et al. | 355/73 |
| 5,633,720 A | | 5/1997 | Takahashi | 356/401 |
| 5,696,623 A | * | 12/1997 | Fujie et al. | 359/350 |
| 5,897,986 A | * | 4/1999 | Dunn et al. | 430/394 |
| 5,933,215 A | * | 8/1999 | Inoue et al. | 355/53 |
| 5,983,513 A | | 11/1999 | Yamaguchi et al. | 33/568 |
| 6,031,598 A | * | 2/2000 | Tichenor et al. | 355/67 |
| 6,333,775 B1 | * | 12/2001 | Haney et al. | 355/30 |

FOREIGN PATENT DOCUMENTS

| | | |
|---|---|---|
| EP | 0 951 054 A1 | 10/1999 |
| GB | 2 299 867 A | 10/1996 |
| JP | A-8-293455 | 11/1996 |
| WO | WO 00/74120 A1 | 7/2000 |

OTHER PUBLICATIONS

IBM Technical Disclosure Bulletin, vol. 30 No. 12, May 1988, p. 209.*

* cited by examiner

Primary Examiner—Henry Hung Nguyen
(74) Attorney, Agent, or Firm—Oliff & Berridge, PLC

(57) ABSTRACT

In order to produce an exposure apparatus, a frame mechanism is assembled with a base plate, a column, and a support plate. After that, a sub-chamber provided with an illumination system is installed, and a projection optical system PL is placed on the support plate. Concurrently with this operation, a reticle chamber and a reticle stage system are assembled and adjusted, and a wafer chamber and a wafer stage system are assembled and adjusted. The reticle chamber and the wafer chamber are incorporated into the frame mechanism on which the projection optical system is carried. Piping and other components for supplying the purge gas for transmitting an exposure light beam therethrough are arranged at the inside of the reticle chamber and the wafer chamber. The space between the projection optical system and the wafer chamber is tightly closed with a film-shaped soft shield member having flexibility.

42 Claims, 18 Drawing Sheets

EXPOSURE METHOD, EXPOSURE APPARATUS, METHOD FOR PRODUCING EXPOSURE APPARATUS, AND METHOD FOR PRODUCING DEVICE

BACKGROUND OF THE INVENTION

1. Field of the Invention

The present invention relates to an exposure method and an exposure apparatus to be used when a mask pattern is transferred onto a substrate in the lithography step for producing devices including, for example, semiconductor elements, liquid crystal display elements, plasma display elements, and thin film magnetic heads. The present invention also relates to techniques in relation to the above.

2. Description of the Related Art

High exposure accuracy is required for the exposure apparatus of the full field exposure type (stepper type) or the scanning exposure type (for example, the step-and-scan system) to be used in order to produce semiconductor elements or the like. Therefore, the exposure apparatus adopts arrangements which make it possible to perform highly accurate positioning or highly accurate scanning for the reticle stage system for positioning the reticle as a mask and for the wafer stage system for two-dimensionally moving the wafer as a substrate respectively. The reticle stage system and the wafer stage system have been hitherto assembled successively and directly on a predetermined frame mechanism.

In order to further enhance the resolution, the recent exposure apparatus uses the exposure light beam of the ArF excimer laser (wavelength: 193 nm) having the wavelength shorter than that of the KrF excimer laser (wavelength: 248 nm). Further, it has been investigated to use, for example, the $F_2$ laser beam (wavelength: 157 nm) having the shorter wavelength. However, the vacuum ultraviolet light (VUV light) as described above, which has the wavelength of not more than about 200 nm, has a high absorbance for ordinary air (especially oxygen). Therefore, when the vacuum ultraviolet light is used as the exposure light beam, it is necessary to adopt the following procedure. That is, respective stage systems are tightly enclosed in stage chambers (sub-chambers) respectively, and the gas such as nitrogen gas or helium gas, which has a high transmissivity with respect to the vacuum ultraviolet light, is supplied into the stage chambers. Alternatively, the optical path of the exposure light beam at the inside of the stage chambers is substantially in vacuum. Such a procedure is also adopted in the same manner as described above for the space between adjacent lenses which are arranged at the inside of the projection optical system. Accordingly, it is necessary to adopt the following procedure for the exposure apparatus which uses the vacuum ultraviolet light as the exposure light beam. That is, the projection optical system is installed to the frame mechanism, and the respective stages are successively assembled. After that, the corresponding stage chambers are installed so as to surround the respective stage systems while maintaining the air-tightness.

The exposure apparatus, which uses, for example, the vacuum ultraviolet light as the exposure light beam as described above, is assembled by installing the stage chambers for maintaining the air-tightness after successively assembling the projection optical system and the respective stage systems with respect to the frame mechanism. However, the method, in which the respective stage systems, the stage chambers, and other components are successively assembled with respect to the single flame mechanism as described above, requires a considerable period of time to assemble and adjust the apparatus. Further, a long period of time is required, for example, to adjust the relative positions between the respective stage systems and the projection optical system. Therefore, an inconvenience arises such that the production cost of the exposure apparatus is increased. Further, the method, in which the respective stage systems, the respective stage chambers, and other components are successively assembled as described above, involves the following inconvenience as well. That is, the adjusting process is also complicated when the maintenance is performed for the exposure apparatus. As a result, the time and the cost required for the maintenance are increased.

Further, when it is intended to easily assemble and adjust the exposure apparatus with the arrangement in which the gas having a high transmissivity with respect to the exposure light beam is supplied, for example, to the inside of the respective stage chambers, the following fear occurs. That is, the amount of leak of the gas having the high transmissivity is increased, the concentration of the gas is decreased on the optical path of the exposure light beam, and the intensity of the exposure light beam is lowered on the substrate to be exposed therewith. When the gas having the high transmissivity is an expensive gas such as helium gas, it is necessary to utilize the gas as effectively as possible in order to suppress the running cost.

It is also required for the exposure apparatus of the scanning exposure type that the exposure apparatus is easily assembled and adjusted, and especially the throughput of the exposure step is increased. In relation to the above, when the scanning exposure is performed by synchronously moving the reticle as the mask and the wafer as the substrate, the operations of acceleration, movement at a constant velocity (scanning velocity), and deceleration are performed for each of the reticle stage and the wafer stage. It has been hitherto considered to be sufficient that the scanning velocity is merely increased, in order to increase the throughput of the scanning exposure operation. However, if the scanning velocity is increased, it is necessary to prolong the acceleration time and the deceleration time. Therefore, the high throughput is not necessarily obtained merely by increasing the scanning velocity.

SUMMARY OF THE INVENTION

Taking the foregoing problems into consideration, a first object of the present invention is to provide an exposure method and an exposure apparatus in which stage systems and other components are easily assembled and adjusted.

A second object of the present invention is to provide an exposure method and an exposure apparatus in which stage systems and other components are easily assembled and adjusted, and a gas, which transmits an exposure light beam, is supplied to at least a part of an optical path of the exposure light beam, wherein the gas is effectively utilized to make it possible to maintain a high concentration of the gas on the optical path.

A third object of the present invention is to provide an exposure method and an exposure apparatus in which stage systems and other components are easily assembled and adjusted, and the positional relationship between the respective components is successfully measured easily and correctly.

Another object of the present invention is to provide an exposure method and an exposure apparatus which make it possible to increase the throughput when the scanning exposure is performed.

Still another object of the present invention is to provide a method for efficiently producing the exposure apparatus as described above, and a method for producing devices to make it possible to produce a variety of devices at the low cost or the high throughput by using the exposure apparatus.

Still another object of the present invention is to provide a stage module which is capable of being detachably attached to the exposure apparatus.

According to a first aspect of the present invention, there is provided an exposure apparatus for exposing a second object (W1) with an exposure light beam passing through a first object (R1), the exposure apparatus comprising:

a frame (32 to 37);

a first stage chamber (23) which accommodates a first stage system which carries the first object while holding the first object, the first stage chamber being detachably installed to the frame; and a second stage chamber (38) which accommodates a second stage system (WST) which carries the second object while holding the second object, the second stage chamber being detachably installed to the frame.

In the exposure apparatus according to the present invention as described above, the first and second stage chambers are constructed as modules. The exposure apparatus can be assembled and adjusted easily and quickly by assembling the first and second stage chambers, for example, in parallel, and then installing them to the frame mechanism. Further, the first and second stage chambers can be easily detached from the frame mechanism. Therefore, it is also easy to perform the maintenance for the exposure apparatus.

In this arrangement, it is also preferable that a projection system (PL), which projects an image of a pattern on the first object onto the second object, is installed to the frame, and the second stage system to be used is a double-stage system including a first substrate stage (40A) which drives a first substrate (W1) as the second object, and a second substrate stage (40B) which drives a second substrate (W2) as the second object.

The frame includes, for example, a first base member (32, 39) on which the second stage chamber is placed, a second base member (35) which is arranged on the first base member with a vibration-preventive pedestal (34) intervening therebetween and on which the first stage chamber is placed, and a third base member (37) which is arranged on the first base member with a vibration-preventive pedestal (36) intervening therebetween and to which the projection system is installed. The vibration, which is generated in each of the stage systems, does not make any harmful influence to other portions, by allowing the vibration-preventive pedestals to intervene as described above.

It is desirable that the apparatus further comprises a gas supply apparatus (4 to 6, 7A, 7B) which supplies a gas for transmitting the exposure light beam therethrough, to the inside of the first stage chamber, the second stage chamber, and the projection system; a first covering member (18C) which seals (substantially isolates from the atmospheric air) space between the first stage chamber and the projection system; and a second covering member (18D) which seals (substantially isolates from the atmospheric air) space between the projection system and the second stage chamber. For example, the first and second stage chambers are installed to the frame mechanism, and then the two covering members are installed. Thus, it is easy to decrease the amount of leak of the gas transmitting the exposure light beam therethrough, from the optical path of the exposure light beam ranging from the inside of the first stage chamber to the inside of the second stage chamber, and it is possible to maintain a high intensity of the exposure light beam.

It is also preferable that the exposure apparatus of the present invention is provided with a transport chamber (70) in which a transport system (WRDA) for transporting the second object into the second stage chamber is accommodated; and a gas supply apparatus (4 to 6, 7A, 7B) which supplies a gas for transmitting the exposure light beam therethrough, to the inside of the first stage chamber, the second stage chamber, and the transport chamber respectively to make control so that the concentration of the gas for transmitting the exposure light beam therethrough in the second stage chamber is higher than that in the transport chamber. Accordingly, it is possible to decrease the amount of use of the gas on condition that the transmissivity of the exposure light beam is increased.

The exposure apparatus may further comprise gas supply tubes which connect the first stage chamber, the second stage chamber, and the transport chamber to the gas supply apparatus respectively, solenoid-operated valves which are provided for the respective gas supply tubes, and a gas control system which controls operation of the solenoid-operated valves. The exposure apparatus may further comprise a sensor which measures a concentration of a light-absorbing substance in the first stage chamber, the second stage chamber, and the transport chamber, wherein the gas supply apparatus may supply the gas to the first stage chamber, the second stage chamber, and the transport chamber on the basis of the concentration of the light-absorbing substance measured by the sensor. Each of the second stage chamber and the transport chamber may be provided with an opening for receiving the second object, an opening for feeding the second object, and a shutter for closing the opening for feeding the second object. The shutter may be divided into two in the vertical direction, and the opening degree of the opening may be regulated depending on the size of the second object.

According to the second aspect of the present invention, there is provided an exposure apparatus for exposing a second object (W1) with an exposure light beam passing through a first object (R1), the exposure apparatus comprising:

a first stage chamber (23) which accommodates a first stage (RST) which moves the first object;

a first measuring system (25Y) which measures a position of the first stage (RST) in the first stage chamber (23);

a second stage chamber (38) which accommodates a second stage (WST) which moves the second object (W1);

a second measuring system (50AY) which measures a position of the second stage (WST) in the second stage chamber (38); and a main measuring system (54Y, 57Y) which measures positions of the first stage chamber (23) and the second stage chamber (32).

According to the exposure apparatus as described above, the positions of the respective stages in the first and second stage chambers are measured by the first and second measuring systems respectively. The positions of the respective stage chambers are measured by the main measuring system. Therefore, it is possible to measure the positional relationship between the respective stage systems easily and correctly.

In this arrangement, the exposure apparatus may further comprise a projection system (PL) which projects an image of a pattern on the first object onto the second object;

wherein the main measuring system may include a third measuring system (54Y) which measures a positional relationship between the first stage chamber and the projection system, and a fourth measuring system (57Y) which measures a positional relationship between the second stage chamber and the projection system. Accordingly, it is possible to highly accurately measure the positions of the respective stages and the positional relationship thereof on the basis of the projection system.

The exposure apparatus according to the present invention may further comprise a main control system (200), wherein the main control system may determine the position of the first stage from measurement results obtained by the first measuring system and the third measuring system, and it may determine the position of the second stage from measurement results obtained by the second measuring system and the fourth measuring system. The main control system may drive the first stage and the second stage while controlling the positions or velocities of the first and second stages on the basis of the determined positions of the first stage and the second stage.

In this arrangement, the first measuring system may be attached to a side surface of the first stage chamber, and the second measuring system may be attached to a side surface of the second stage chamber. The first to fourth measuring systems may be first to fourth interferometers respectively, a reflecting mirror for the third interferometer may be attached to an outer surface of the first stage chamber, and a reflecting mirror for the fourth interferometer may be attached to an outer surface of the second stage chamber. Especially, the reflecting mirror for the third interferometer may be attached to the first interferometer embedded in a side wall of the first stage chamber, and the reflecting mirror for the fourth interferometer embedded in a side wall of the second stage chamber may be attached to the second interferometer.

According to a third aspect of the present invention, there is provided an exposure apparatus for exposing a second object with an exposure light beam passing through a first object while synchronously moving the first object (R1) and the second object (W2), the exposure apparatus comprising:

a stage system which moves one of the first object and the second object; and a main control system which controls the stage system so that the one of the first object and the second object is accelerated at a predetermined rate of acceleration until a predetermined scanning velocity is obtained, and the one of the first object and the second object is moved at the predetermined scanning velocity, wherein:

the scanning velocity is determined so that exposure time is substantially shortest depending on the rate of acceleration.

In the exposure apparatus according to this aspect, assuming that LY represents a width of a comparted area (29) in a scanning direction to be exposed by one time of scanning exposure for the first object or the second object as the driving object, D represents a width (slit width) of an exposure area (28) in the scanning direction to be exposed with the exposure light beam for the driving object, Wα represents the rate of acceleration, and VW represents the scanning velocity; the scanning velocity VW is determined, for example, so that a value of ΔT, which is defined by the following expression, is substantially minimum.

$$\Delta T = 2 \cdot VW/W\alpha + (LY+D)/VW \quad (1)$$

The first term of the exposure time ΔT is the sum of the acceleration time and the deceleration time, and the second term is the time (exposure time in narrow definition) in which the exposure is performed at the scanning velocity VW in the exposure area for the comparted area. That is, when the scanning velocity VW is increased, then the exposure time in the narrow definition is shortened, but the acceleration and deceleration time is prolonged. Therefore, the scanning velocity is optimized so that the highest throughput is obtained, by determining the scanning velocity VW so that the sum ΔT of the both is shortest.

According to a fourth aspect of the present invention, there is provided a method for producing an exposure apparatus for exposing a second object (W1) with an exposure light beam passing through a first object (R1), the method comprising:

a first step of assembling a frame (32 to 37);

a second step of assembling a first stage system which moves the first object, accommodating the first stage system in a first stage chamber (23), and detachably installing the first stage chamber to the frame; and a third step of assembling a second stage system which moves the second object, accommodating the second stage system in a second stage chamber (38), and detachably installing the second stage chamber to the frame. According to the method for producing the exposure apparatus as described above, it is possible to efficiently produce the exposure apparatus according to the first aspect of the present invention. Especially, the first stage system and the second stage system can be assembled separately from the frame, and then they can be installed to the frame together with the stage chambers. Therefore, it is easy to perform the operation for assembling the precise stage. It is also easy to perform the maintenance operation after the assembling.

It is desirable that the method further comprises a fourth step of installing, to the frame, a projection system (PL) for projecting an image of a pattern on the first object onto the second object, wherein a cutout (38a), through which the projection system is capable of passing, is provided beforehand at an upper portion of the second stage chamber, and the second stage chamber and the projection system are relatively moved in the fourth step. Accordingly, the second stage chamber and the projection system can be installed to the frame mechanism easily and highly accurately.

According to a fifth aspect of the present invention, there is provided an exposure method for exposing a second object with an exposure light beam passing through a first object, the exposure method comprising:

moving, in a first stage chamber, a first stage which holds the first object, while irradiating the first object with the exposure light beam; and moving, in a second stage chamber, a second stage which holds the second object, in synchronization with the first stage, wherein:

the first stage chamber and the second stage chamber are modules which include a first stage system having the first stage and a second stage system having the second stage respectively. The exposure method further comprises supplying, to the first stage chamber and the second stage chamber, a gas which does not substantially absorb the exposure light beam.

According to a sixth aspect of the present invention, there is provided an exposure method for exposing a second object with an exposure light beam passing through a first object with an exposure apparatus provided with a first stage which moves the first object and a second stage which moves the second object in synchronization with the first object, the exposure method comprising:

measuring a position of the first stage at the inside of a first stage chamber which accommodates the first stage;

measuring a position of the second stage at the inside of a second stage chamber which accommodates the second stage;

measuring positions of the first stage chamber and the second stage chamber in the exposure apparatus respectively; and exposing the second object with the exposure light beam passing through the first object, while controlling the positions or velocities of the first stage and the second stage, on the basis of the measured positions of the first stage and the second stage and the measured positions of the first stage chamber and the second stage chamber. In this exposure method, when the first stage and the second stage are synchronously moved to perform the exposure, the positions of the stages are determined on the basis of the positions in the stage chambers and the positions of the stage chambers. The positions or the velocities of the stages are controlled in accordance with the determined positions. Therefore, the positions of the stages are adjusted relatively easily when the exposure apparatus is assembled. The exposure apparatus to be used may further comprise a projection system which projects a pattern on the first object onto the second object. In this case, the positions of the first stage chamber and the second stage chamber in the exposure apparatus are a position of the first stage chamber with respect to the projection system and a position of the second stage chamber with respect to the projection system. Further, the position of the first stage with respect to the projection system may be determined from the measured position of the first stage at the inside of the first stage chamber and the position of the first stage chamber with respect to the projection system, and the position of the second stage with respect to the projection system may be determined from the measured position of the second stage at the inside of the second stage chamber and the position of the second stage chamber with respect to the projection system.

According to a seventh aspect of the present invention, there is provided an exposure method for exposing a second object with an exposure light beam passing through a first object, while synchronously moving the first object and the second object, the exposure method comprising:

accelerating the first object or the second object at a predetermined rate of acceleration until a predetermined scanning velocity is obtained; and irradiating the first object with the exposure light beam, while moving the first object or the second object at the scanning velocity, wherein:

the scanning velocity is determined so that exposure time is substantially shortest depending on the rate of acceleration. In this exposure method, the scanning velocity is optimized so that the highest throughput is obtained, by determining the scanning velocity so that the exposure time is minimum as expressed by the expression (1).

According to an eighth aspect of the present invention, there is provided a stage module comprising:

a stage apparatus which moves an object while holding the object;

a stage chamber which accommodates the stage apparatus; and a measuring system which is attached to a wall surface of the stage chamber and which measures a position of a stage in the stage chamber. The stage module according to the present invention accommodates the stage apparatus, and the module can be detachably attached to an exposure apparatus. Therefore, when the stage apparatus is assembled to the exposure apparatus, it is sufficient to attach the stage module to a frame of the exposure apparatus. It is easy to perform the operation for producing the exposure apparatus. The stage module may further comprise a loader chamber which accommodates a loader for charging the object into the stage chamber, the loader chamber being connected to the stage chamber. It is noted that the stage module resides in a concept which includes the stage chamber and the stage apparatus accommodated therein as a kit. It is also preferable to use a module structure in which a stage apparatus is already supported (arranged) on a bottom surface of a box-shaped stage chamber as described later on. It is also preferable that no specified connecting relationship is formed between a stage chamber and a stage apparatus. In the case of the latter, when the stage module is assembled, for example, to a frame of an exposure apparatus, it is possible to successively assemble the stage apparatus and the stage chamber to the frame.

According to another aspect of the present invention, there is provided a method for producing a device, comprising the step of transferring a mask pattern (R1, R2) onto a workpiece (W1, W2) by using any one of the exposure apparatuses according to the present invention. According to the present invention, it is possible to produce a variety of devices at low cost or at high throughput.

DESCRIPTION OF THE PREFERRED EMBODIMENTS

Figure 1:
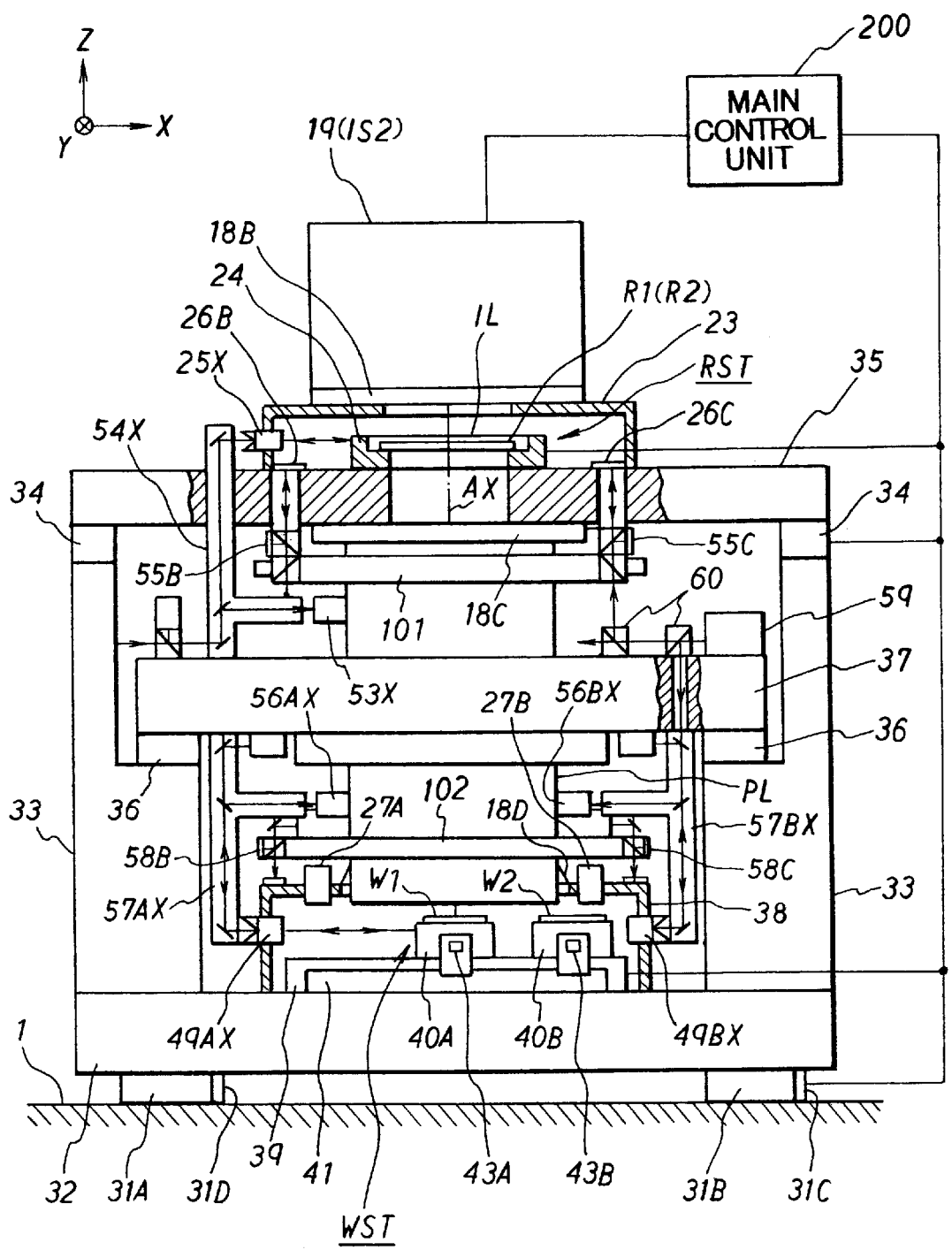
FIG. 1 shows, with partial cutout, a schematic arrangement illustrating an exemplary projection exposure apparatus according to an embodiment of the present invention.
Figure 2:
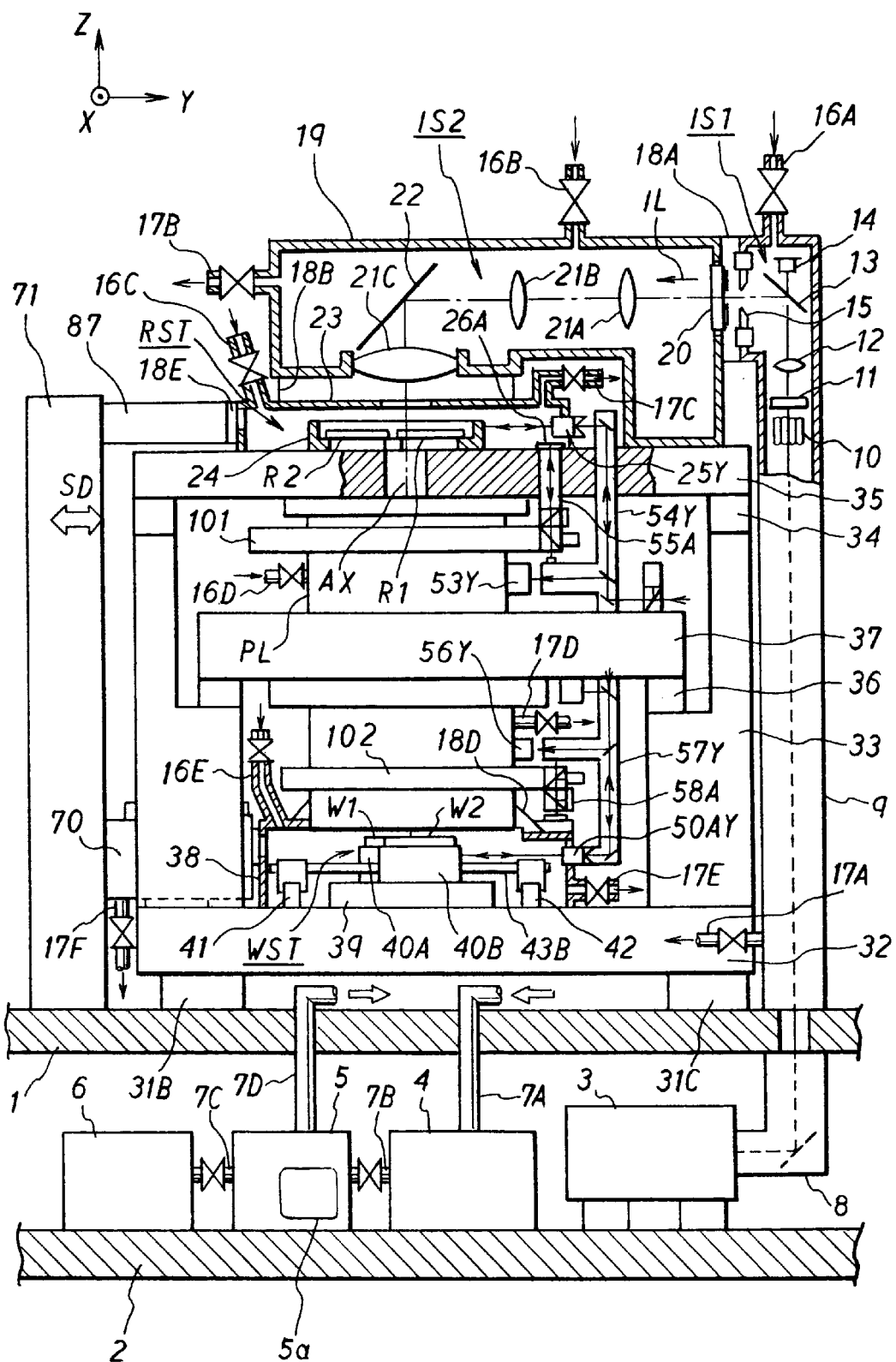
FIG. 2 shows, with partial cutout, a right side view illustrating the projection exposure apparatus shown in FIG. 1.

An embodiment of the present invention will be explained below with reference to the drawings. In this embodiment, the present invention is applied to a projection exposure apparatus of the scanning exposure system based on the step-and-scan system or the step-and-stitch system. FIG. 1 shows a front view illustrating the projection exposure apparatus according to this embodiment, and FIG. 2 shows a side view illustrating the projection exposure apparatus. With reference to FIGS. 1 and 2, for example, the major portion of the projection exposure apparatus of this embodiment is installed in a clean room on a floor 1 of a semiconductor-producing factory. An exposure light source 3 of the projection exposure apparatus is installed on a floor 2 in a semi-clean room of a machine room disposed under the floor 1. An ArF excimer laser light source (wavelength: 193 nm) is used as the exposure light source 3. However, it is also possible to use other light sources for emitting the vacuum ultraviolet light (light having a wavelength of not more than 200 nm in this embodiment) including, for example, an $F_2$ laser light source (wavelength: 157 nm), a $Kr_2$ laser light source (wavelength: 146 nm), a high harmonic wave generator of YAG laser, and a high harmonic wave (higher harmonics) generator of semiconductor laser. However, the present invention is applicable, for example, even when a KrF excimer laser light source (wavelength: 248 nm) or a mercury lamp (i-ray or the like) is used as the exposure light source 3.

When the vacuum ultraviolet light is used as the exposure light beam as in this embodiment, the vacuum ultraviolet light is greatly absorbed by any light-absorbing substance (impurity) such as oxygen, water vapor, hydrocarbon gas (for example, carbon dioxide), organic matter, and halide existing in the ordinary atmospheric air. Therefore, in order to avoid the attenuation of the exposure light beam, it is desirable that the concentration of the gas of the light-absorbing substance as described above is suppressed to be not more than about 10 ppm to 100 ppm in average on the optical path of the exposure light beam. Therefore, in this embodiment, the gas on the optical path of the exposure light beam is substituted with a gas through which the exposure light beam is transmitted, i.e., a gas (hereinafter referred to as "purge gas" as well) such as a rare gas including, for example, nitrogen ($N_2$) gas, helium (He), neon (Ne), argon (Ar), krypton (Kr), xenon (Xe), or radon (Rn) which has a high transmissivity with respect to the exposure light beam, which is chemically stable, and from which the light-absorbing substance is highly removed. The nitrogen and the rare gas are collectively referred to as "inert gas" as well.

The concentration (or its allowable value) of the light-absorbing substance (impurity) may differ depending on the type of the light-absorbing substance existing on the optical path of the exposure light beam. For example, the following procedure may be available. That is, the concentration of the organic light-absorbing substance is managed most strictly so that the concentration is not more than about 1 to 10 ppm. The concentration is mitigated or loosened to follow the above in an order from water vapor to other substances. The nitrogen gas can be used in the vacuum ultraviolet region as the gas (purge gas) through which the exposure light beam is transmitted up to a wavelength of about 150 nm. However, the nitrogen gas substantially acts as the light-absorbing substance with respect to the light having a wavelength of not more than about 150 nm. Therefore, it is desirable that the rare gas is used as the purge gas for the exposure light beam having a wavelength of not more than about 150 nm. In view of, for example, the stability of the refractive index and the high coefficient of thermal conductivity, it is desirable to use the helium gas among the rare gases. However, it is allowable that any other rare gas is used when the running cost or the like is considered to be important, because helium is expensive. As for the purge gas, there is no limitation to the supply of the gas of a single type. It is also preferable to supply a mixed gas such as a gas obtained, for example, by mixing nitrogen and helium at a predetermined ratio.

In this embodiment, giving much weight, for example, to the stability of the refractive index (stability of the image formation characteristics) and the high coefficient of thermal conductivity, the helium gas is used as the purge gas. Accordingly, a main body section of a gas supply apparatus is installed on the floor 2 in order to supply the high purity purge gas to a plurality of air-tight chambers in the projection exposure apparatus and apparatuses provided therewith, and recover and reuse the gas flowing through the air-tight chambers. Further, in this embodiment, the same gas as the purge gas is also used as the gas which is used for the purpose of buffering action for air bearings (air pads) to be used for respective stage systems. The same gas as the purge gas is also supplied to optical paths of measuring beams of laser interferometers to be used as measuring systems, for example, for the respective stage systems. This arrangement is provided with a mechanism for measuring the refractive index of the gas (purge gas) on the optical path of the measuring beam. The measured value obtained by the laser interferometer is corrected on the basis of the measured value obtained by the mechanism for measuring the refractive index.

Even in the case of an identical light-absorbing substance, it is also preferable that its concentration (upper limit value) is allowed to differ in a plurality of air-tight chambers. For example, the following procedure may be available. That is, the concentration is managed most strictly (so that the concentration is low) in the air-tight chambers for accommodating the projection optical system and the illumination system, and the concentration is managed relatively loosely (so that the concentration is high) in other air-tight chambers. In this procedure, the following arrangement may be also available. That is, at least a part of the purge gas, which has been supplied to at least one of the air-tight chambers for the projection optical system and the illumination system, is continuously supplied to another air-tight chamber such as the stage chamber and the air pad described above. In this arrangement, when the concentration of the light-absorbing substance in the another chamber arranged on the downstream side exceeds the upper limit value, it is also preferable that a chemical filter for removing the light-absorbing substance from the purge gas is provided on the upstream side of the another air-tight chamber.

The main body section of the gas supply apparatus comprises, for example, a recovery unit 4 including a vacuum pump for recovering the purge gas containing impurities, an accumulating unit 6 for accumulating the high purity purge gas, and a gas-feeding unit 5 for adjusting the temperature of the purge gas and supplying the purge gas to the outside thereof. The recovery unit 4 aspirates the gas in the desired air-tight chamber at a slightly low gas pressure by the aid of a gas discharge tube 7A in accordance with the gas flow control based on a substantially steady flow. The recovery unit 4 separates the purge gas from the aspirated gas, and it temporarily accumulates the separated purge gas. The accumulated purge gas is supplied to the gas-feeding unit 5 via a piping 7B, if necessary. The purge gas, which is compressed at a high pressure at the inside of accumulating unit 6 or which is liquefied and accumulated, is supplied by the accumulating unit 6 to the gas-feeding unit 5 via a piping 7C, if necessary. The gas-feeding unit 5 adjusts the temperature of the purge gas supplied via pipings 7B, 7C. The gas-feeding unit 5 removes the light-absorbing substance and other components from the purge gas by the aid of a filter section including, for example, a dust-removing filter such as a HEPA filter (high efficiency particulate air-filter), and a chemical filter for removing the light-absorbing substance described above containing minute amounts of organic substances or the like. The purge gas, which is adjusted for the temperature and from which dust is removed, is supplied by the gas-feeding unit 5 at a gas pressure (positive pressure) slightly higher than the atmospheric pressure to the desired air-tight chamber via a gas feed tube 7D.

The following procedure may be adopted. That is, the purge gas, which is recovered by the recovery unit 4, is supplied only to the air-tight chamber in which no trouble occurs even when the concentration of the organic light-absorbing substance or the like is managed relatively loosely, for example, only to the air-tight chamber in which the reticle loader system or the wafer loader system is accommodated. The new purge gas, which is supplied from the accumulating unit 6, is always supplied into the air-tight chamber through which the exposure light beam passes. Accordingly, the concentration of the light-absorbing substance can be accurately controlled to be the preset concentration for each of the air-tight chambers, on condition that the efficiency of use of the purge gas is increased.

The arrangement of the projection exposure apparatus of the embodiment of the present invention will be explained in detail below. At first, with reference to FIG. 2, the exposure light beam (illumination light beam for the exposure) IL, which is composed of a pulse laser beam having a wavelength of 193 nm as the exposure beam radiated from the exposure light source 3 on the floor 2, passes along a mirror disposed in an auxiliary chamber 8, and it is reflected upwardly. The exposure light beam is adjusted for the optical axis by the aid of a beam matching unit (not shown) disposed in a first sub-chamber 9 on the floor 1 located thereover, and it comes into a first illumination system IS1. The cross-sectional configuration of the exposure light beam IL is shaped by the aid of a beam-shaping optical system (not shown). The pulse energy is adjusted by a light-reducing filter section (not shown) capable of switching the transmissivity. The exposure light beam IL comes into a fly's eye lens 10 which serves as an optical integrator (uniformizer, or homogenizer) for uniformizing the illuminance distribution.

The outgoing plane of the fly's eye lens 10 is arranged to coincide with the optical Fourier transformation plane (pupil plane of the illumination optical system) with respect to the pattern plane (hereinafter referred to as "reticle plane") of the reticle R1 (or R2) as an object to be illuminated, by the aid of the succeeding optical system. A diaphragm-switching member 11 for determining the numerical aperture of the exposure light beam is arranged on the pupil plane. A plurality of aperture diaphragms ($\sigma$ diaphragms) for the illumination system including, for example, an aperture diaphragm for normal illumination, an aperture diaphragm for the small coherence factor ($\sigma$ value), an aperture diaphragm for zonal illumination, and an aperture diaphragm for modified illumination having a plurality of apertures are exchangeably arranged for the diaphragm-switching member 11. The $\sigma$ diaphragm, which corresponds to the illumination condition, is installed on the optical path of the exposure light beam IL by means of the control performed by a main control system (200) which collectively manages and controls the operation of the entire apparatus.

Alternatively, at least one of optical members including, for example, a diffraction optical element, a zoom lens, and an axicon (conical prism) may be arranged on the side deviated toward the exposure light source from the optical integrator (fly's eye lens 10), in place of the diaphragm-switching member 11 or in combination of the diaphragm-switching member 11 so that the light amount distribution of the illumination optical system on the pupil plane may be variable. Accordingly, it is possible to increase the efficiency of use of the exposure light beam IL.

The exposure light beam IL, which has passed through the σ diaphragm, passes through a first relay lens system 12, and it comes into a beam splitter 13 having a large reflectance and a small transmissivity. The light beam, which is transmitted through the beam splitter 13, is received by an integrator sensor 14 composed of a photoelectric detector. The pulse energy of the exposure light beam IL is controlled so that the proper exposure energy is obtained on the wafer, on the basis of a detection signal obtained by the integrator sensor 14. On the other hand, the illumination light beam IL, which is reflected by the beam splitter 13, substantially horizontally comes into a variable field diaphragm 15 which is arranged at the outgoing plane of the first illumination system IS1. The arrangement plane of the variable field diaphragm 15 is substantially conjugate with the reticle plane. The variable field diaphragm 15 plays a role to open/close the field so that any pattern other than the original circuit pattern is not subjected to exposure upon the start and the end of the scanning exposure for each shot area on the wafer W1 (or W2) as the substrate to be exposed. The first illumination system IS1, for which the variable field diaphragm 15 with a fear of generating any vibration when the field is opened or closed, is supported in the first sub-chamber 9 separately from the main exposure apparatus body. Therefore, the exposure accuracy for the main exposure apparatus body (for example, the overlay accuracy and the transfer faithfulness) is improved.

The variable field diaphragm 15 is constructed as follows. That is, the field is not only opened/closed upon the start and the end of the scanning exposure, i.e., the width of the field concerning the scanning direction is not only changed, but also the width of the field in the non-scanning direction can be changed depending on the size of the circuit pattern as the transfer objective concerning the non-scanning direction. The first illumination system IS1 is constructed by the components ranging from the beam-shaping optical system (not shown) to the variable field diaphragm 15. The first illumination system IS1 is accommodated in the first sub-chamber 9 having a box-shaped configuration with high air-tightness.

The exposure light beam IL, which has passed through the variable field diaphragm 15, comes into a second illumination system IS2 in a second sub-chamber 19 which is attached to a frame mechanism of the main exposure apparatus body. A fixed field diaphragm 20 is arranged on the incoming plane of the second illumination system IS2, i.e., on the plane which is defocused by a predetermined amount from the conjugate plane with respect to the reticle plane. The fixed field diaphragm 20 is formed with an aperture for defining the illumination area on the reticle plane to be a slender slit-shaped area in the non-scanning direction perpendicular to the scanning direction. The exposure light beam IL, which has passed through the fixed field diaphragm 20, passes through a second relay lens system 21A, a lens system 21B, an optical path-bending mirror 22, and a condenser lens system 21C disposed in the second illumination system IS1, and it illuminates an illumination area on the pattern plane of the reticle R1 as the mask. The second illumination system IS2 is constructed by the components ranging from the fixed field diaphragm 20 to the condenser lens system 21C. The second illumination system IS2 is accommodated in the second sub-chamber 19 having a box-shaped configuration with high air-tightness. The illumination optical system is constructed by the first illumination system IS1 and the second illumination system IS2. The fixed field diaphragm 20 may be arranged on a plane which is separated from the reticle plane by a predetermined spacing distance, not on the plane which is defocused from the conjugate plane with respect to the reticle plane as described above.

With reference to FIG. 1, when the illumination light beam IL is radiated, the image of the pattern in the illumination area of the reticle R1 (or R2) is projected onto the slit-shaped exposure area on the wafer W1 (or W2) applied with photoresist as the photosensitive substrate (substrate to be exposed) at a projection magnification β (β is, for example, ¼-fold or ⅕-fold) via the projection optical system PL as the projection system. In this state, the reticle R1 and the wafer W1 are synchronously moved in the predetermined scanning direction while using the projection magnification β as the velocity ratio. Accordingly, the image of the pattern on the reticle R1 is transferred to one shot area on the wafer W1. The reticles R1, R2 and the wafers W1, W2 correspond to the first object and the second object of the present invention respectively. Each of the wafers W1, W2 is a disk-shaped substrate having, for example, a diameter of 200 mm or 300 mm made of, for example, a semiconductor (silicon or the like) or SOI (silicon on insulator).

Those usable as the projection optical system PL include, for example, a cata-dioptric system of the normal cylinder type which is constructed by arranging a plurality of refractive lenses and two concave mirrors having apertures in the vicinity of the optical axis respectively along one optical axis, and a refractive system of the normal cylinder type which is constructed by arranging refractive lenses along one optical axis, as disclosed, for example, in International Publication WO00/39623. It is also allowable to use, for example, a cata-dioptric system of the double-cylinder type as the projection optical system PL. The following explanation will be made assuming that the Z axis extends in parallel to the optical axis AX of the projection optical system PL, the Y axis extends in the scanning direction for the reticle R1 and the wafer W1 during the scanning exposure (i.e., in the direction perpendicular to the plane of paper of FIG. 1) in the plane (substantially coincident with the horizontal plane in this embodiment) perpendicular to the Z axis, and X axis extends in the non-scanning direction (i.e., in the direction parallel to the plane of paper of FIG. 1).

Explanation will now be made for the overall structure of the main exposure apparatus body of this embodiment including the stage system for supporting the reticles R1, R2, the projection optical system PL, and the stage system for supporting the wafers W1, W2. That is, a base plate 32 having high rigidity is installed by the aid of vibration-preventive pedestals 31A to 31D at four places (they may be placed at three places as well) approximately arranged at apexes of a square on the floor 1. A wafer base 39 is installed at a central portion of the base plate 32. The base plate 32 and the wafer base 39 correspond to the first base member of the present invention. An electric level (not shown) is installed on the base plate 32. Each of the vibration-preventive pedestals 31A to 31D is a vibration-preventive apparatus of the active type including a mechanical damper such as an air damper or a hydraulic pressure damper which endures the heavy weight, and an electromagnetic damper composed of an actuator such as a voice coil motor. For example, the electromagnetic dampers in the four vibration-preventive pedestals 31A to 31D are driven so that the angle of inclination (angle of inclination about two axes) of the base plate 32 with respect to the horizontal plane, which is detected by the level, is included in an allowable range. The hydraulic pressure, the oil pressure or the like of the mechanical damper is controlled, if necessary. In this arrangement, the vibration from the floor, which has a high frequency, is attenuated before transmission to the main exposure apparatus body. The remaining vibration, which has a low frequency, is attenuated by the electromagnetic dampers. In place of the level, it is also preferable to use, for example, a detector (for example, a laser interferometer) for optically detecting the inclination of the corresponding member, or a sensor of the electrostatic capacity type.

Four columns 33 are fixed on the upper surface of the base plate 32 so that they are approximately positioned at four apexes of a square. A support plate 35, which is provided at its central portion with an opening for allowing the exposure light beam IL to pass therethrough, is fixed on the upper surfaces of the four columns 33 by the aid of vibration-preventive pedestals 34 disposed at four places. The vibration-preventive pedestal 34 is an active type vibration-preventive apparatus constructed in the same manner as each of the vibration-preventive pedestals 31A to 31D (however, the resistance to load is small). The columns 33, the vibration-preventive pedestals 34, and the vibration-preventive pedestals 31A to 31D may be arranged at three places so that they are approximately positioned at apexes of a regular triangle. As shown in FIG. 2, the second sub-chamber 19, in which the second illumination system IS2 is accommodated, is installed on the support plate 35.

Returning to FIG. 1, the support plate 35 also corresponds to the second base member of the present invention. The upper surface of the support plate 35 is finished into a guide surface which has an extremely excellent flatness. The reticle stage 24 is placed on the guide surface so that the reticle stage 24 is smoothly slidable two-dimensionally by the aid of air bearings. The reticle R1 is held on the reticle stage 24 by means of, for example, vacuum attraction. As shown in FIG. 2, another reticle R2 is held in an area on the reticle stage 24 adjoining the reticle R1 in the scanning direction SD. The apparatus is constructed, for example, so that the double exposure is efficiently executed. As described above, the reticle stage 24 of this embodiment is based on the double-holder system. However, it is also preferable to adopt the double-stage system in which a movable stage is used for each of the reticles.

The reticle stage 24 comprises, for example, a finely movable stage for holding the reticle R1, R2, and a frame-shaped coarsely movable stage for surrounding the finely movable stage. The latter coarsely movable stage is driven in the Y direction (scanning direction) by using an unillustrated linear motor. The former finely movable stage is finely moved in the X direction, the Y direction, and the rotation direction with respect to the coarsely movable stage by using, for example, three actuators. Accordingly, the reticle R1, R2 can be driven highly accurately at a desired scanning direction in the +Y direction or in the −Y direction, and it is possible to correct the synchronization error. During this process, the reticle stage 24 is driven so that the law of conservation of momentum is satisfied with respect to the Y direction by using an unillustrated movable member. Thus, little vibration is generated during the scanning exposure. An X axis reticle interferometer 25X, which is composed of a laser interferometer, is arranged in order to detect the position information on the reticle stage 24 in the X direction. As shown in FIG. 2, a Y axis reticle interferometer 25Y is arranged in order to detect the position information on the reticle stage 24 in the Y direction. The reticle interferometers 25X, 25Y measure the position of the reticle stage 24 on the basis of internal reference mirrors (not shown) respectively, and they include interferometers having a plurality of axes respectively. Accordingly, they also measure the angle of rotation of the reticle stage 24 about the X axis (pitching amount), the angle of rotation about the Y axis (rolling amount), and the angle of rotation about the Z axis (yawing amount).

In this embodiment, the reticle stage system RST is constructed, for example, by the reticle stage 24, a driving unit therefor (not shown), and the reticle interferometers 25X, 25Y. The reticle stage system RST is covered with a box-shaped reticle chamber 23 (first stage chamber) having high air-tightness. A window for allowing the exposure light beam IL to pass therethrough is formed at a central portion of the upper plate of the reticle chamber 23. The positional relationship (positions in the X direction and the Y direction and the angle of rotation) of the reticle stage 24 (reticles R1, R2) with respect to the reticle chamber 23 is measured by the reticle interferometers 25X, 25Y. Parts of the reticle interferometers 25X, 25Y are embedded in the side surface of the reticle chamber 23 respectively.

With reference to FIG. 1, a support plate 37, which serves as the third base member, is fixed at four stepped sections at an approximately intermediate height of the four columns 33 by the aid of vibration-preventive pedestals 36. The projection optical system PL is installed by the aid of a flange to a U-shaped cutout (not shown) which is provided for the support plate 37. That is, the projection optical system PL is supported by the support plate 37 so that it may be inserted and withdrawn in the +Y direction (rightward direction in FIG. 2) with respect to the support plate 37. The vibration-preventive pedestal 36 is an active type vibration-preventive apparatus which is constructed in the same manner as the vibration-preventive pedestal 31A to 31D (however, the endurable load is small). When the columns 33 are arranged at three placed, the vibration-preventive pedestals 36 are also arranged at three places. In this embodiment, the assembly (32 to 37) of the base plate 32, the wafer base 39, the column 33, the vibration-preventive pedestals 34, the support plate 35, the vibration-preventive pedestals 36, and the support plate 37 corresponds to the frame mechanism (or frame) in the present invention.

A first fiducial plate 101 and a second fiducial plate 102, each of which has a ring-shaped configuration, are fixed to the upper end portion and the lower end portion of the projection optical system PL so that the support plate 37 is interposed therebetween. A light source unit 59 for the laser interferometers is installed at the end of the upper surface of the support plate 37. The laser beam, which is radiated from the light source unit 59 and which is stabilized for the wavelength (for example, the He—Ne laser beam having a wavelength of 633 nm), is branched into measuring laser beams having a plurality of axes (about eleven axes in this embodiment) by the aid of a branching optical system 60. The first and second laser beams of them are supplied to interferometer units 55B, 55C which are arranged on the first fiducial plate 101 so that the projection optical system PL is interposed therebetween in the X direction. The third laser beam is supplied to an interferometer unit 55A which is arranged at the end of the first fiducial plate 101 in the Y direction.

Each of the interferometer units 55A to 55C comprises an optical system for radiating the laser beam onto an internal reference mirror and a plane mirror 26A to 26C (corresponding to a movement mirror (reflecting mirror attached to a movable object, i.e., an object having a position which is intended to be determined) of an ordinary interferometer) arranged on the bottom surface (upper surface of the support plate 35) of the reticle chamber 23, a photoelectric conversion section for photoelectrically converting an interference light beam of the two laser beams from the plane mirror and the reference mirror, and a signal-processing section for determining the displacement amount in the Z direction of the plane mirror with respect to the reference mirror, for example, with a resolution of about 10 nm to 100 nm from a photoelectric conversion signal supplied from the photoelectric conversion section. The information on the displacement amount is supplied to an unillustrated attitude control system. The interferometer units, which will be described later on, are constructed in the same manner as described above. The attitude control unit determines the displacement amount in the Z direction and the angle of inclination about the two axes, i.e., about the X axis and the Y axis, of the guide surface of the reticle stage 24, from the displacements in the Z direction of the plane mirrors 26A to 26C disposed at the three places. The expansion/contraction amounts of the electromagnetic dampers of the four vibration-preventive pedestals 34 are controlled so that the displacement amounts and the angle of inclination are included within allowable ranges. Accordingly, for example, when the support plate 35 is vibrated, for example, by any slight vibration upon the driving of the reticle stage 24, it is possible to suppress the vibration at a high speed. Thus, the exposure accuracy is improved.

With reference to FIGS. 1 and 2, an X axis interferometer unit 54X and a Y axis interferometer unit 54Y, which are composed of laser interferometers respectively, are installed at the end in the −X direction and the end in the +Y direction on the upper surface of the support plate 37 respectively. The two laser beams, which are branched by the branching optical system 60, are also supplied to the interferometer units 54X, 54Y. Reference mirrors 53X, 53Y are fixed to the side surfaces in the X direction and the Y direction of the projection optical system PL corresponding thereto. In this arrangement, the interferometer units 54X, 54Y correspond to a part of the main measuring system. The X axis interferometer unit 54X measures the displacement amount in the X direction of a corner cube type movement mirror fixed to the back surface of the reticle interferometer 25X on the basis of the reference mirror 53X. The Y axis interferometer unit 54Y measures the displacement amount in the Y direction of a corner cube type movement mirror fixed to the back surface of the reticle interferometer 25Y on the basis of the reference mirror 53Y. Measured values are supplied to the main control system 200. The interferometer units 54X, 54Y have measuring axes of a plurality of axes. The main control system 200 calculates, based on the supplied measured values, the positional discrepancy amounts ($\Delta XR1$, $\Delta YR1$) in the X direction and the Y direction and the angle of rotation $\Delta \theta R1$ of the reticle interferometers 25X, 25Y, and consequently those of the reticle chamber 23 on the basis of the projection optical system PL.

The positions of the reticle stage 24 (reticles R1, R2) in the X direction and the Y direction and the angle of rotation $\theta R1$ thereof, which are measured by the reticle interferometers 25X, 25Y and which are based on the reticle chamber 23, are also supplied to the main control system 200. The main control system calculates the positions (XR2, YR2) in the X direction and the Y direction and the angle of rotation $\theta R2$ of the reticle stage 24 on the basis of the projection optical system PL in accordance with the following arithmetic operation.

$$XR2=XR1+\Delta XR1, \ YR2=YR1+\Delta YR1 \quad (2A)$$

$$\theta R2=\theta R1+\Delta \theta R1 \quad (2B)$$

The main control system controls the position and the velocity of the reticle stage 24 on the basis of the positions (XR2, YR2) and the angle of rotation $\theta R2$ calculated as described above. Accordingly, the reticle stage 24 can be driven highly accurately on the basis of the projection optical system PL, irrelevant to the structure in which the reticle stage 24 is tightly enclosed in the reticle chamber 23.

In order to perform the alignment for the wafer, alignment sensors 27A, 27B, which are based on the off-axis system and based on the image formation system, are fixed on the side surfaces in the −X direction and the +X direction at the lower end of the projection optical system PL. Although not shown, a reticle alignment microscope is arranged over the reticle stage 23 in order to perform the alignment for the reticle.

With reference to FIGS. 1 and 2, the upper surface of the wafer base 39 fixed on the base plate 32 is machined into a guide surface having an extremely excellent flatness. A first wafer stage 40A and a second wafer stage 40B are placed on the guide surface so that they are slidable smoothly by the aid of air bearings respectively and two-dimensionally along X axis guide members 41, 42 and Y axis guide member 43A, 43B respectively. The first wafer W1 and the second wafer W2 are held on the wafer stages 40A, 40B respectively by means of, for example, vacuum attraction. The wafer stages 40A, 40B are movable continuously in the Y direction, for example, by the aid of linear motors, and they are movable in a stepping manner in the X direction and in the Y direction. During this process, the wafer stages 40A, 40B are driven so that the law of conservation of momentum is satisfied in the X direction and the Y direction by the aid of the X axis guide members 41, 42 and the Y axis guide members 43A, 43B to be moved in opposite directions respectively. Thus, the apparatus is constructed such that little vibration is generated during the stepping movement and during the scanning exposure.

A Z leveling mechanism (sample stand), which is disposed in each of the wafer stages 40A, 40B, is constructed so that it is capable of making displacement in the Z direction of the wafer W1, W2 and inclination about the two axes (i.e., about the X axis and the Y axis) in order to perform the leveling and the focusing. As described above, the wafer stage of this embodiment is based on the double-wafer stage system. In order to detect the position information in the X direction on the wafer stages 40A, 40B, X axis wafer interferometers 49AX, 49BX, which are composed of laser interferometers, are arranged so that they are opposed to one another as shown in FIG. 1. In order to detect the position information in the Y direction on the wafer stages 40A, 40B, a Y axis wafer interferometer 50AY is arranged as shown in FIG. 2. As for the Y axis interferometer, those corresponding to three axes are actually arranged while being separated from each other by predetermined spacing distances in the X direction (as described in detail later on).

Each of the wafer interferometers 49AX, 49BX, 50AY measures the position of the wafer stage 40A, 40B on the basis of an internal reference mirror (not shown), and each of them is provided with the interferometer having a plurality of axes. Accordingly, the angle of rotation about the X axis (pitching amount), the angle of rotation about the Y axis (rolling amount), and the angle of rotation about the Z axis (yawing amount) of the wafer stage 40A, 40B are also measured thereby. As for the reticle stage 24 and the wafer stages 40A, 40B, it is also preferable that the angle of rotation thereof (pitching amount or rolling amount) is measurable only in the direction in which any Abbe error is generated, or in the direction (axis) in which it is feared that the measurement error exceeds a predetermined allowable value.

In this embodiment, the wafer stage system WST is constructed, for example, by the wafer stages 40A, 40B, the driving units therefor (for example, X axis guide members 41, 42, and Y axis guide members 43A, 43B), and the wafer interferometers 49AX, 49BX, 50AY. The wafer stage system WST is covered with the box-shaped wafer chamber 38 (second stage chamber) having high air-tightness. The tip of the projection optical system PL is inserted into a central opening of the upper plate of the wafer chamber 38. The positional relationship of the wafer stages 40A, 40B (wafers W1, W2) (positions in the X direction and the Y direction and angle of rotation) with respect to the wafer chamber 38 is measured by the wafer interferometers 49AX, 49BX, 50AY. Parts of the wafer interferometers 49AX, 49BX, 50AY are embedded in the side surface of the wafer chamber 38 respectively.

With reference to FIGS. 1 and 2, the sixth and seventh laser beams of the plurality of laser beams, which are branched by the branching optical system 60, are supplied to interferometer units 58B, 58C which are arranged on the second fiducial plate 102 so that the projection optical system PL is interposed therebetween in the X direction. The eighth laser beam is supplied to an interferometer unit 58A which is arranged at the end in the Y direction of the second fiducial plate 102.

Each of the interferometer units 55A to 55C measures the displacement amount in the Z direction of a plane mirror (corresponding to a movement mirror of an ordinary interferometer) arranged on the upper surface of the wafer chamber 38 with respect to an internal reference mirror, i.e., the displacement amount in the Z direction of the projection optical system PL with respect to the wafer stage 40A, 40B. The information on the displacement amount is supplied to the unillustrated attitude control system. The attitude control system determines the displacement amount in the Z direction and the angle of rotation about the two axes, i.e., about the X axis and the Y axis of the projection optical system PL from the displacement in the Z direction at the three places. The expansion/contraction amounts of the electromagnetic dampers of the four vibration-preventive pedestals 36 are controlled so that the displacement amount and the angle of inclination are included within allowable ranges. Accordingly, for example, when the support plate 37 (projection optical system PL) is vibrated by any slight vibration from the outside, it is possible to suppress the vibration at a high speed. Thus, the exposure accuracy is improved.

With reference to FIGS. 1 and 2, interferometer units 57AX, 57BX for the X axis and an interferometer unit 57Y for the Y axis for the wafer, which are composed of laser interferometers respectively, are installed at the ends in the ±X direction and at the end in the +Y direction on the bottom surface of the support plate 37. The three laser beams, which are branched by the branching optical system 60, are also supplied to the interferometer units 57AX, 57BX, 57Y. Reference mirrors 56AX, 56BX, 56Y are fixed on the side surfaces in the X direction and the Y direction of the projection optical system PL corresponding thereto. In this arrangement, the interferometer units 57AX, 57BX, 57Y correspond to a part of the main measuring system. The X axis interferometer units 57AX, 57BX measure the displacement amounts in the X direction of corner cube type movement mirrors fixed to the back surfaces of the wafer interferometers 49AX, 49BX on the basis of the reference mirrors 56AX, 56BX respectively. The Y axis interferometer unit 57Y measures the displacement amount in the Y direction of a corner cube type movement mirror fixed to the back surface of the wafer interferometer 50AY on the basis of the reference mirror 56Y. Measured values are supplied to the main control system 200. The interferometer units 57AX, 57BX, 57Y have a plurality of measuring axes. Based on the supplied measured values, the main control system 200 calculates the positional discrepancy amounts ($\Delta XW1$, $\Delta YW1$) in the X direction and the Y direction and the angle of rotation $\Delta\theta W1$ of the wafer interferometer 49AX, 50AY, and consequently those of the wafer chamber 38 on the basis of the projection optical system PL. Concurrently therewith, the positional discrepancy amounts ($\Delta XW2$, $\Delta YW2$) in the X direction and the Y direction and the angle of rotation $\Delta\theta W2$ of the wafer interferometer 49BX, 50AY are also calculated.

The positions (XW1, YW1) in the X direction and the Y direction of the first wafer stage 40A (wafer W1) and the angle of rotation $\theta W1$, which are based on the wafer chamber 38 to be measured by the certain wafer interferometers 49AX, 50AY, are also supplied to the main control system 200. The main control system 200 calculates the positions (XW3, YW3) in the X direction and the Y direction and the angle of rotation $\theta W3$ of the wafer stage 40A on the basis of the projection optical system PL in accordance with the following arithmetic operation.

$$XW3 = XW1 + \Delta XW1, \quad YW3 = YW1 + \Delta YW1 \tag{3A}$$

$$\theta W3 = \theta W1 + \Delta\theta W1 \tag{3B}$$

The main control system 200 controls the position and the velocity of the wafer stage 40A on the basis of the positions (XW3, YW3) and the angle of rotation $\theta W3$ calculated as described above. Similarly, the positions (XW2, YW2) in the X direction and the Y direction and the angle of rotation $\theta W2$ of the second wafer stage 40B (wafer W2) based on the wafer chamber 38, which are measured by the other wafer interferometers 49BX, 50AY, are corrected with the positional discrepancy amounts ($\Delta XW2$, $\Delta YW2$) and the angle of rotation $\Delta\theta W2$ to obtain the coordinate on the basis of which the position and the velocity of the second wafer stage 40B are controlled. Accordingly, it is possible to highly accurately drive the wafer stages 40A, 40B on the basis of the projection optical system PL, irrelevant to the structure in which the wafer stages 40A, 40B are tightly enclosed in the wafer chamber 38.

As having been already explained above, the reticle stage 24 in the reticle chamber 23 is also driven highly accurately on the basis of the projection optical system PL. Therefore, in this embodiment, all of the reticle stage 24 in the reticle chamber 32 and the wafer stages 40A, 40B in the wafer chamber 38 are driven while highly accurately maintaining the relative positional relationship on the basis of the projection optical system PL, i.e., on the basis of the identical reference. Accordingly, the high exposure accuracy (for example, the overlay accuracy and the transfer faithfulness) is obtained when the wafer W1, W2 is exposed with the image of the pattern on the reticle R1, R2. The wafer stage system WST of this embodiment is based on the double-wafer stage system. For example, it is possible to perform the exchange and the alignment for the wafer W2 on the side of the second wafer stage 40B during the scanning exposure for the wafer W1 on the side of the first wafer stage 40A. Therefore, it is possible to obtain the high throughput.

With reference to FIG. 2, an interface column 71, in which, for example, a reticle library and a wafer cassette are arranged in the same environment as that of the atmospheric air (i.e., air in the clean room), is installed on the floor 1 at the side surface in the −Y direction of the base plate 32 of the projection exposure apparatus. A box-shaped reticle loader chamber 87 having high air-tightness is arranged between the upper end of the interface column 71 and the reticle chamber 23 disposed on the support plate 35. A box-shaped wafer loader chamber 70 having high air-tightness is arranged between the lower end of the interface column 71 and the wafer chamber 38 disposed on the base plate 32. A reticle loader system (not shown), which is used to deliver the reticle between the reticle library and the reticle stage system RST, is installed in the reticle loader chamber 87. A wafer loader system, which is used to deliver the wafer between the wafer cassette and the wafer stage system WST, is installed in the wafer loader chamber 70.

The vacuum ultraviolet light is used as the exposure light beam IL in the projection exposure apparatus of this embodiment. Therefore, in order to increase the illuminance on the wafer W1, W2 by increasing the transmissivity of the exposure light beam IL so that the high throughput is obtained, the purge gas (helium gas in this embodiment) having a high transmissivity is supplied to the optical path of the exposure light beam IL. That is, with reference to FIG. 2, the high purity purge gas, which has passed through the gas-feeding unit 5 and the gas feed tube 7D, is supplied via valve-equipped gas feed tubes 16A, 16B, 16C, 16D, 16E to the inside of the first sub-chamber 9 (which communicates with the auxiliary chamber), the second sub-chamber 19, the reticle chamber 23, the projection optical system PL, and the wafer chamber 38 respectively. The purge gas containing any impurity, which has flown through the inside of the first sub-chamber 9, the second sub-chamber 19, the reticle chamber 23, the projection optical system PL, and the wafer chamber 38, passes through the gas discharge tube 7A via valve-equipped gas discharge tubes 17A, 17B, 17C, 17D, 17E respectively, and it is recovered in the recovery unit 4.

In this arrangement, the valves, which are provided for the gas feed tubes 16A, 16B, 16C, 16D, 16E and the gas discharge tubes 17A, 17B, 17C, 17D, 17E, are valves which are electromagnetically openable and closable respectively. The opening/closing operations of them are controlled mutually independently by a purge gas control system (not shown) composed of a computer. The operations of the recovery unit 4, the gas-feeding unit 5, the accumulating unit 6 are also controlled by the purge gas control system. The apparatus is constructed so that the purge gas may be supplied at a desired flow rate to any one of the inside of the sub-chamber 9, 19, the inside of the reticle chamber 23, the inside of the wafer chamber 39, and the inside of the projection optical system PL (for example, a plurality of lens chambers) in accordance with the supply operation for the purge gas from the gas-feeding unit 5, the recovery operation for the gas effected by the recovery unit 4, and the selective opening/closing operations for the valves. The temperature, the pressure, and optionally the humidity of the purge gas can be controlled, for example, in accordance with the output of an environment sensor arranged in the vicinity of the blow port communicating with each of the air-tight chambers.

In this arrangement, the space between the first sub-chamber 9 and the second sub-chamber 19, the space between the second sub-chamber 19 and the reticle chamber 23, the space between the reticle chamber 23 and the upper end of the projection optical system PL, and the space between the projection optical system PL and the wafer chamber 38 are tightly closed by film-shaped soft shield members 18A, 18B, 18C, 18D each of which has large flexibility to be isolated from the atmospheric air and each of which has high shielding performance for the gas. For example, the soft shield member 18A corresponds to the covering member in the present invention. Accordingly, the optical path for the exposure light beam IL, which ranges from the exposure light source 3 to the wafer W1, W2 as the substrate to be exposed, is tightly enclosed approximately completely. Accordingly, the gas containing the light-absorbing substance from the outside scarcely makes contamination with respect to the optical path for the exposure light beam IL. The attenuation amount of the exposure light beam is suppressed to be extremely low.

An oxygen concentration sensor for detecting the concentration of oxygen gas in the light-absorbing substance is installed at the inside of each of the sub-chambers 9, 19, the reticle chamber 23, the projection optical system PL, and the wafer chamber 38. The oxygen concentration is continuously measured at a predetermined sampling rate, and it is supplied to the purge gas control system. In this arrangement, the concentration of the light-absorbing substance is representatively measured by measuring the oxygen concentration. Those usable as the oxygen concentration sensor include, for example, a polarograph type oxygen concentration meter, a zirconia type oxygen concentration meter, and an yellow phosphorus light emission type oxygen sensor. However, it is also preferable to measure the concentration of the light-absorbing substance such as water vapor and carbon dioxide singly or together therewith. The measured value of the concentration of the light-absorbing substance in each of the air-tight chambers is supplied to the purge gas control system. When the light-absorbing substance, which is at a concentration of not less than a predetermined allowable concentration, is detected in any one of the air-tight chambers, the purge gas is supplied into the air-tight chamber in which the light-absorbing substance has been detected in accordance with the command of the purge gas control system until the concentration of the light-absorbing substance is not more than the allowable concentration.

Each of the soft shield members 18A to 18D is made of, for example, synthetic resin, and it has large flexibility. Therefore, no vibration is mutually transmitted between the adjacent air-tight chambers, for example, between the sub-chamber 19 and the reticle chamber 23, between the reticle chamber 23 and the projection optical system PL, and between the projection optical system PL and the wafer chamber 38. Therefore, the influence of the vibration is mitigated on condition that the air-tightness is maintained.

Further, in this embodiment, the soft shield member 18E is provided so that the space between the reticle chamber 23 and the reticle loader chamber 87 is tightly closed. The reticle loader chamber 87 is also filled with a part of the purge gas which is supplied to the reticle chamber 23. Therefore, when the reticles R1, R2 are exchanged by the aid of the reticle loader system, the concentration of the purge gas in the reticle chamber 23 is not greatly lowered, even when the shutter at the transport port of the reticle loader chamber 87 is opened. In this arrangement, a concentration sensor for the light-absorbing substance is also arranged at the inside of the reticle loader chamber 87, and the allowable concentration of the light-absorbing substance in the reticle loader chamber 87 is set to be higher (looser) than the allowable concentration of the light-absorbing substance in the reticle chamber 23. Even if the concentration of the light-absorbing substance in the reticle chamber 23 is not more than the allowable concentration, when the concentration of the light-absorbing substance in the reticle loader chamber 87 exceeds the allowable concentration, then the purge gas is supplied from the gas-feeding unit 5 to the reticle chamber 23. Accordingly, the concentration of the purge gas in the reticle chamber 23 is maintained to be high even when the reticle is exchanged. Further, it is possible to decrease the amount of use of the purge gas. The reticle loader chamber 87 may be divided into a plurality of air-tight chambers along the transport passage for the reticle R1, R2. Constitutive components of the reticle loader system may be arranged in the plurality of air-tight chambers. In this arrangement, it is also preferable that the concentration of the light-absorbing substance or the allowable value thereof in each of the plurality of air-tight chambers differs.

Similarly, the soft shield member is provided so that the space between the wafer chamber 38 and the wafer loader chamber 70 is tightly closed. The wafer loader chamber 70 is also filled with a part of, or almost all of (when the valve of the gas discharge tube 17E is closed) the purge gas supplied into the wafer chamber 38. The purge gas, which has flown through the inside of the wafer loader chamber 70, is recovered by the recovery unit 4 via the valve-equipped gas discharge tube 17F and the gas discharge tube 7A. A concentration sensor for the light-absorbing substance is also arranged in the wafer loader chamber 70, and the allowable concentration of the light-absorbing substance in the wafer loader chamber 70 is set to be higher than that in the wafer chamber 38. Even if the concentration of the light-absorbing substance in the wafer chamber 38 is not more than the allowable concentration, when the concentration of the light-absorbing substance in the wafer loader chamber 70 exceeds the allowable concentration, then the purge gas is supplied from the gas-feeding unit 5 to the wafer chamber 38. Accordingly, the concentration of the purge gas in the wafer chamber 38 is maintained to be high even when the wafer is exchanged. Further, it is possible to decrease the amount of use of the purge gas.

Figure 3:
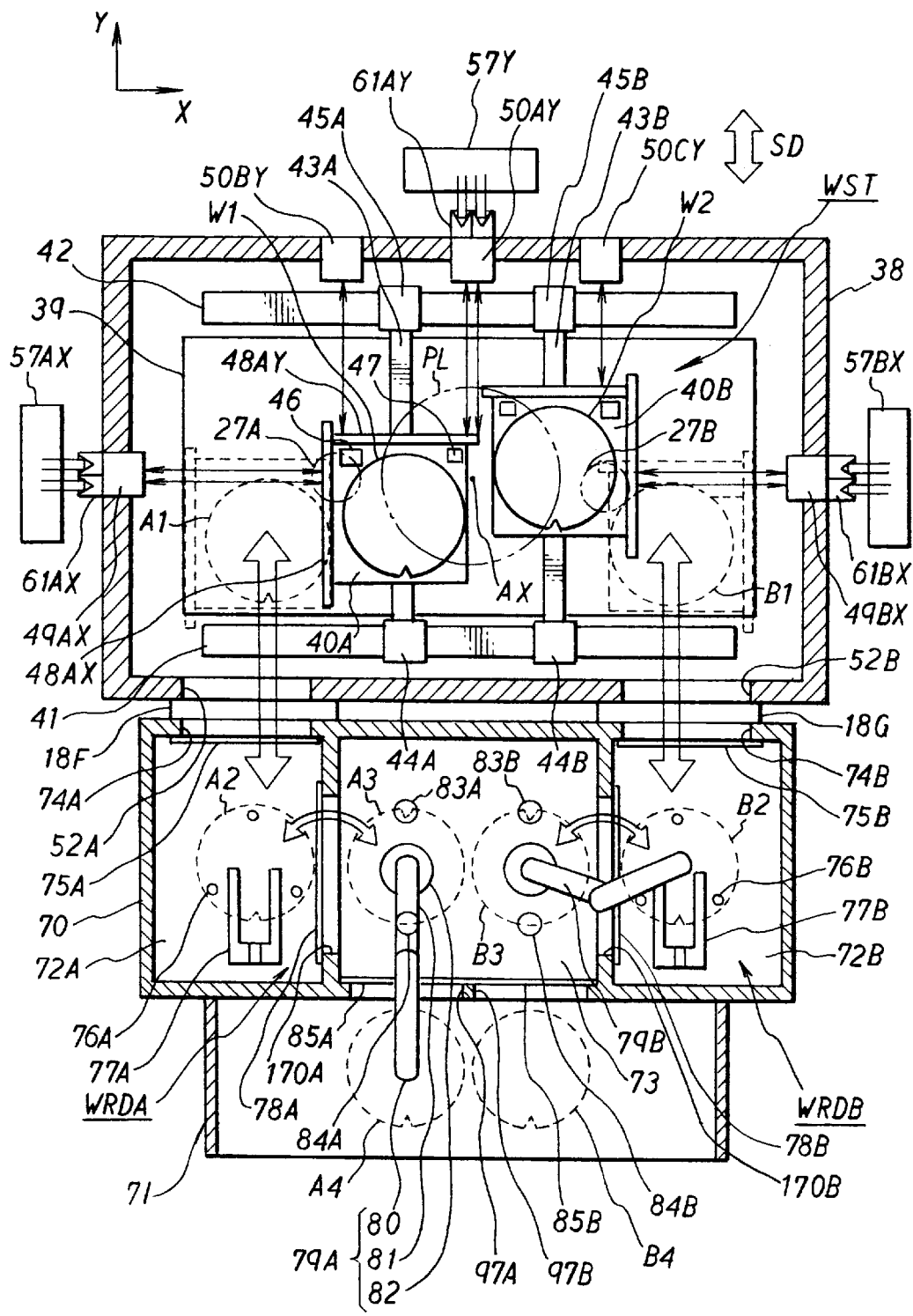
FIG. 3 shows, with partial cutout, a plan view illustrating a wafer stage system and a wafer loader system disposed at the inside of a wafer chamber 38 and a wafer loader chamber 70 shown in FIG. 2.

Next, the arrangements of the wafer stage system based on the double-wafer stage system and the wafer loader system of this embodiment will be explained in detail with reference to FIGS. 3 to 5. FIG. 3 shows, with partial cross section, a plan view illustrating the wafer stage system WST and the wafer loader system shown in FIG. 1. As shown in FIG. 3, the wafer stage system WST, which is disposed in the wafer chamber 38 of this embodiment, comprises two wafer stages 40A, 40B which are supported over the guide surface of the wafer base 39 in a floating manner by the aid of air bearings and which are movable independently in the X direction and the Y direction, driving systems therefor, and interferometer systems for measuring their positions. The wafers W1, W2 are held on the wafer stages 40A, 40B respectively by the aid of unillustrated wafer holders. This arrangement will be described in further detail below. A pair of X axis guide members 41, 42, which are parallel to the X axis, are arranged so that the wafer base 39 is interposed therebetween in the scanning direction DS (Y direction) during the scanning exposure. First X axis sliders 44A, 45A and second X axis sliders 44B, 45B, which are slidable in the X direction by the aid of air pads, are placed on the X axis guide members 41, 42.

A first Y axis guide 43A is arranged by the aid of an air pad slidably in the Y direction with respect to the first X axis sliders 44A, 45A. A second Y axis guide 43B is arranged by the aid of an air pad slidably in the Y direction with respect to the second X axis sliders 44B, 45B. The wafer stages 40A, 40B are arranged by the aid of air pads slidably in the Y direction with respect to the Y axis guides 43A, 43B. First and second linear motors (not shows) are provided in order to relatively drive the first X axis sliders 44A, 45A and the second X axis sliders 44B, 45B with respect to the X axis guide members 41, 42 while substantially satisfying the law of conservation of momentum. Tow linear motors (not shows) are provided in order to relatively drive the wafer stages 40A, 40B in the Y direction with respect to the Y axis guides 43A, 43B while substantially satisfying the law of conservation of momentum.

A fiducial mark member 47, on which a fiducial mark for measuring the base line of the alignment sensor 27A is formed, is fixed to the upper surface of the first wafer stage 40A on the side in the +X direction. A measuring member 46 for measuring, for example, the amount of light of the exposure light beam and the uneven illuminance is fixed to the upper surface of the wafer stage 40A on the side in the −X direction. The same fiducial mark member and the same measuring member as those described above are also fixed to the upper surface of the second wafer stage 40B.

An example of the measuring system of the wafer stage system WST of this embodiment will now be explained. With reference to FIG. 3, an X axis movement mirror 48AX and a Y axis movement mirror 48AY are fixed to the side surfaces of the first wafer stage 40A in the −X direction and the +Y direction. An X axis movement mirror and a Y axis movement mirror are also fixed to the side surfaces of the wafer stage 40B in the +X direction and the +Y direction. Besides the movement mirrors 48AX, 48AY are used as described above, it is also preferable that the side surfaces of the wafer stages 40A, 40B are mirror-finished, and the measuring laser beams are radiated onto the obtained mirror surfaces.

In this embodiment, the optical axis AX (center of the exposure area) of the projection optical system PL, the optical axis (detection center) of the first alignment sensor 27A, and the optical axis (detection center) of the second alignment sensor 27B are arranged on a straight line (hereinafter referred to as "minimum error axis") which is parallel to the X axis. X axis wafer interferometers 49AX, 49BX are installed so that they are opposed to one another in the −X direction and the +X direction on the minimum error axis. Two measuring beams from the first wafer interferometer 49AX are radiated along the minimum error axis onto the X axis movement mirror 48AX of the first wafer stage 40A. Symmetrically therewith, two measuring beams from the first wafer interferometer 49BX are radiated along the minimum error axis onto the X axis movement mirror of the second wafer stage 40B. In addition to the two measuring beams, a measuring beam separated in the Z direction is actually radiated, for example, onto the movement mirror 48AX. Each of the wafer interferometers 49AX, 49BX measures the position in the X direction, the angle of rotation about the Z axis (yawing amount), and the angle of rotation about the Y axis (rolling amount) of the wafer stage 40A, 40B.

A measuring beam, which passes through the optical axis AX and which is parallel to the Y axis, is radiated from the Y axis wafer interferometer 50AY onto the Y axis movement mirror 48AY of the wafer stage 40A. Further, wafer interferometers 50BY, 50CY are also provided. The wafer interferometers 50BY, 50CY have measuring beams which pass through the respective detection centers of the alignment sensors 27A, 27B and which are parallel to the Y axis respectively. The central wafer interferometer 50AY is provided with measuring beams having two axes in the X direction and two axes in the Z direction as well (not shown). Therefore, it is possible to measure the position in the Y direction, the angle of rotation about the Z axis (yawing amount), and the angle of rotation about the X axis (pitching amount) of the wafer stage 40A, 40B. In this embodiment, the projection optical system PL is commonly used for the exposure for the wafers W1, W2 on the wafer stages 40A, 40B. However, the alignment sensor 27A for the −X direction is used during the alignment for the wafer W1 on the first wafer stage 40A, while the alignment sensor 27B for the +X direction is used during the alignment for the wafer W2 on the second wafer stage 40B. In order to measure the position in the Y direction of the wafer stage 40A, 40B during the exposure based on the use of the projection optical system PL, the measured value obtained by the central wafer interferometer 50AY is used. In order to measure the position in the Y direction of the wafer stage 40A or 40B during the use of the alignment sensor 27A or 27B, each of the measured values obtained by the laser interferometers 50BY, 50CY is used.

In this embodiment, as described above, the plurality of Y axis wafer interferometers 50AY to 50CY are provided in the X direction (non-scanning direction), and thus any one of the Y axis measuring beams is radiated, for example, onto the Y axis movement mirror 48AY of the wafer stage 40A, 40B. Accordingly, the following advantage is obtained. That is, it is possible to miniaturize the individual wafer stages 40A, 40B and drive them at high speeds based on the double-wafer stage system. Further, it is possible to highly accurately detect the positions of the respective wafer stages 40A, 40B.

For example, when the first wafer stage 40A is moved to the exposure position after the alignment effected by the first alignment sensor 27A, or when the second wafer stage 40B is moved to the exposure position after the alignment effected by the second alignment sensor 27B, then it is necessary to deliver the measured value between the central wafer interferometer 50AY for the Y axis and the wafer interferometers 50BY, 50CY for the Y axis disposed on the both sides. For example, the delivery of the measured value is performed as follows. That is, when the first wafer stage 40A is moved in the −X direction starting from the state shown in FIG. 3, an offset may be added to the measured value of the next wafer interferometer 50BY so that the measured value of the next wafer interferometer 50BY is coincident with the measured value of the wafer interferometer 50AY having been previously used, in a state in which the yawing amount of the wafer stage 40A measured by the wafer interferometer 49AX is zero.

With reference to FIG. 3, two-axis movement mirrors 61AX, 61BX, which are composed of corner cubes respectively, are fixed to the back surfaces of the X axis wafer interferometers 49AX, 49BX. The positions in the X direction and the angles of rotation about the Z axis of the movement mirrors 61AX, 61BX are measured by the interferometer units 57AX, 57BX described above on the basis of the projection optical system PL. A two-axis movement mirror 61AY, which is composed of corner cubes respectively, is also fixed to the back surface of the central wafer interferometer 50AY for the Y axis. The position in the Y direction and the angle of rotation about the Z axis of the movement mirror 61AY are measured by the interferometer unit 57Y described above on the basis of the projection optical system PL.

In this embodiment, the first measuring system, which manages the two-dimensional coordinate positions and the angles of rotation about the three axes of the wafer stages 40A, 40B in the wafer chamber 38, is constructed by the total five interferometers composed of the wafer interferometers 49AX, 49BX, 50AY to 50CY. The second measuring system (main measuring system), which manages the two-dimensional coordinate positions and the angles of rotation about the Z axis of the wafer interferometers 49AX, 49BX, 50AY (wafer chamber 38) with respect to the projection optical system PL, is constructed by the interferometer units 57AX, 57BX, 57Y. The positions in the X direction and the Y direction and the angles of rotation about the X axis, the Y axis, and the Z axis of the respective two wafer stages 40A, 40B are highly accurately measured by the first measuring system and the second measuring system on the basis of the projection optical system PL. The positioning during the alignment and the control of the position and the velocity during the scanning exposure are highly accurately performed on the basis of the obtained measured values.

Figure 4:
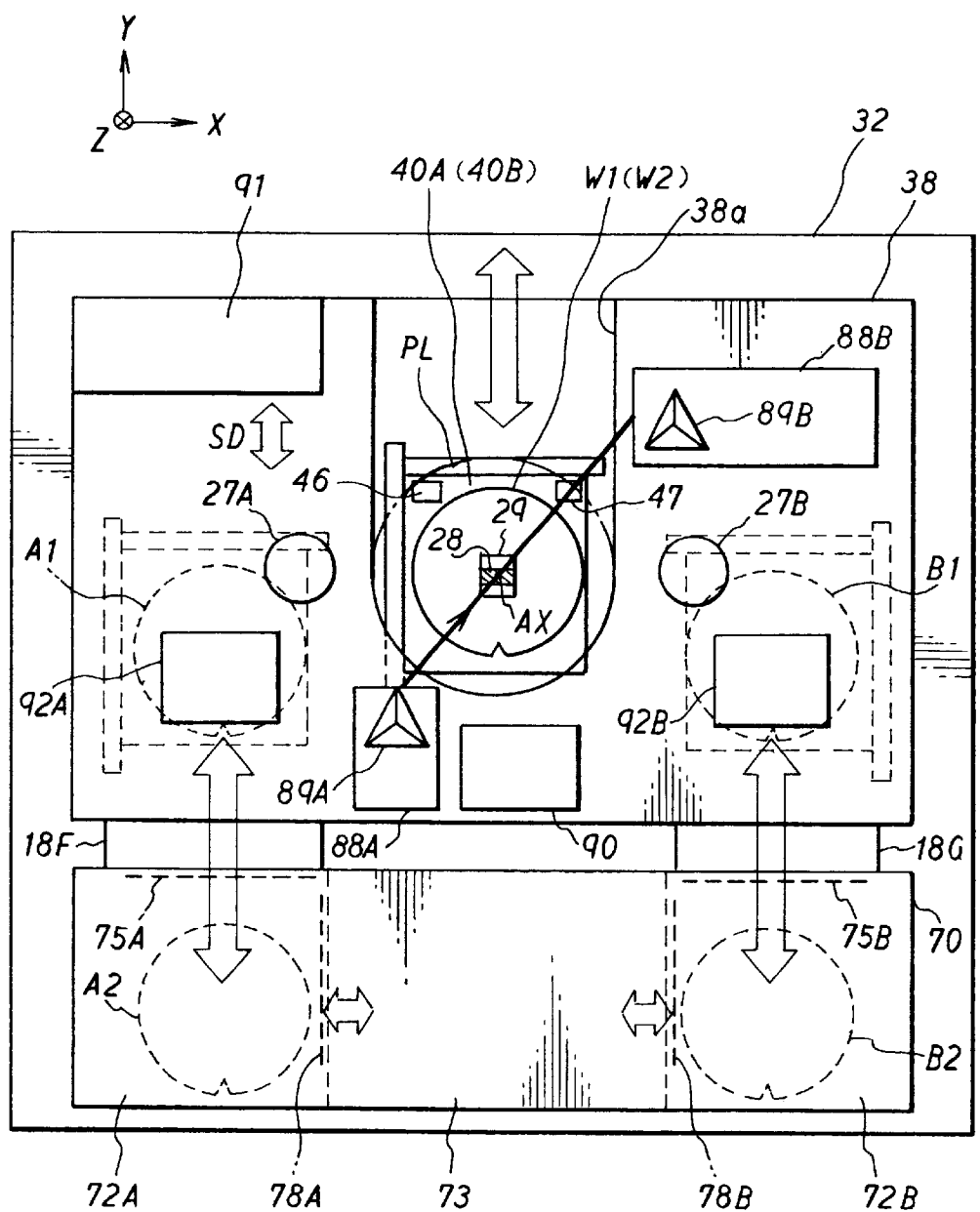
FIG. 4 shows a plan view illustrating the contours of the wafer chamber 38 and the wafer loader chamber 70 shown in FIG. 3.

In this embodiment, in addition to the measuring systems, as shown in FIG. 4, for example, a variety of sensors are provided. FIG. 4 shows a plan view illustrating the wafer chamber 38 and the wafer loader chamber 70 shown in FIG. 3. With reference to FIG. 4, the wafer chamber 38 is formed with a groove 38a which is open in the +Y direction so that the projection optical system PL may be inserted and withdrawn in the Y direction. A multi-point autofocus sensor (AF sensor) 88A, 88B based on the oblique incidence system is installed on the upper plate of the wafer chamber 38, which is composed of a projecting system 88A for projecting a slit image obliquely with respect to the optical axis AX onto the slit-shaped exposure area 28 formed by the projection optical system PL or a plurality of measuring points on the wafer W1 (or W2) disposed in an area (pre-reading area) located in front of the exposure area 28 in the scanning direction SD (Y direction), and a light-receiving system 88B for receiving the reflected light from the measured surface and detecting the focus position (position in the Z direction) at each of the measuring points. The information on the focus position FZn (n=1, 2, ...) detected by the AF sensor 88A, 88B is supplied to the stage-driving system (not shown).

Corner cube type movement mirrors 89A, 89B are fixed to the upper surfaces of the projecting system 88A and the light-receiving system 88B respectively. Interferometer units (not shown), which are constructed in the same manner as the interferometer unit 58A and which highly accurately detect the displacement amounts FZA, FZB of the movement mirrors 89A, 89B with respect to the projection optical system PL, are installed on the second fiducial plate 102 disposed under the projection optical system PL shown in FIG. 2. Detection results FZA, FZB thereof are also supplied to the stage-driving system. In this arrangement, the stage-driving system calculates the defocus amount of the projection optical system PL from the image plane at each of the measuring points on the wafer W1 (W2) from the value which is obtained by correcting the focus position FZn detected by the AF sensor 88A, 88B with the displacement amount FZA, FZB. The Z leveling mechanism in the wafer stage 40A (40B) is controlled so that the defocus amount is included in an allowable range. With reference to FIG. 4, when one shot area 29 on the wafer W1 (or W2) is scanned with respect to the exposure area 28, the entire surface of the shot area 29 is included in the range of the depth of focus. Therefore, a reduced image of the reticle pattern is projected onto the entire surface of the shot area 29 at a high resolution.

Those provided at the upper portion of the wafer chamber 38 are a laser light source unit 91 for branching and supplying the laser beam to the wafer interferometers 49AX, 49BX, 50AY to 50CY shown in FIG. 3, a sensor unit 90 for measuring the characteristics of the wafer W1, W2 on the wafer stage 40A, 40B, and first and second prealignment mechanisms 92A, 92B for performing the prealignment for the wafers W1, W2 in the wafer chamber 38. In this arrangement, the prealignment for the wafer W1 on the first wafer stage 40A is performed at a position A1 at the end in the −X direction in the wafer chamber 38. The prealignment for the wafer W2 on the second wafer stage 40B is performed at a position B1 at the end in the +X direction. Therefore, the prealignment mechanisms 92A, 92B are arranged over the positions A1, B1 (prealignment positions) respectively. Positions for the wafer alignment effected by the alignment sensors 27A, 27B are set between the positions A1, B1 and the exposure area 28 (optical axis AX) in which the exposure is performed.

Returning to FIG. 3, in this embodiment, one of the wafer stages 40A, 40B executes the exposure sequence, during which the other executes the wafer alignment sequence after exchanging the wafer with respect to the wafer loader system WRDA, WRDB. Accordingly, the box-shaped wafer loader chamber 70 having high air-tightness is installed on the side in the −Y direction of the wafer chamber 38 with a predetermined spacing distance intervening therebetween. The wafer loader systems WRDA, WRDB are accommodated in the wafer loader chamber 70. In the wafer chamber 38, the first wafer stage 40A (wafer W1) is moved to the position A1 in the −X direction as indicated by dotted lines after the exposure. The second wafer stage 40B (wafer W2) is moved to the position B1 in the +X direction as indicated by dotted lines after the exposure. Slit shaped transport ports 52A, 52B are formed in the vicinity of the positions A1, B1 at the side surface of the wafer chamber 38. Slit-shaped transport ports 74A, 74B are also formed at the side surface of the wafer loader chamber 70 so that the transport ports 74A, 74B are opposed to the transport ports 52A, 52B. The inside of the wafer loader chamber 70 is divided into a first waiting chamber 72A which contacts with the first transport port 74A, a second waiting chamber 72B which contacts with the second transport port 74B, and a preparatory chamber 73 which is disposed at the middle of the two waiting chambers 72A, 72B.

Shutters 75A, 75B are provided openably (closably) at the inside of the transport ports 74A, 74B. Transport ports 170A, 170B are also formed between the waiting chambers 72A, 72B and the preparatory chamber 73 respectively. Shutters 78A, 78B for opening/closing the transport ports 170A, 170B are provided. Further, two transport ports 97A, 97B are formed in parallel in the X direction at the side surface of the preparatory chamber 73 in the −Y direction. Shutters 85A, 85B for opening/closing the transport ports 97A, 97B are provided. The interface column 71 is installed to make contact with the wafer loader chamber 70 in the −Y direction. Wafer cassettes (not shown), each of which accommodates one lot of wafer, are installed at the position A4 and the position B4 disposed in the vicinity of the transport ports 97A, 97B to be opened/closed by the shutters 85A, 85B of the preparatory chamber 73 in the same environment as that of the atmospheric air in the interface column 71.

Cylindrical film-shaped soft shield members 18F, 18G, each of which has high flexibility in the same manner as the soft shield member 18D shown in FIG. 1, are installed to shield the spaces between the transport ports 52A, 52B of the wafer chamber 38 and the transport ports 74A, 74B of the wafer loader chamber 70 from the atmospheric air. Accordingly, the vibration in the wafer loader chamber 70 is not transmitted to the inside of the wafer chamber 38. The space ranging from the interior of the wafer chamber 38 to the interior of the wafer loader chamber 70 can be filled with the high purity purge gas.

In order to control the temperature of the wafer transported to the central position A2 (temperature control position) in the first waiting chamber 72, a temperature-adjusting unit 76A including a three-point contact type heater is installed. In order to deliver the wafer between the position A2 and the position A1 through the transport ports 52A, 74A, a first slide arm 77A is arranged. A transport unit (not shown) for finely moving the slide arm 77A in the Z direction and moving the slide arm 77A in the Y direction is arranged at an upper portion at the inside of the waiting chamber 72A. A first transport robot 79A for delivering the wafer between the interface column 71 and the inside of the waiting chamber 72A is arranged on the side in the −X direction in the preparatory chamber 73. The transport robot 79A comprises a rotary shaft 82 for making rotation and vertical movement, a first arm 81 for making rotation on the rotary shaft 82, and a second arm 80 for making rotation at the tip of the first arm 81. The wafer as the transport objective is attracted and held at the tip of the second arm 80.

The transport robot 79A installs, at the position A3 on the rotary shaft 82, the wafer imported into the preparatory chamber 73 through the transport port 97A having the shutter 85A from the position A4 in the interface column 71 during the import of the wafer. Two image pickup devices 83A, 84A are arranged so as to have visual fields at two positions separated by 180° at the outer circumferential portion of the wafer installed at the position A3. Image pickup signals obtained by the image pickup devices 83A, 84A are supplied to the unillustrated wafer loader system. The wafer loader system processes the image pickup signals to detect the notch (cutout) at the outer circumferential portion of the wafer disposed at the position A3. The operation of the transport robot 79A is controlled so that the position of the notch is located at a predetermined position (for example, in the +Y direction). Accordingly, the first prealignment is performed for the wafer.

The first wafer loader system WRDA is constructed by the temperature-adjusting unit 76A, the slide arm 77A, the transport unit (not shown), the transport robot 79A, and the image pickup devices 83A, 84A. Symmetrically with the first wafer loader system WRDA, the second wafer loader system WRDB is arranged in order to deliver the wafer among the position B1 in the wafer chamber 38, the position B2 in the waiting chamber 72B, the position B3 in the preparatory chamber 73, and the position B4 in the interface column 71. The wafer loader system WRDB is also constructed by the temperature-adjusting unit 76B, the slide arm 77B, the transport unit (not shown), the second transport robot 79B, and the image pickup devices 83B, 84B.

Figure 5:
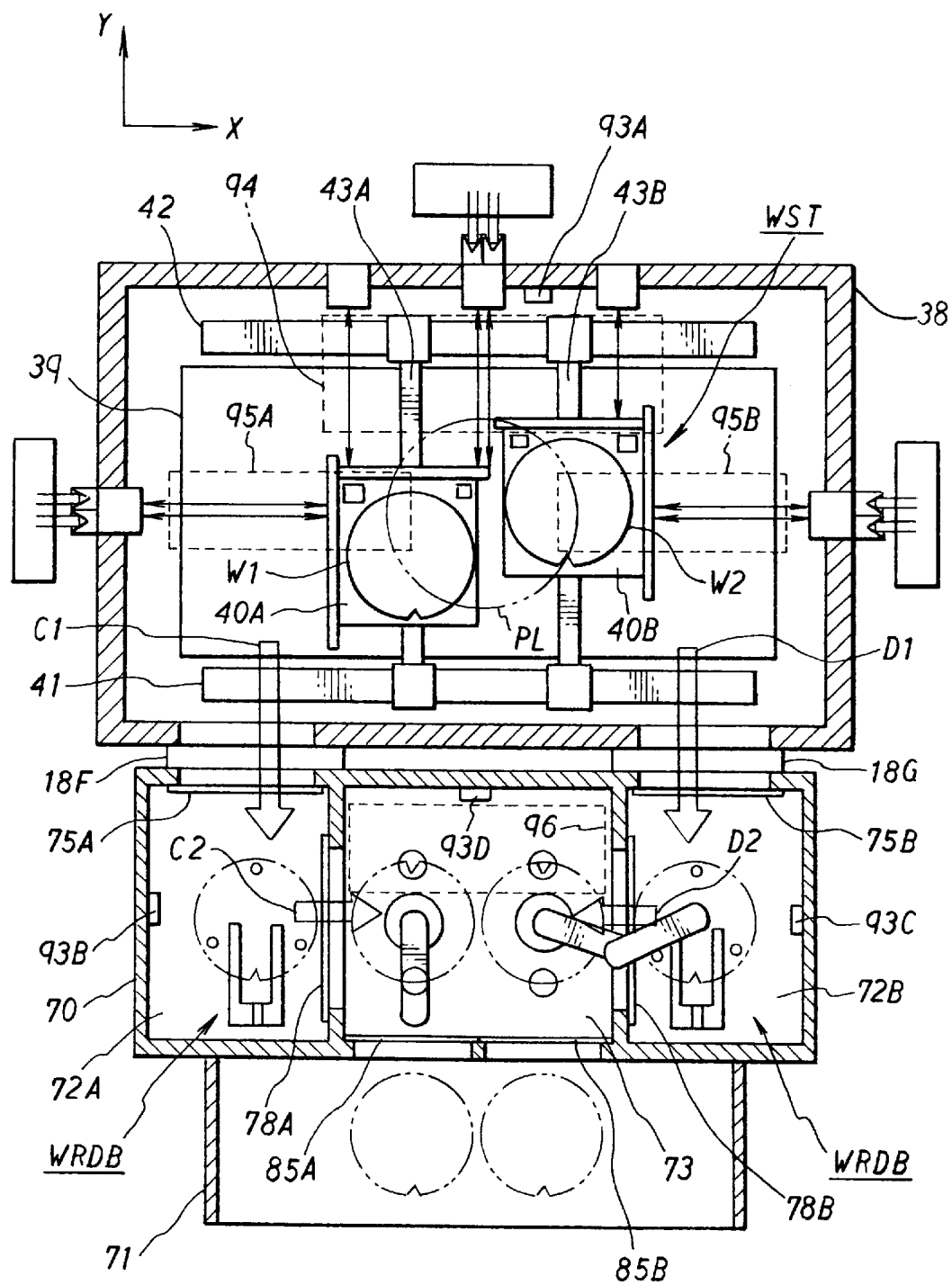
FIG. 5 shows a plan view illustrating blow ports, discharge ports, and other components for the purge gas for the wafer chamber 38 and the wafer loader chamber 70 shown in FIG. 3.

FIG. 5 shows a plan view illustrating the wafer stage system WST and the wafer loader systems WRDA, WRDB of this embodiment in the same manner as in FIG. 3. With reference to FIG. 5, three blow ports 94, 95A, 95B, which communicate with the gas feed tube 16E and the gas-feeding unit 5 shown in FIG. 2, are installed as indicated by dotted lines at upper portions of the wafer chamber 38. The purge gas at a positive pressure is supplied from the blow ports 94, 95A, 95B to the inside of the wafer chamber 38 in accordance with the down flow system. In this arrangement, the blow port 94 is disposed over the area including the optical path of the Y axis wafer interferometer 50AY. The blow ports 95A, 95B are disposed over the areas including the optical paths of the two wafer interferometers 49AX, 49BX for the X axis. The high purity purge gas is substantially always supplied to the optical paths of the wafer interferometers 49AX, 49BX, 50AY. Therefore, the refractive index of the optical path is stabilized, and the measurement accuracy is improved.

However, when the purity of the purge gas is changed relatively greatly, the refractive index of the optical path of the wafer interferometer is changed depending thereon. Therefore, when the purity of the purge gas is changed while exceeding the predetermined allowable value, then the alignment and the exposure operation may be stopped, and the wafer stages 40A, 40B may be allowed to wait until the purity of the purge gas is stabilized at a high purity. Accordingly, it is possible to avoid any deterioration of the alignment accuracy and the exposure accuracy.

A discharge port 96, which communicates with the gas discharge tube 17F shown in FIG. 2, is installed as indicated by dotted lines at the bottom surface of the preparatory chamber 73 of the wafer loader chamber 70 shown in FIG. 5. Oxygen concentration sensors 93A, 93B, 93C, 93D for measuring the concentration of oxygen as the light-absorbing substance are installed at the inside of the wafer chamber 38, the waiting chambers 72A, 72B, and the preparatory chamber 73 respectively. Measured values obtained by the oxygen concentration sensors 93A to 93D are supplied to the unillustrated purge gas control system. The purge gas, which is supplied to the inside of the wafer chamber 38 when the shutters 75A, 78A or the shutters 75B, 78B are open, passes through the waiting chambers 72A, 72B as indicated by the arrows C1, C2 and the arrows D1, D2, and it inflows into the preparatory chamber 73. The purge gas, which inflows into the preparatory chamber 73, is recovered by the recovery unit 4 via the discharge port 96 and the gas discharge tube 17F shown in FIG. 2. When the shutters 75A, 78A, 75B, 78B are closed, the purge gas, which is fed to the inside of the wafer chamber 38, is recovered by the recovery unit 4 via the gas discharge tube 17E shown in FIG. 2, if necessary.

In this arrangement, the allowable values of the oxygen concentrations detected by the oxygen concentration sensors 93A to 93D are set to be increased (loosened) in an order of the inside of the preparatory chamber 73, the inside of the waiting chambers 72A, 72B, and the inside of the wafer chamber 38. When the concentration measured by any one of the oxygen concentration sensors 93A to 93D exceeds the allowable value, the purge gas control system supplies the purge gas in an amount larger than the ordinary amount from the blow ports 94, 95A, 95B to the inside of the wafer chamber 38. Accordingly, for example, even when the shutters 75A, 75B are opened during the exchange of the wafer, the concentration of the purge gas in the wafer chamber 38 is maintained to be high. Further, it is possible to decrease the amount of use of the purge gas.

The flow rate, which is used when the purge gas is supplied to the inside of the wafer chamber 38, is, for example, in such a degree that the amount corresponding to the volume of the space increased in the wafer chamber 38 when one sheet of wafer is successively exported from the wafer chamber 38 is replenished. Accordingly, it is possible to decrease the amount of use of the purge gas. In this embodiment, the allowable value (designated as dA) of the concentration of the light-absorbing substance (oxygen in this case) at the inside of the wafer chamber 38 (exposure chamber) is set to be about $1/10$ to $1/100$ of the allowable value (designated as dB) of the concentration of the light-absorbing substance at the inside of the waiting chamber 72A, 72B. The allowable value dB of the concentration of the light-absorbing substance at the inside of the waiting chamber 72A, 72B is set to be about $1/10$ to $1/100$ of the allowable value (designated as dC) of the concentration of the light-absorbing substance at the inside of the preparatory chamber 73. For example, the allowable value dA in the wafer chamber 38 is set to be about 100 to 10 ppm, the allowable value dB in the waiting chamber 72A, 72B is set to be about $10^3$ ppm, and the allowable value dC in the preparatory chamber 73 is set to be about $10^5$ ppm.

In this case, in order to easily manage the concentration of the purge gas, the following procedure is available. That is, the allowable value dA in the wafer chamber 38 is set to be most strict (lowest). As for the other air-tight chambers (waiting chambers 72A, 72B and preparatory chamber 73), the allowable value is merely commonly set to be approximately equal to or not less than that in the wafer chamber 38. In this procedure, the waiting chambers 72A, 72B and the preparatory chamber 73 may be combined into one air-tight chamber. Further, it is also preferable that the number of types of the light-absorbing substance (impurity) as the detection objective is increased, and the allowable value of the concentration is allowed to differ for each of the light-absorbing substances. It is also preferable that the flow rate of the purge gas or the like is controlled taking notice of the concentration of the substance having the strictest allowable value.

In order to avoid any counter flow of the purge gas from the air-tight chamber having a loose (large) allowable value of the concentration of the light-absorbing substance to the air-tight chamber having a strict (small) allowable degree, it is also preferable that the pressure of the purge gas is allowed to differ in the respective air-tight chambers, i.e., the pressure of the purge gas is increased at the inside of the air-tight chamber having a more strict (smaller) allowable value thereof. In this embodiment, the purge gas is supplied to the inside of the wafer chamber 38 in accordance with the down flow system. However, when the purge gas is a light gas such as helium gas as in this embodiment, it is also preferable that the purge gas is supplied so that the purge gas is blown upwardly from the bottom surface portion in the wafer chamber 38 (in accordance with the so-called overflow system).

An example of the entire operation of the wafer stage system WST and the wafer loader systems WRDA, WRDB shown in FIG. 3 will now be explained. At first, it is assumed that the scanning exposure is completed for the first wafer W1 on the first wafer stage 40A, and the scanning exposure is performed for the second wafer W2 on the second wafer stage 40B. The first wafer stage 40A is moved to the position A1, and then the second wafer stage 40B, for which the wafer alignment has been performed under the alignment sensor 27B, is moved toward the exposure area of the projection optical system PL to start the scanning exposure for the wafer W2 on the wafer stage 40B. Until this point of time, the unexposed wafer, which is disposed at the position A4 in the interface column 71, is transported to the position A3 in the preparatory chamber 73 by the aid of the transport robot 79A. At this place, the first prealignment is performed for the angle of rotation and the central position on the basis of the notch by using the image pickup devices 83A, 84A. After that, the wafer at the position A3 is transported to the position A2 on the temperature-adjusting unit 76A in the waiting chamber 72A by the aid of the transport robot 79A. At this place, the wafer is heated or cooled to a temperature suitable for the exposure, and then the wafer is transported to a position in the vicinity of the position A1 in the wafer chamber 38 by the aid of the slide arm 77A.

At the position A1, the exposed wafer W1, which is disposed on the wafer stage 40A, is delivered to the unload arm (not shown) of the prealignment mechanism 92A shown in FIG. 4. The unexposed wafer, which is disposed on the slide arm 77A, is delivered to the load arm (not shown) of the prealignment mechanism 92A. Subsequently, the exposed wafer on the unload arm is delivered onto the slide arm 77A, and then the shapes at three places at the outer circumferential portion of the unexposed wafer on the load arm are observed by the unillustrated image pickup device. Accordingly, the second prealignment is performed for the unexposed wafer. After that, the unexposed wafer is placed on the wafer stage 40A at the position A1, and it is moved to the position under the alignment sensor 27A by the aid of the wafer stage 40A to detect the search alignment mark on the unexposed wafer (search alignment) by means of the alignment sensor 27A and detect the fine alignment mark by using an obtained result. During this process, for example, the fine alignment is performed for the wafer in accordance with the enhanced global alignment (EGA) system.

In this embodiment, the search alignment and the fine alignment are collectively referred to as "wafer alignment". The wafer on the first wafer stage 40A, for which the wafer alignment has been completed, waits under the alignment sensor 27A until the scanning exposure for the wafer W2 on the second wafer stage 40B is completed. On the other hand, the exposed wafer W1, which is delivered from the wafer stage 40A to the slide arm 77A at the position A1, is moved to the position A2 in the waiting chamber 72A, and then it is transported by the transport robot 79A from the position A2 to the position A4 in the interface column 71. During this process, the wafer cassette for the exposed wafer waits at the position A4. The wafer W1 is accommodated in the wafer cassette. After that, the wafer cassette, which accommodates the unexposed wafer, is moved to the position A4. The unexposed wafer in the wafer cassette is transported by the transport robot 79A to the position A3 in the preparatory chamber 73.

Further, the wafer W2, which has been subjected to the exposure on the second wafer stage 40B, is transported to the position B1 in the wafer chamber 38. The first wafer stage 40A is moved toward the exposure area of the projection optical system PL to start the scanning exposure for the wafer on the wafer stage 40A. During this process, the unexposed wafer, which has been subjected to the temperature control, is transported to a position in the vicinity of the position B1 from the position B4 via the positions B3, B2 by the aid of the transport robot 79B and the slide arm 77B. The unexposed wafer on the slide arm 77B is exchanged with the exposed wafer W2 on the wafer stage 40B by the aid of the prealignment mechanism 92B shown in FIG. 4. After that, the unexposed wafer is subjected to the second prealignment at the position B1. On the other hand, the exposed wafer W2 is transported from the position B2 to the position B4 by the aid of the slide arm 77B and the transport robot 79B.

As described above, in this embodiment, the wafer stage WST and the wafer loader systems WRDA, WRDB are incorporated into the wafer chamber 38 and the wafer loader chamber 70 respectively while being constructed as modules. However, the second prealignment is performed at the positions A1, B1 in the wafer chamber 38. Therefore, it is unnecessary that the positional relationship between the wafer chamber 38 and the wafer loader chamber 70 during the assembling is extremely strict. That is, the projection exposure apparatus can be assembled and adjusted with ease. Further, it is possible to perform the wafer alignment highly accurately.

In this embodiment, when the unexposed wafer or the exposed wafer passes through, for example, the transport ports 74A, 74B in FIG. 3, then the corresponding shutters 75A, 75B, 78A, 78B, 85A, 85B are opened, and the corresponding shutters 75A, 75B to 85A, 85B are closed during the period in which the wafer does not pass therethrough. The control is made such that when the shutters 75A, 75B are open, the shutters 78A, 78B or the shutters 85A, 85B are closed. The interior of the wafer chamber 38 does not make direct communication with the interior of the interface column 71, i.e., the atmospheric air. Therefore, the concentration of the purge gas at the inside of the wafer chamber 38 is always maintained to be high.

Next, explanation will be made in detail with reference to FIGS. 6 to 9, for example, for the arrangements of the soft shield members 18F, 18G and the shutter 75A shown in FIG. 3.

Figure 6:
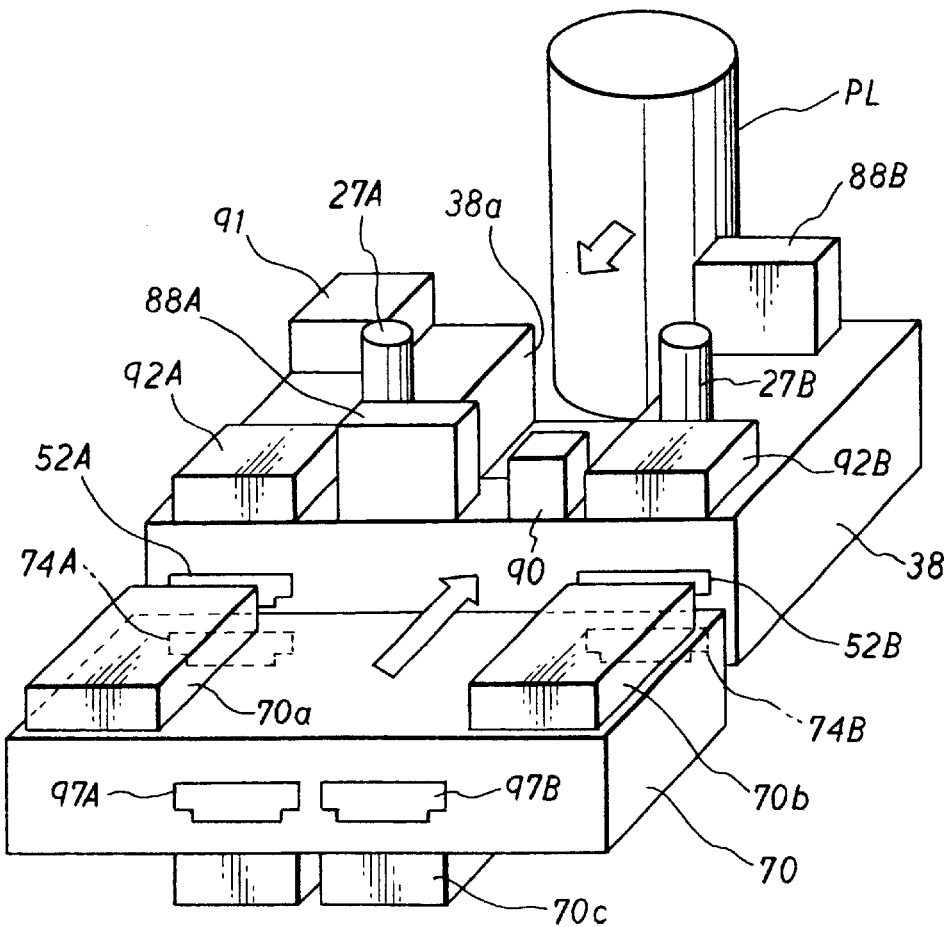
FIG. 6 shows a perspective view illustrating a state during assembling and adjustment of a projection optical system PL, the wafer chamber 38, and the wafer loader chamber 70 shown in FIG. 2 (or FIG. 3).

FIG. 6 shows a perspective view illustrating a state in which the wafer chamber 38, the wafer loader chamber 70, and the projection optical system PL shown in FIG. 3 are assembled and adjusted. In FIG. 6, for example, the laser light source unit 91, the prealignment mechanisms 92A, 92B, the AF sensors 88A, 88B, and the alignment sensors 27A, 27B are protrude as projections on the upper surface of the wafer chamber 38. The groove 38a, with which the projection optical system PL is relatively movable in the horizontal direction, is formed between these components. The driving units 70a, 70b, in which the driving apparatuses for driving the slide arms 77A, 77B shown in FIG. 3, are installed on the upper surface of the wafer loader chamber 70. The vibration-preventive pedestals 70C are arranged on the bottom surface of the wafer loader chamber 70. Further, the transport ports 97A, 97B, through which the wafer is transported with respect to the interface column 71 shown in FIG. 3, are formed at the front surface portions of the wafer loader chamber 70. The transport ports 97A, 97B are opened/closed by the shutters 85A, 85B shown in FIG. 3.

Figure 7A:
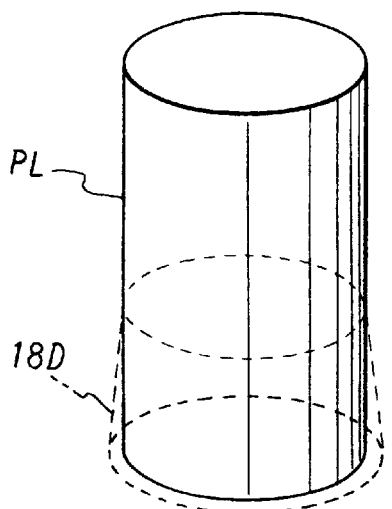
FIG. 7A shows a soft shield member 18D disposed between the projection optical system PL and the wafer chamber.
Figure 7B:
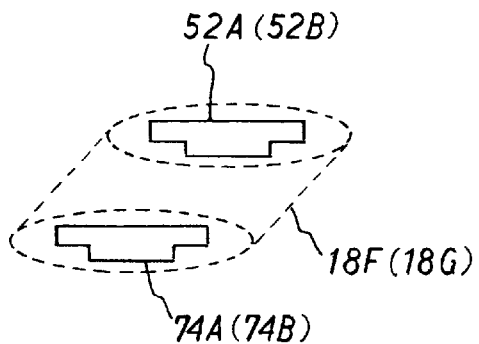
FIG. 7B shows a soft shield member 18F disposed between transport ports 52A, 74A.

When the projection exposure apparatus of this embodiment is assembled and adjusted, the wafer chamber 38 is assembled together with the wafer stage system WST among them, substantially concurrently with which the wafer loader chamber 70 is assembled together with the wafer loader systems WRDA, WRDB among them. After that, the projection optical system PL is installed to the frame mechanism shown in FIG. 2, and then the wafer chamber 38 is installed to the frame mechanism so that the projection optical system PL is relatively movable along the groove 38a as indicated by the arrow shown in FIG. 6. Subsequently, the wafer loader chamber 70 is installed so that the transport ports 74A, 74B of the wafer loader chamber 70 are opposed to the transport ports 52A, 52B of the wafer chamber 38. After that, as shown in FIG. 7A, the soft shield member 18D is installed so that the gap between the lower end of the projection optical system PL and the groove 38a of the wafer chamber 38 are tightly closed. The soft shield member 18F (or 18G) is installed so that the space between the transport port 52A (or 52B) and the transport port 74A (or 74B) is isolated from the atmospheric air.

Figure 8A:
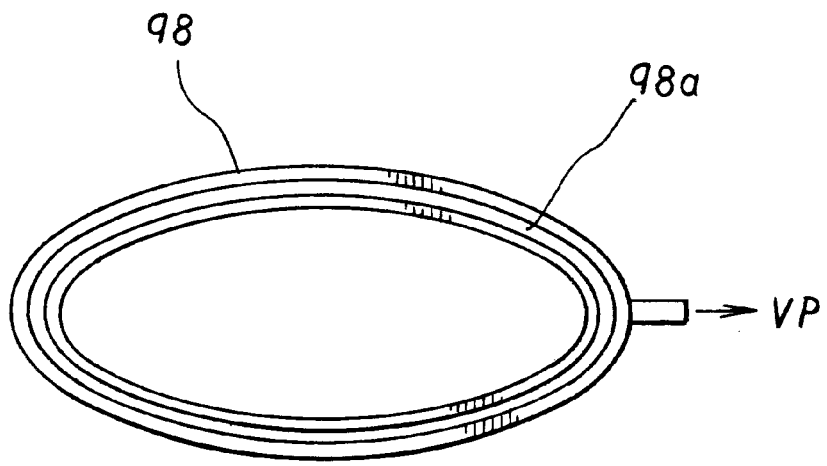
FIG. 8A shows a plan view illustrating an illustrative arrangement of the soft shield member 18F.
Figure 8B:
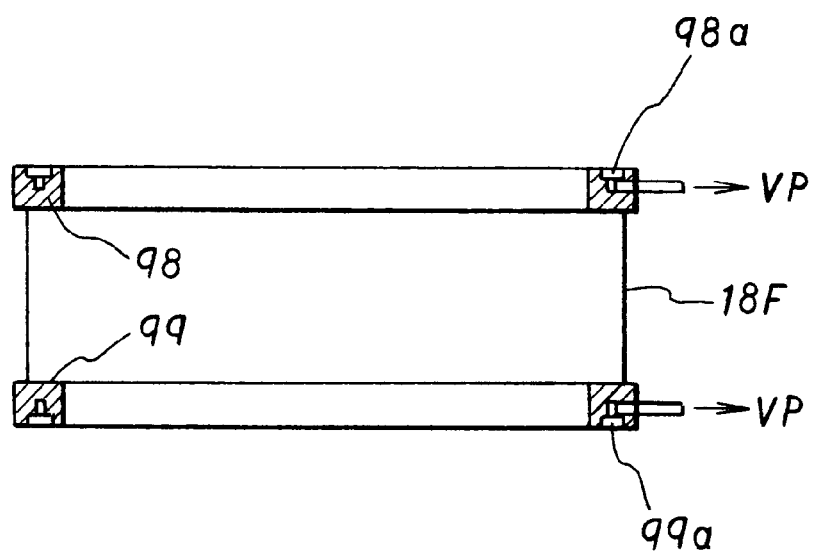
FIG. 8B shows a sectional view illustrating the illustrative arrangement of the soft shield member 18F.

FIG. 8A shows a plan view illustrating one of the first soft shield members 18F, and FIG. 8B shows a sectional view as viewed from the front thereof. As shown in FIGS. 8A and 8B, ring-shaped attracting sections 98, 99 are fixed to the both ends of the cylindrical soft shield member 18F. Grooves 98a, 99a for vacuum attraction, which communicate with a vacuum pump VP, are formed at the end surfaces of the attracting sections 98, 99. When the soft shield member 18F is installed between the transport port 52A and the transport port 74A shown in FIG. 6, the suction effected by the vacuum pump VP communicating with the grooves 98a, 99a is started in a state in which the first attracting section 98 is arranged for the wafer chamber 38 to surround the first transport port 52A, and the second attracting section 99 is arranged for the wafer loader chamber 70 to surround the second transport port 74A. The vacuum suction is continuously performed with the vacuum pump during the exposure step. The other soft shield member 18G is also attached by means of the same method. Accordingly, the space between the transport ports 52A, 74A and the space between the transport ports 52B, 74B are isolated from the atmospheric air with a high degree of air-tightness respectively. Further, for example, when the maintenance is performed, it is easy to move the wafer loader chamber 70 from the position in the vicinity of the wafer chamber 38.

However, it is feared that the vacuum pump is turned off, for example, upon the power failure, the soft shield members 18F, 18G are disengaged, and the purge gas is contaminated with the atmospheric air (light-absorbing substance). In order to avoid such a situation, in addition to the attraction of the soft shield members 18F, 18G by the aid of the vacuum pump, for example, it is desirable that a system, in which the fixation is effected mechanically with a flange or the like, is simultaneously used to fix the soft shield members 18F, 18G.

Figure 9A:
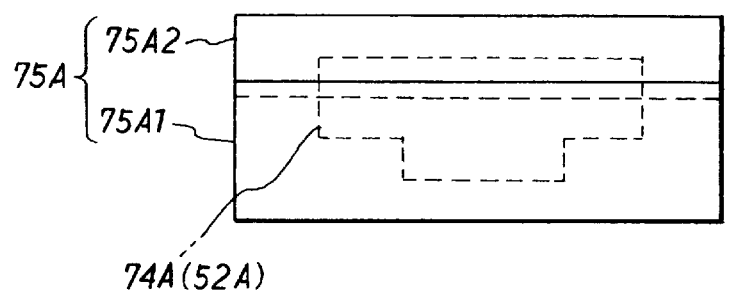
FIG. 9A shows a plan view illustrating a shutter 75A for opening/closing one of the transport ports 74A of the wafer loader chamber 70 shown in FIG. 3.
Figure 9B:
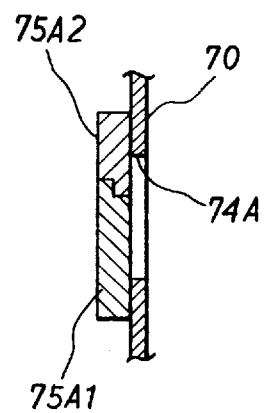
FIG. 9B shows a sectional view as viewed from a side plane of FIG. 9A.
Figure 9C:
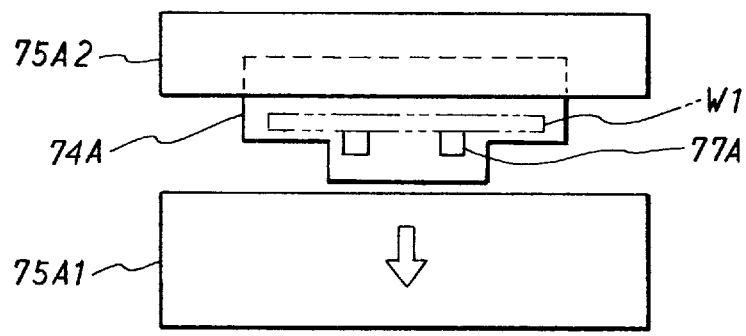
FIG. 9C shows a state in which only a first shutter 75A1 is open downwardly in the structure shown in FIG. 9A.

Next, FIG. 9A shows a front view illustrating the shutter 75A for opening/closing one of the transport ports 74A of the wafer loader chamber 70 shown in FIG. 3, and FIG. 9B shows a sectional view as viewed from the side of FIG. 9A. The shutter 75A of this embodiment is divided into a lower first shutter 75A1 and an upper second shutter 75A2. When the transport port 74A is closed, then the first shutter 75A1 and the second shutter 75A2 are closed so that they are meshed with each other, and thus the transport port 52A of the wafer chamber 38 shown in FIG. 3 and the interior of the waiting chamber 72A are shut off substantially completely. When the wafer is transported singly through the transport ports 52A, 74A, as shown in FIG. 9C, only the first shutter 75A1 is opened downwardly. The wafer W1, which is held on the slide arm 77A, passes through an approximately lower half area of the transport port 74A.

Figure 9D:
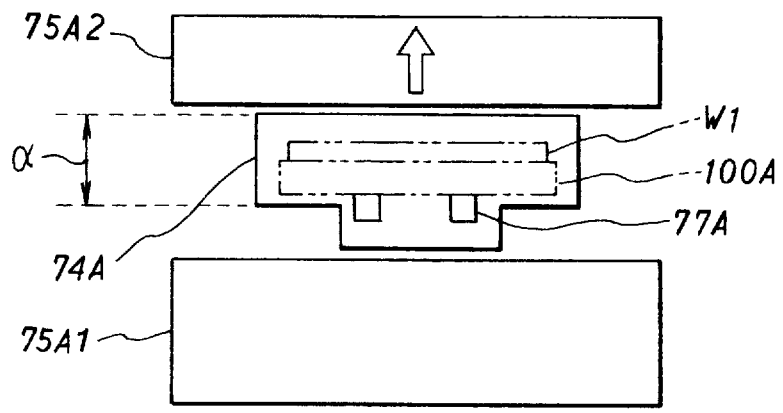
FIG. 9D shows a state in which the first shutter 75A1 and a second shutter 75A2 are open in the structure shown in FIG. 9A.

It is also possible to transport the wafer, for example, in a state of being installed to a wafer holder. In this case, as shown in FIG. 9D, the first shutter 75A1 is opened downwardly, and the second shutter 75A2 is simultaneously opened upwardly. Thus, the transport port 74A is in an fully open state. The wafer holder 100A, on which the wafer W1 is placed, passes through the transport port 74A in a state of being held on the slide arm 77A. In place of the transport of the wafer W1 while being placed on the wafer holder 100A, it is also possible to transport a container in a state in which the wafer W1 is accommodated in the container having a small size. Further, in order to clean the wafer holder 100A singly, the transport port 74A is also used when the wafer holder 100A is exported to the outside of the wafer chamber 38.

As described above, in this embodiment, when the wafer is transported together with the accompanying member, or when only the accompanying member is transported, then the transport port 74A is fully open. On the other hand, when the wafer W1 is transported singly, only the part of the transport port 74A is open. Therefore, the flow rate of the purge gas flowing from the interior of the wafer chamber 38 shown in FIG. 3 into the interior of the waiting chamber 72A is decreased. Accordingly, it is possible to maintain a high concentration of the purge gas at the inside of the wafer chamber 38. Further, it is possible to maintain a high intensity of the exposure light beam on the wafer W1, W2, it is possible to improve the throughput of the exposure step, and it is possible to reduce the running cost of the exposure apparatus. In order to suppress the leak amount of the purge gas to be low, it is desirable that each of the transport ports is made to be as small as possible as described above.

In the air-tight chamber (preparatory chamber 73 in this embodiment) which is connected to the interface column 71 (atmospheric air), the purge gas may outflow to the outside when the wafer or the like is transported, and the concentration of the light-absorbing substance is deteriorated (increased) due to any inflow of the atmospheric air. Accordingly, it is desirable to decrease the size (opening area) of the transport port (hereinafter referred to as "IF opening") between the interface column 71 and the preparatory chamber 73 defined by the shutter 85A, 85B when the wafer is transported. For example, it is desirable to make the size of the IF opening to be small as compared with the transport port (hereinafter referred to as "main body opening") 52A, 52B or 74A, 74B between the wafer chamber 38 and the waiting chamber 72A, 72B defined by the shutter 75A, 75B. In this case, it is unnecessary to restrict the size of the transport port (hereinafter referred to as "intermediate opening") between the waiting chamber 72A, 72B and the preparatory chamber 73 defined by the shutter 78A, 78B. However, it is desirable that the size of the intermediate opening is equivalent to or larger than that of the IF opening, or the size is equivalent to or smaller than that of the main body opening (52A, 52B or 74A, 74B) described above, or the size satisfies both of the foregoing conditions.

In this embodiment, the two air-tight chambers (preparatory chamber 73 and waiting chamber 72A or 72B) are provided between the wafer chamber 38 and the interface column 71, i.e., one intermediate opening exists between the IF opening and the main body opening. However, three or more air-tight chambers may be provided between the wafer chamber 38 and the interface column 71. Two or more intermediate openings, which exist between the IF opening and the main body opening, may have an equivalent size or different sizes. However, it is desirable that the relationship with respect to the size of the IF opening or the main body opening satisfies the foregoing condition.

It is enough that only one air-tight chamber is provided between the wafer chamber 38 and the interface column 71. In this case, it is enough that the IF opening is merely allowed to have a small size as compared with the main body opening. When at least two air-tight chambers are provided between the wafer chamber 38 and the interface column 71, it is also preferable that the size of the transport port is increased as the arrangement position approaches the wafer chamber. That is, it is also preferable that the size of the transport port may be increased in an order of the IF opening, the intermediate opening, and the main body opening. This arrangement is effective especially when the concentration of the light-absorbing substance is restricted most strictly in the wafer chamber 38, and the concentration of the light-absorbing substance is loosely managed in the respective air-tight chambers as approaching to the interface column 71. That is, when the concentration of the light-absorbing substance differs before and after a certain air-tight chamber other than the wafer chamber 38, and the concentration in the certain air-tight chamber is equivalent to or not less than the strict concentration of the concentrations therebefore and thereafter, then the transport port with the loose concentration is made smaller than the transport port with the strict concentration in the certain air-tight chamber.

The IF opening, the intermediate opening, and the main body opening may have an equal size, and the opening size may be made different by the aid of the shutters as described above when the wafer or the like is transported. Alternatively, the respective openings (transport ports) may have different sizes, and the shutters are used only for opening/closing the transport passage. In this embodiment, the wafer loader supports the back surface of the wafer. Therefore, the lateral width of each of the openings (transport ports) is approximately identical depending on the size of the wafer. Therefore, when the height (for example, the width represented by d in FIG. 9D) is adjusted for each of the openings (transport ports), the size (opening area) differs. However, when the size of the wafer loader (transfer area) passing through each of the openings (transport ports) differs, then the height may be adjusted in consideration of the size, or the size of each of the transfer areas may be set so that the foregoing condition is satisfied.

When at least one air-tight chamber is provided between the interface column 71 and the wafer chamber 38 separately from the wafer chamber 38, it is desirable that the pressure is made higher than that of the atmospheric air in the air-tight chamber connected to the interface column 71 in order to avoid any inflow of the atmospheric air. It is enough that the pressure of the wafer chamber 38 is equivalent to the pressure of the concerning airtight chamber. However, it is desirable that the pressure is highest in the wafer chamber 38. In this case, it is also preferable that the pressure of the air-tight chamber is increased as approaching to the wafer chamber 38. Especially, when the concentration of the light-absorbing substance differs between the mutually adjacent two air-tight chambers, it is desirable that the pressure in one of the air-tight chambers in which the concentration is strictly managed is made higher than that of the other air-tight chamber. Accordingly, it is possible to avoid any inflow of the purge gas from the air-tight chamber in which the concentration management is loose (allowable concentration of the light-absorbing substance is high) to the air-tight chamber in which the concentration management is strict (allowable concentration of the light-absorbing substance is low).

A part or the whole of the reticle loader 87 may be arranged in at least one air-tight chamber which is different from the reticle chamber 23. The size of the transport port and the pressure may be set in the same manner as described above in a plurality of air-tight chambers including the reticle chamber 23. In this case, the reticle may be accommodated in a tightly closed cassette (for example, bottom open type Smiph pod), and the reticle may be imported into the at least one air-tight chamber without making contact with the atmospheric air. One of the plurality of air-tight chambers may be provided with a buffer cassette (storage shelf) for holding at least one sheet of reticle.

Each of the transport ports (openings) may be mechanically made slender so that each of the transport ports has a so-called three-dimensional volume. Thus, the leak amount of the purge gas may be decreased by utilizing the viscosity of the purge gas.

Figure 11:
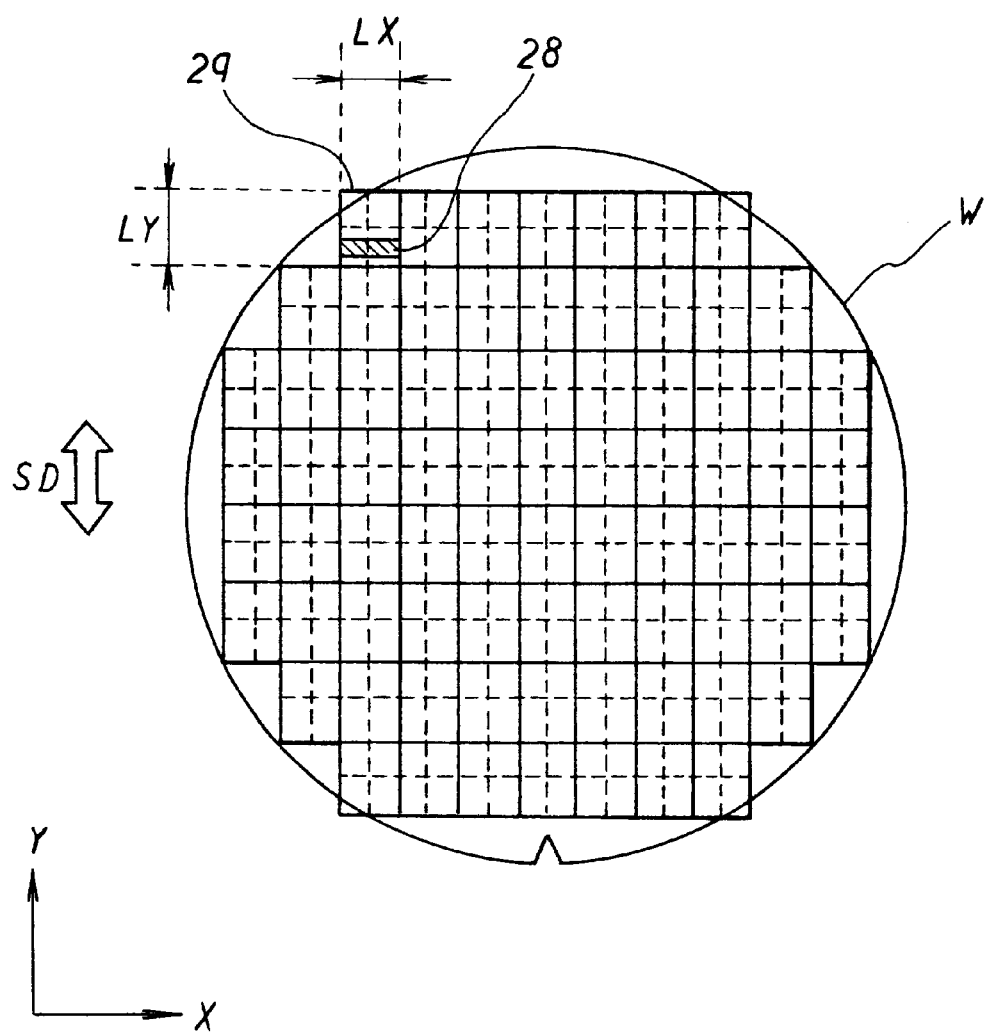
FIG. 11 shows a plan view illustrating an exemplary shot map on a wafer as an exposure objective according to the embodiment.

Next, an example of the method for optimizing the scanning velocity for the stage system upon the execution of the scanning exposure with the projection exposure apparatus shown in FIGS. 1 and 2 will be explained with reference to FIGS. 11 to 14. FIG. 11 shows an example of the shot arrangement on the wafer W (corresponding to the wafers W1, W2 shown in FIG. 1) as the exposure objective of this embodiment. In FIG. 11, the wafer W is a disk-shaped substrate (so-called a 12-inch wafer) having a diameter of about 300 mm. The effective exposure area of the wafer W is divided into a large number of shot areas 29 (corresponding to the comparted areas) each having a width LX in the X direction and a length LY in the Y direction at a predetermined pitch in the X direction (non-scanning direction) and in the Y direction (scanning direction). During the exposure, each of the shot areas is scanned in the +Y direction or −Y direction with respect to the slit-shaped exposure area 28 formed by the projection optical system PL.

In this embodiment, for example, the width LX of the shot area 29 is 25 mm, the length LY is 33 mm, and the width (slit width) of the exposure area 28 in the scanning direction is 10 mm. The surface of the wafer W is divided into eight columns in the Y direction. Seven shot areas 29 are included in the X direction in the first and eighth columns respectively. Nine shot areas 29 are included in the X direction in the second and seventh columns respectively. Eleven shot areas 29 are included in the X direction in the third to sixth columns respectively. Seventy-six shot areas 29 are formed on the entire surface of the wafer W. The shot area 29 of this embodiment includes four individuals in which identical chip patterns are formed at the inside in two rows in the X direction and two columns in the Y direction. For example, even when a part of the shot area 29 disposed at the outer circumferential portion of the wafer W protrudes to the outside of the effective exposure area, it is possible to cut out one or more usable chip patterns from the shot area, provided that the remaining one to three chip patters in the shot area are included in the effective exposure area.

Figure 12A:
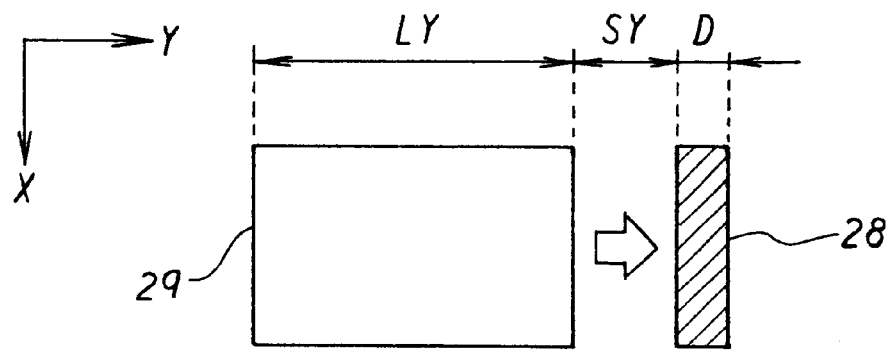
FIG. 12A shows a plan view illustrating a situation in which a shot area 29 having a length LY in the scanning direction is scanned with respect to an exposure area 28 having a slit width D.

FIG. 12A shows a plan view illustrating a situation in which the shot area 29 having the length LY in the scanning direction is scanned with respect to the exposure area 28 having the slit width D. In FIG. 12A, the acceleration is started at a rate of acceleration $W\alpha$ for the shot area 29 (wafer W) from the position separated from the exposure area 28 by a spacing distance SY. The velocity of the wafer W arrives at a predetermined scanning velocity VW to be stabilized until the tip of the shot area 29 arrives at the exposure area 28. After that, the velocity of the wafer W is maintained at the scanning velocity VW during the period in which the shot area 29 passes through the exposure area 28. The wafer W is decelerated to approximately zero substantially at a rate of acceleration $-W\alpha$ from the point of time at which the rearward end of the shot area 29 has passed through the exposure area 28.

In this case, the upper limit of the rate of acceleration $W\alpha$ of the wafer W, i.e., the rate of acceleration of the wafer stage 40A shown in FIG. 1 is prescribed by the upper limit of the rate of acceleration on the side of the reticle stage 24 in this embodiment, because of the following reason. That is, the projection magnification $\beta$ of the projection optical system PL from the reticle to the wafer in this embodiment is the reduction magnification which is, for example, ¼-fold or ⅕-fold. Accordingly, the rate of acceleration of the reticle stage 24 is, for example, four times or five times the rate of acceleration of the wafer stage 40A (wafer W) during the scanning exposure. Therefore, when the rate of acceleration is increased, the reticle stage 24 arrives at the upper limit earlier than the wafer stage 40A. The upper limit of the rate of acceleration of the reticle stage 24 is, for example, the rate of acceleration obtained immediately before the attracted and held reticle R1, R2 is disengaged, or the rate of acceleration which is the limit of the mechanism of the reticle stage 24. Accordingly, it is assumed that the upper limit of the rate of acceleration of the reticle stage 24 is $R\alpha$, and the scanning velocity obtained under this condition is VR. On this assumption, as represented by the following expression with the projection magnification $\beta$, the upper limit value (designated as $W\alpha$) of the rate of acceleration of the wafer stage 40A is $\beta \cdot R\alpha (\beta<1)$, and the scanning velocity VW of the wafer stage 40A is $\beta \cdot VR$. When the projection optical system PL performs the inverted projection, the direction of movement of the reticle stage 24 is opposite to that of the wafer stage 40A.

$$W\alpha = \beta \cdot R\alpha, \quad VW = \beta \cdot VR \quad (4)$$

The sum of the acceleration time and the deceleration time (acceleration and deceleration time) of the wafer stage 40A during the scanning exposure is approximately $2 \cdot VW/W\alpha$, and the exposure time in narrow definition, in which the shot area 29 is scanned with the exposure area 28, is $(LY+D)/VW$. Therefore, the exposure time $\Delta T$ for the shot area 29 is approximately represented by the following expression with the expression (4).

$$\Delta T = 2 \cdot VW/W\alpha + (LY+D)/VW = 2 \cdot VR/R\alpha + (LY+D)/(\beta \cdot VR) \quad (5)$$

Figure 12B:
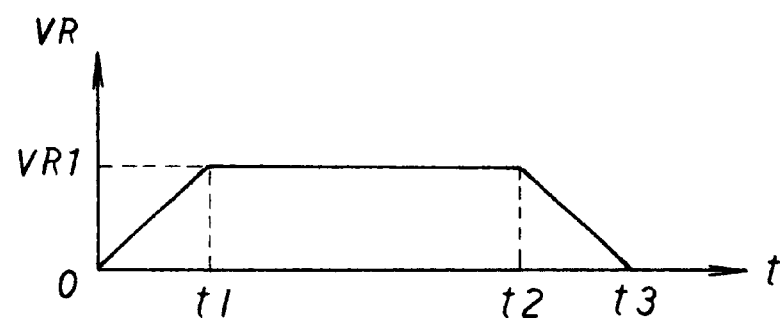
FIG. 12B shows a graph illustrating the time-dependent change of the scanning velocity VR of the reticle stage.
Figure 12C:
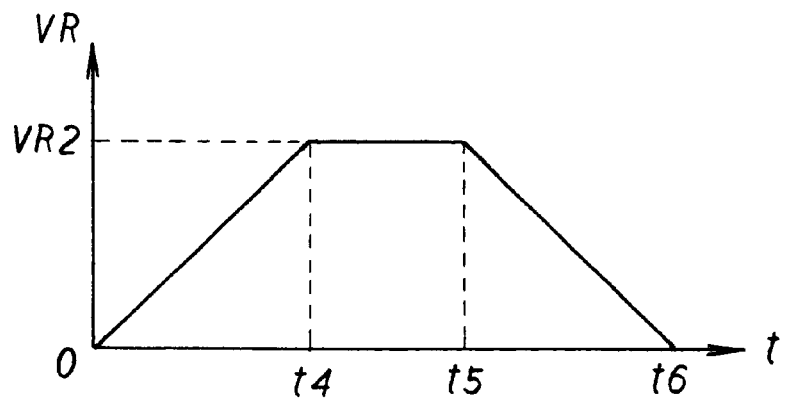
FIG. 12C shows a graph illustrating the time-dependent change of the scanning velocity VR of the reticle stage, depicting a situation in which the scanning velocity is faster than that in FIG. 12B.

In this case, if the scanning velocity VR of the reticle stage 24 is merely increased, then the exposure time in narrow definition is shortened, but the acceleration and deceleration time is prolonged. Therefore, the actual exposure time $\Delta T$ is all the more prolonged in some cases. Specifically, when the scanning velocity VR of the reticle stage 24 is VR1 as shown in FIG. 12B, it is assumed that the acceleration is performed between 0 and t1 for the time t, the exposure is performed between t1 and t2, and the deceleration is performed between t2 and t3. On the other hand, if the scanning velocity VR is VR2 which is faster than VR1 as shown in FIG. 12C, then the time t4 to t5, in which the exposure is performed, is shortened as compared with the time t1 to t2 shown in FIG. 12B, but the acceleration and deceleration time (0 to t and t5 to t6) is longer than the acceleration and deceleration time (0 to t1 and t2 to t3) shown in FIG. 12B. Therefore, the entire exposure time (0 to t6) is longer than that in FIG. 12B.

In order to optimize the scanning velocity VR so that the exposure time $\Delta T$ in the expression (5) is minimized, the following expression is obtained when the expression obtained by differentiating $\Delta T$ by VR is deemed to be zero.

$$d(\Delta T)/d(VR) = 2/R\alpha - (LY+D)/(\beta \cdot VR^2) = 0 \quad (6)$$

The optimum value VRadp of the scanning velocity VR to minimize the exposure time $\Delta T$ is obtained as follows by solving the expression (5) for the scanning velocity VR.

$$VRadp = \{(LY+D)R\alpha/(2 \cdot \beta)\}^{1/2} \quad (7)$$

However, actually, it is desirable for the exposure time $\Delta T$ to consider the settling time Tsync until the synchronization between the both stages is established after the reticle stage 24 and the wafer stage 40A shown in FIG. 1 arrive at the predetermined scanning velocities respectively, in addition to the expression (4). In this case, when the settling time Tsync varies depending on the scanning velocity VR, it is necessary to correct the optimum value VRadp represented by the expression (7).

It is assumed that $P_{IL}$ represents the practical maximum pulse energy density of the exposure light beam on the wafer, and $f_{IL}$ represents the light emission frequency. The added up exposure energy density P1 at each point on the wafer, which is obtained when the scanning velocity VW is the optimum value $\beta \cdot VRadp$ for the exposure area 28 having the slit width D, is lowered approximately in proportion to the optimum value $\beta \cdot VRadp$ as follows.

$$P1 = \{D/(\beta \cdot VRadp)\} f_{IL} \cdot P_{IL} \quad (8)$$

Therefore, it is assumed that P2 represents the proper exposure energy density of the photoresist on the wafer W. When P2 is smaller than P1, it is possible to obtain the proper exposure energy density P2, for example, by switching the transmissivity of the light-reducing filter in the first illumination system IS1 shown in FIG. 2, or controlling the output of the exposure light source 3. However, when P2 is higher than P1 due to the low sensitivity of the photoresist, it is necessary that the scanning velocity VR is made to be smaller than the optimum value VRadp. That is, when the sensitivity of the photoresist is lowered, the rate-limiting condition of the reticle stage 24 (and the wafer stage 40A) is the proper exposure energy density of the photoresist. When the sensitivity of the photoresist is increased, the scanning velocity VR can be optimized on the basis of the expression (7) or the expression obtained by correcting the expression (7).

In order to determine the optimum value VRadp of the scanning velocity VR of the reticle stage 24 by means of the computer simulation when the scanning exposure is actually performed for the seventy-six shot areas 29 on the wafer W shown in FIG. 11, the rate of acceleration $R\alpha$ of the reticle stage 24 was set to have a variety of values. On this condition, the value of the scanning velocity VR (mm/S) was gradually changed, and the exposure time $\Delta T$ obtained by adding the settling time Tsync to the expression (4) and the time for the stepping movement of the wafer W were added up for the seventy-six shot areas to determine the exposure stepping time $T_{ES}$ (sec). Results are shown in FIG. 13.

Figure 13:
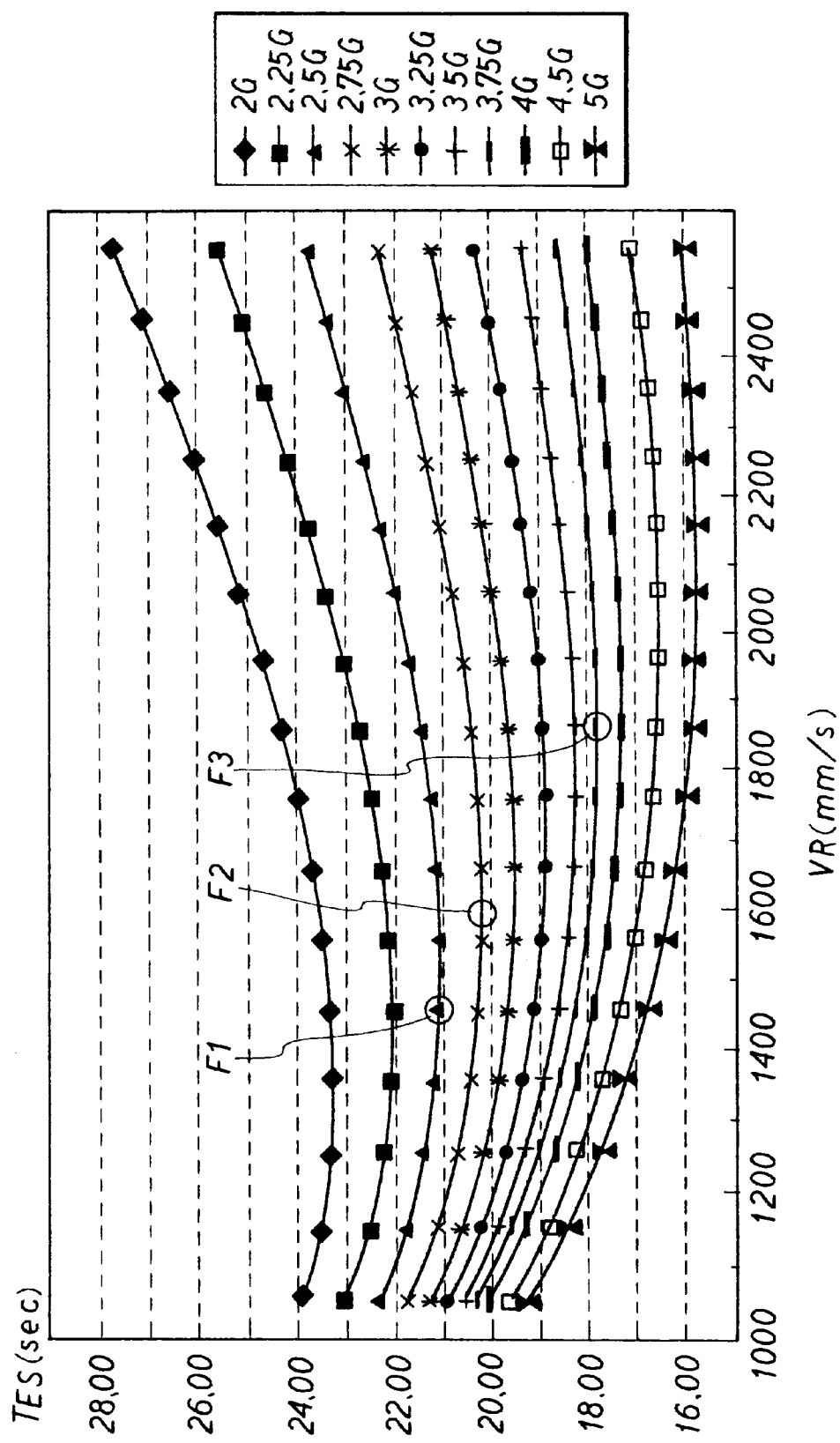
FIG. 13 shows exemplary results of simulation concerning the relationship between the scanning velocity of the reticle stage and the exposure alignment time, as obtained when the rate of acceleration of the reticle stage is set to be variously varied.

In FIG. 13, the horizontal axis indicates the scanning velocity VR (mm/s), and the vertical axis indicates the exposure stepping time $T_{ES}$ (sec). In this case, the values of the respective parameters are as follows. That is, the width LX of the shot area 29 is 25 mm, the length LY is 33 mm, the projection magnification $\beta$ is ¼, the slit width D of the exposure area 28 is 10 mm, and the settling time Tsync is 20 msec. The eleven curves shown in FIG. 13 represent, in an order from the upper one, the results of calculation obtained when the rate of acceleration $R\alpha$ of the reticle stage 24 is 2 G, 2.25 G, 2.5 G, 2.75 G, 3 G, 3.25 G, 3.5 G, 3.75 G, 4 G, 4.5 G, and 5 G. According to these curves, it is appreciated that the optimum value of the scanning velocity VR to minimize the exposure stepping time $T_{ES}$ is approximately within a range of about 1200 to 2400 mm/s, even when the rate of acceleration $R\alpha$ is set to be any value within the range of about 2 G to 5 G. Specifically, the optimum values of the scanning velocity VR, which are obtained when the rate of acceleration $R\alpha$ is 2.5 G, 2.75 G, and 3.75 G, are about 1450 mm/s at a point F1, about 1580 mm/s at a point F2, and about 1850 mm/s at a point F3 respectively.

Figure 14:
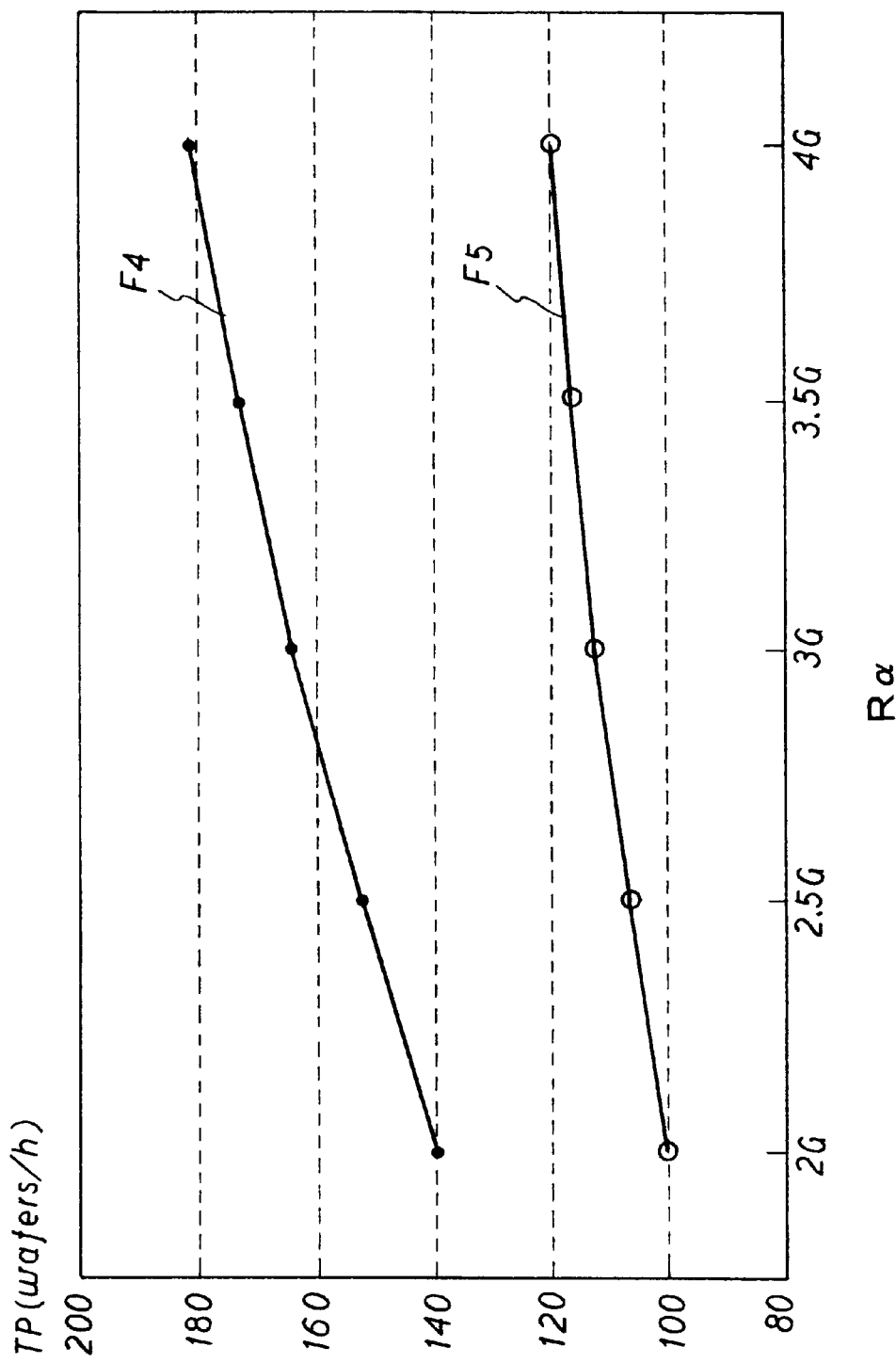
FIG. 14 shows exemplary relationships between the rate of acceleration of the reticle stage and the throughput of the projection exposure apparatus.

Next, a curve F4 in FIG. 14 represents a result of calculation for the throughput, which is obtained when the scanning exposure is performed for the wafer W shown in FIG. 11 with the projection exposure apparatus based on the double-wafer stage system shown in FIGS. 1 and 2 by using the scanning velocity optimized in accordance with the result shown in FIG. 13. In FIG. 14, the horizontal axis represents the rate of acceleration $R\alpha$ of the reticle stage 24, and the vertical axis represents the throughput TP (wafers/h) to indicate the number of wafers to be successfully exposed per one hour. In order to make comparison with the curve F4 (double-wafer stage system), a curve F5 indicates a result of calculation for the throughput TP obtained when the exposure is performed at the rate of acceleration $R\alpha$ and the scanning velocity corresponding thereto with a conventional projection exposure apparatus based on the single-wafer stage system. As appreciated from the comparison between the curve F5 and the curve F4, the throughput, which is about 1.4 to 1.5 fold as compared with the single-wafer stage system, is obtained by adopting the double-wafer stage system.

Commonly with the double-wafer stage system and the single-wafer stage system, the throughput TP is also improved when the rate of acceleration Rα of the reticle stage 24 is increased. However, when the rate of acceleration Rα of the reticle stage 24 exceeds 2.5 G to 3 G, the ratio of increase of the throughput TP is decreased as compared with the ratio of increase of the rate of acceleration Rα. Therefore, in order to simplify the arrangement of the stage system as far as possible and obtain the high throughput, it is desirable that the rate of acceleration Rα of the reticle stage 24 is set to be about 2.5 G to 3 G.

Figure 19A:
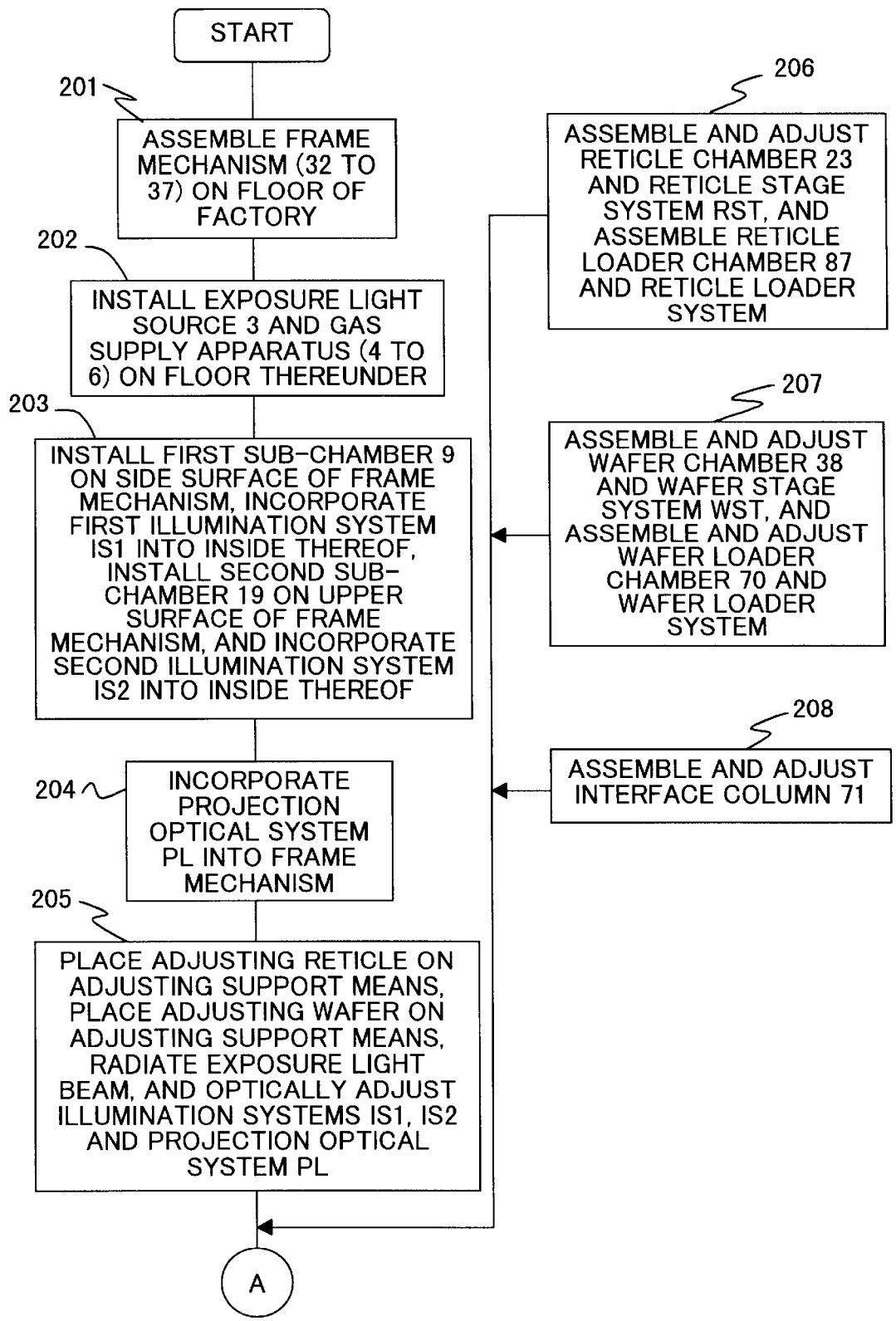
FIGS. 19A and 19B show a flow chart illustrating an exemplary flow of the operation for assembling and adjusting the projection exposure apparatus according to the embodiment of the present invention.
Figure 19B:
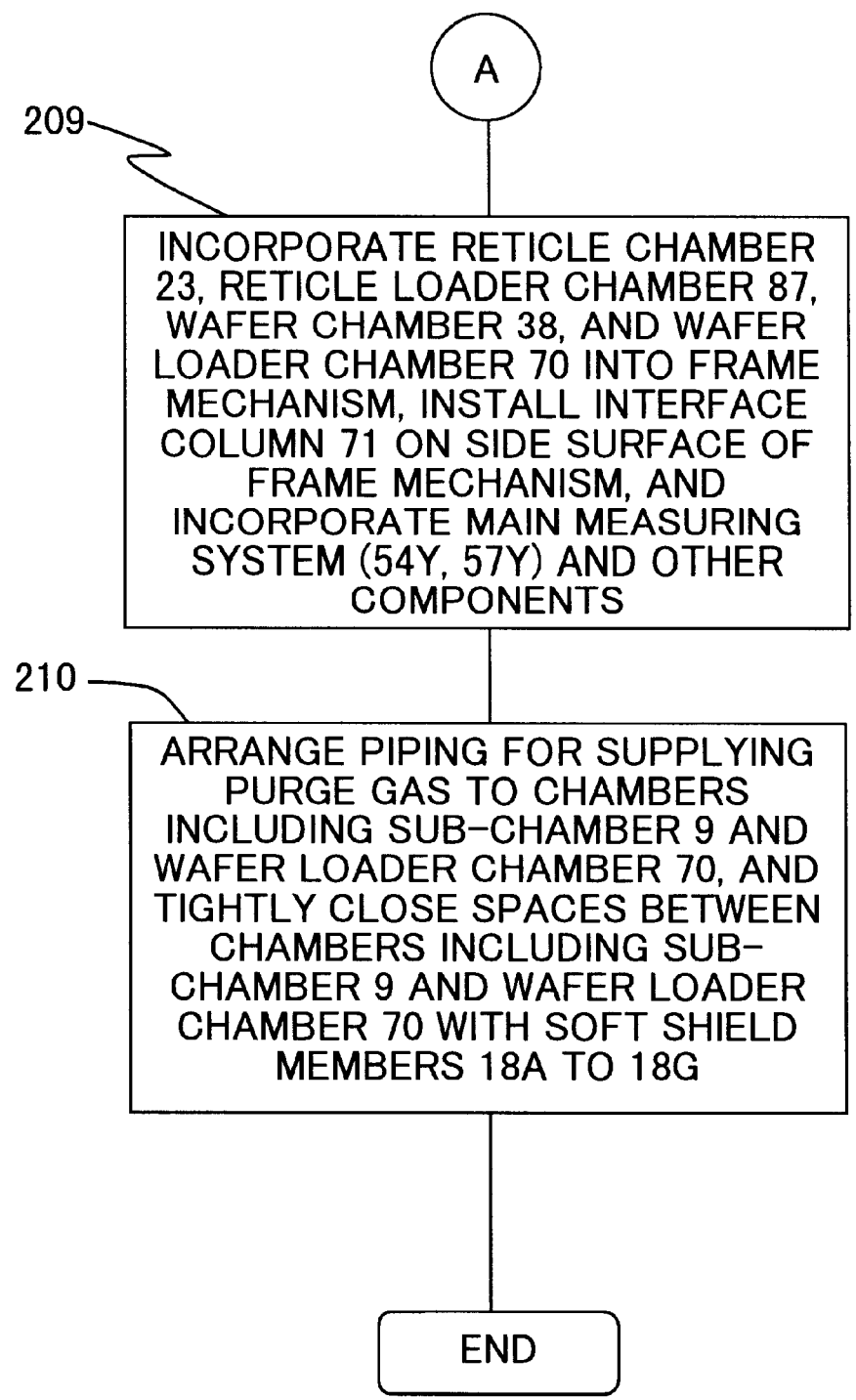

Next, an example of the method for assembling and adjusting the projection exposure apparatus of the embodiment shown in FIGS. 1 and 2 will be explained with reference to FIG. 10 and a flow chart shown in FIGS. 19A and 19B.

Figure 10:
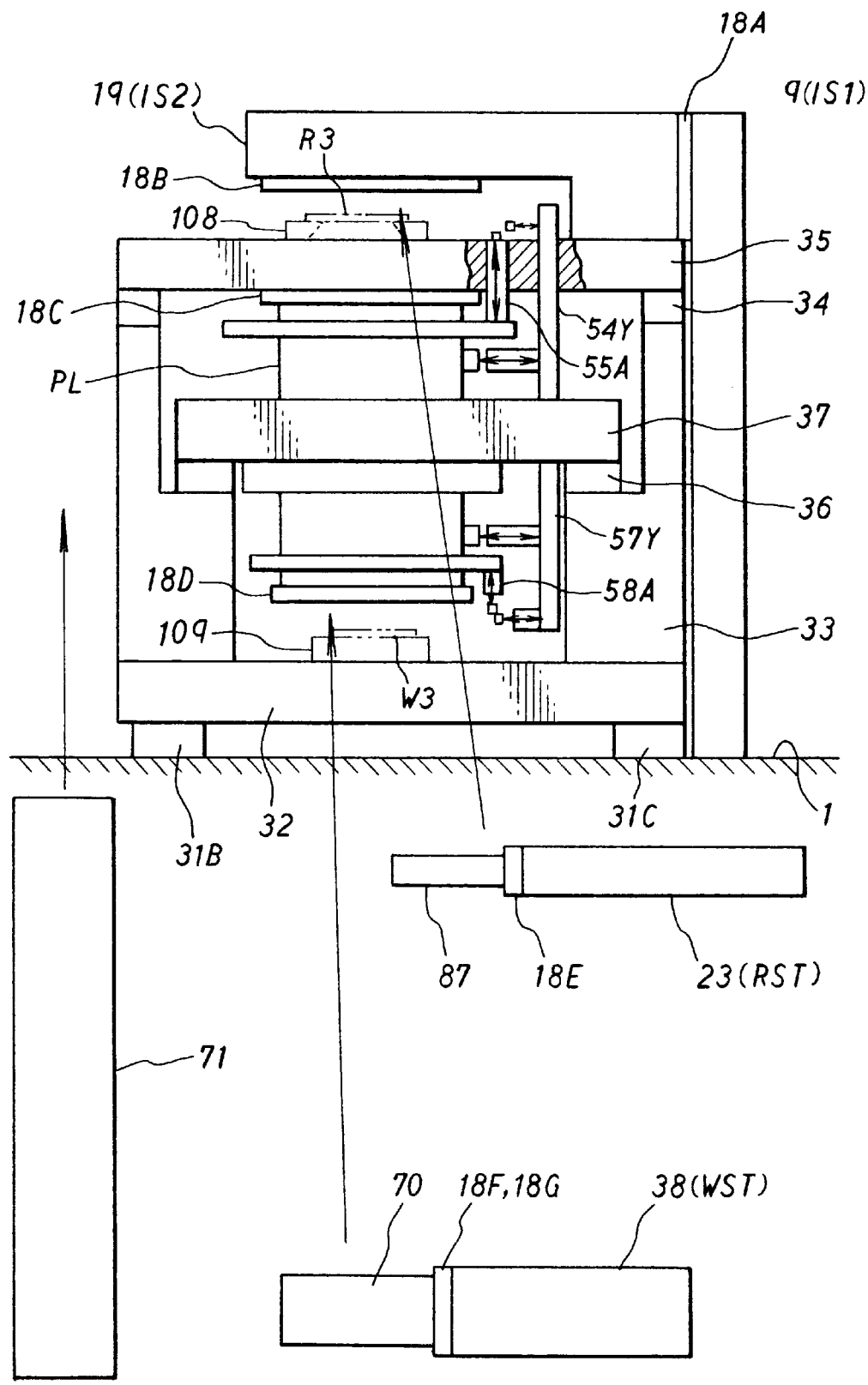
FIG. 10 shows a state upon assembling and adjustment of the projection exposure apparatus according to the embodiment.

FIG. 10 shows a state during the assembling and the adjustment for the projection exposure apparatus shown in FIGS. 1 and 2. At first, as shown in FIG. 10, in the step 201 shown in FIGS. 19A and 19B, the base plate 32, the column 33, the vibration-preventive pedestals 34, the support plate 35, the vibration-preventive pedestals 36, and the support plate 37 are accumulated, for example, on the floor 1 in the clean room of a semiconductor-producing factory to assemble the frame mechanism (32 to 37). In the next step 202, as shown in FIG. 2, the exposure light source 3, and the gas supply apparatus including the recovery unit 4, the gas-feeding unit 5, and the accumulating unit 6 are installed on the floor 2 thereunder.

Subsequently, in the step 203, the first sub-chamber 9 is installed to the side surface of the frame mechanism shown in FIG. 10, and the first illumination system IS1 is incorporated into the inside thereof. The second sub-chamber 19 is installed to the side surface of the frame mechanism, and the second illumination system IS2 is incorporated into the inside thereof. In the step 204, the projection optical system PL is carried on the support plate 37 of the frame mechanism by the aid of the unillustrated cutout, and the wiring arrangement is made for the unillustrated control system and the respective driving units. After that, in the step 205, an adjusting support 108 is fixed onto the support plate 35 of the frame mechanism. A test reticle R3, on which, for example, an evaluating pattern is formed, is placed on the support 108. An adjusting support 109 is fixed onto the base plate 32. A wafer W3 for test printing is placed on the support 109. The exposure light beam is radiated from the exposure light source disposed under the floor to adjust the optical characteristics (for example, optical axis adjustment, focus adjustment, and fine adjustment for various aberrations) of the illumination systems IS1, IS2 and the projection optical system PL.

Concurrently with the operations performed in the steps 201 to 205, for example, in another assembling room, the reticle chamber 23 and the reticle stage system RST accommodated therein are assembled and adjusted in the step 206 as shown in FIG. 10. Further, the reticle loader chamber 87 and the reticle loader system accommodated therein are assembled and adjusted. Further, in the step 207, the wafer chamber 38 and the wafer stage system WST accommodated therein are assembled and adjusted. The wafer loader chamber 70 and the wafer loader system accommodated therein are assembled and adjusted. In the step 208, the interface column 71 and the reticle library, the wafer cassette, and other components accommodated therein are assembled and adjusted. In the steps 206 to 208, for example, the wiring arrangement is also performed with respect to the unillustrated control system respectively.

In the step 209, the adjusting support 108, 109 are detached from the frame mechanism. After that, the reticle chamber 23 and the reticle loader chamber 87 are incorporated onto the support plate 35 of the frame mechanism, the wafer chamber 38 and the wafer loader chamber 70 are incorporated onto the base plate 32, and the interface column 71 is installed to the side surface of the frame mechanism. In this procedure, as shown in FIG. 6, the groove 38a is formed at the upper portion of the wafer chamber 38. Accordingly, the wafer chamber 38 is moved in the lateral direction with respect to the projection optical system PL along the groove 38. Thus, it is possible to install the wafer chamber 38 easily and quickly.

With reference to FIG. 10 again, in order to measure the positions of the reticle chamber 23 and the wafer chamber 38 on the basis of the projection optical system PL, the interferometer units 54Y, 57Y as the main measuring system and other components are incorporated. In order to measure the heights of the reticle chamber 23 and the wafer chamber 38 on the basis of the projection optical system PL, the interferometer units 55A, 58A and other components are incorporated. In the step 210 to be performed thereafter, as shown in FIG. 2, the gas feed tubes 16A to 16E, the gas discharge tubes 17A to 17F, the gas feed tube 7D, and the gas discharge tube 7A are arranged in order to supply the purge gas to the sub-chambers 9, 19, the reticle chamber 23, the projection optical system PL, the wafer chamber 38, and the wafer loader chamber 70. The soft shield members 18A to 18G (see FIG. 3) are installed in order to isolate the spaces between the chambers including the sub-chamber 9 and the wafer loader chamber 70 from the atmospheric air. After that, the overall adjustment (for example, electric adjustment and confirmation of operation) is performed. Thus, the projection exposure apparatus shown in FIGS. 1 and 2 is successfully produced in a short period of time in accordance with the module system or the box system.

Next, other embodiments of the present invention will be explained. At first, with reference to FIGS. 15 and 16, explanation will be made for another exemplary arrangement of the wafer stage system WST of the projection exposure apparatus described above. The wafer stage system WST shown in FIG. 3 commonly uses the X axis guide members 41, 42 for the two wafer stages 40A, 49B. On the contrary, in this exemplary arrangement, two wafer stages 40A, 40B are independently provided with X axis guide members. Components shown in FIGS. 15 and 16 corresponding to those shown in FIGS. 1 to 3 are designated by the same reference numerals, detailed explanation of which will be omitted.

Figure 15:
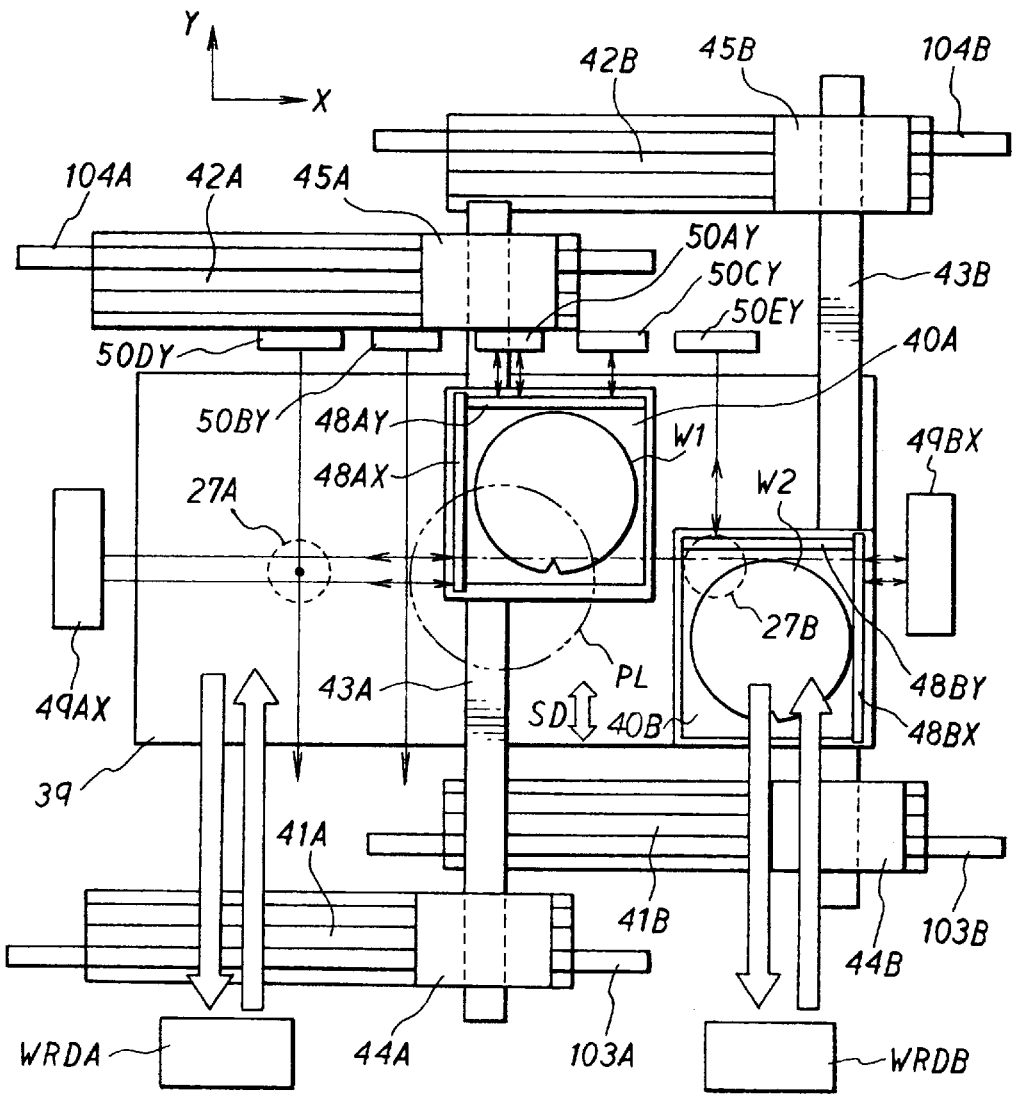
FIG. 15 shows a plan view illustrating a wafer stage system according to another embodiment of the present invention.
Figure 16:
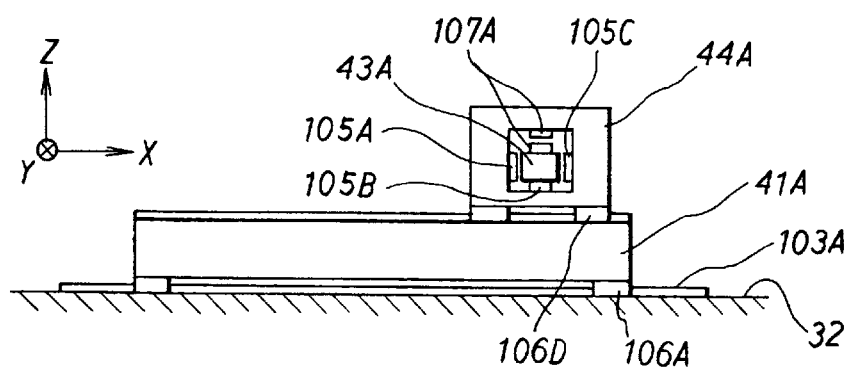
FIG. 16 shows a partial front view illustrating the wafer stage system shown in FIG. 15.

FIG. 15 shows a plan view illustrating another exemplary arrangement of the wafer stage system, and FIG. 16 shows a front view illustrating a part of FIG. 15. In FIG. 15, a pair of first X axis guide members 41A, 42A, which are slidable in the X direction by the aid of air pads 106A (see FIG. 16) along rails 103A, 104A, are installed so that the wafer base 39 is interposed in the scanning direction SD (Y direction). Further, a pair of second X axis guide members 41B, 42B, which are slidable along rails 103B, 104B, are installed in parallel to the pair of first X axis guide members 41A, 42A. First X axis sliders 44A, 45A, which are slidable in the X direction by the aid of air pads 106D (see FIG. 16), are placed on the X axis guide members 41A, 42A. Second X axis sliders 44B, 45B are placed slidably on the second X axis guide members 41B, 42B.

A first Y axis guide 43A is arranged slidably in the Y direction by the aid of air pads 105A to 105C (see FIG. 16) with respect to the first X axis sliders 44A, 45A. A second Y axis guide 43B is arranged slidably in the Y direction by the aid of air pads with respect to the second X axis sliders 44B, 45B. Wafer stages 40A, 40B are arranged slidably in the Y direction by the aid of air pads with respect to the Y axis guides 43A, 43B. Wafers W1, W2 are held on the wafer stages 40A, 40B. Linear motors (not shown) are provided to relatively drive the first X axis sliders 44A, 45A with respect to the first X axis guide members 41A, 42A while substantially satisfying the law of conservation of momentum. Linear motors (not shown) are provided to relatively drive the second X axis sliders 44B, 45B with respect to the second X axis guide members 41B, 42B while substantially satisfying the law of conservation of momentum. As described above, in this embodiment, the X axis guide members 41A, 42A and the X axis guide members 41B, 42B are arranged mutually independently for the two wafer stages 40A, 40B. Therefore, it is possible to drive the two wafer stages 40A, 40B also in the X direction while satisfying the law of conservation of momentum substantially completely respectively.

In addition to the linear motors (not shown) for relatively driving the wafer stages 40A, 40B in the Y direction with respect to the Y axis guides 43A, 43B respectively, for example, linear motors 107A for correcting the positions of the Y axis guides 43A, 43B in the Y direction are also provided. Linear motors (not shown) for correcting the positions in the X direction are also provided on the sides of the X axis guide members 41A, 42A, 41B, 42B.

With reference to FIG. 15, an X axis movement mirror 48BX and a Y axis movement mirror 48BY are fixed to the side surfaces of the second wafer stage 40B in the +X direction and the +Y direction symmetrically with movement mirrors 48AX, 48AY for the first wafer stage 40A. Also in this embodiment, measuring beams having a plurality of axes are supplied to the X axis movement mirrors 48AX, 48BX from X axis wafer interferometers 49AX, 49BX. Measuring beams having a plurality of axes are supplied from Y axis wafer interferometers 50AY to 50EY to Y axis movement mirrors 48AY, 48BY in accordance with the switching system. In this embodiment, wafer interferometers 50BY, 50CY for delivering the measured values are arranged between the central wafer interferometer 50AY which has the optical axis passing through the exposure center and the wafer interferometers 50DY, 50EY each of which has the optical axis passing through the detection center of each of the alignment sensors 27A, 27B disposed at the both ends. Accordingly, it is possible to further miniaturize the wafer stages 40A, 40B.

Next, with reference to FIGS. 17 and 18, explanation will be made for other exemplary arrangements of the reticle chamber 23 and the wafer chamber 38 of the embodiment described above. At first, the reticle chamber 23 and the wafer chamber 38 of the embodiment shown in FIGS. 1 and 2 cover the portions ranging from the side surface portion to the upper surface portion of the reticle stage system RST and the wafer stage system WST respectively. In place of this arrangement, the following arrangement may be also available. That is, each of the reticle chamber 23 and the wafer chamber 38 is allowed to have a substantially complete box structure having a thick partition wall, and the bottom surface portion of each of the reticle stage system RST and the wafer stage system WST is also covered with the reticle chamber 23 and the wafer chamber 38. However, as for the reticle chamber 23, it is necessary that an opening for allowing the exposure light beam IL to pass therethrough is provided at the center of the bottom surface portion. When the substantially complete box structure is adopted as described above, it is possible to enhance the air-tightness of the reticle chamber 23 and the wafer chamber 38. It is possible to maintain a high concentration of the purge gas, and it is possible to improve the efficiency of use of the purge gas.

When the substantially complete box structure is adopted as described above, it is desirable to effect the support at three points with respect to the installation surface (support plate 35 and base plate 32) in accordance with the principle of the kinematic support, in order to stably support the reticle chamber 23 and the wafer chamber 38. When the three-point support is performed as described above, if the reticle stage 24 or the wafer stage 40A, 40B is moved at the inside, then the partition wall of the bottom surface of the reticle chamber 23 or the wafer chamber 38 is deformed due to any unbalanced load. As a result, for example, it is feared that the alignment sensor or the AF sensor is slightly deformed, and any measurement error is generated. In order to avoid such an inconvenience, it is preferable to sufficiently enhance the rigidity (box rigidity) of the partition wall at the bottom surface.

However, for example, when the sufficient box rigidity as described above is not obtained in order to realize a light weight, it is also preferable that one box structure is divided into a section which includes the driving mechanism and a section which scarcely includes the driving mechanism.

Figure 17:
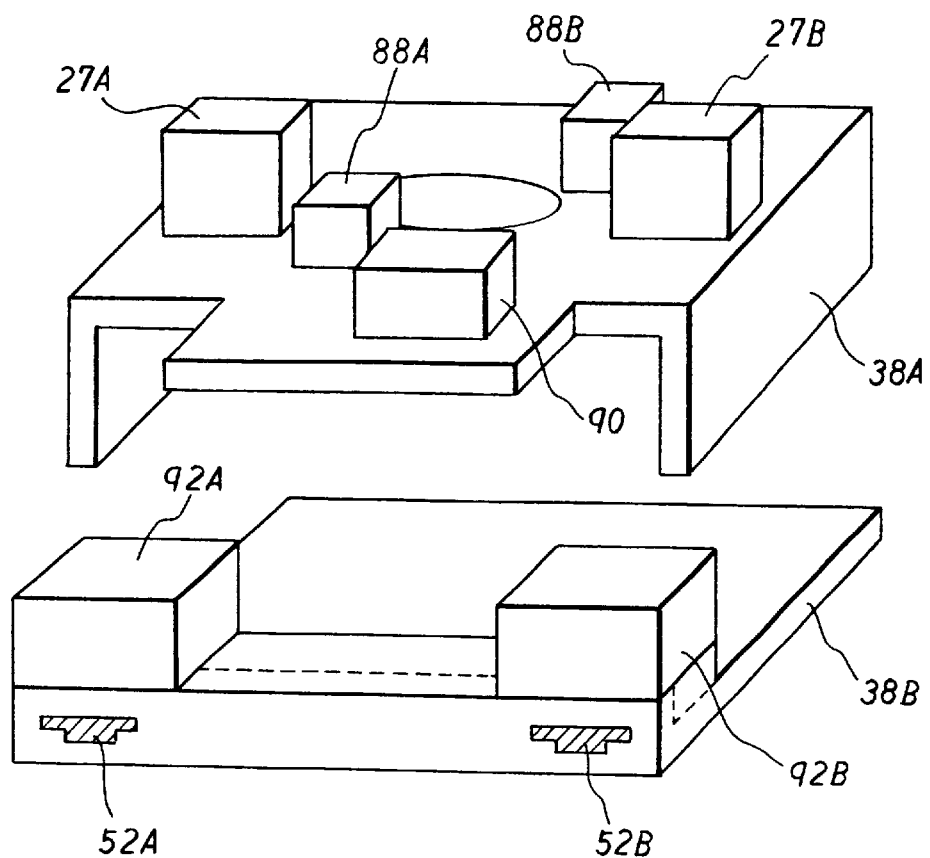
FIG. 17 shows an exploded perspective view illustrating a wafer chamber according to another embodiment of the present invention.
Figure 18:
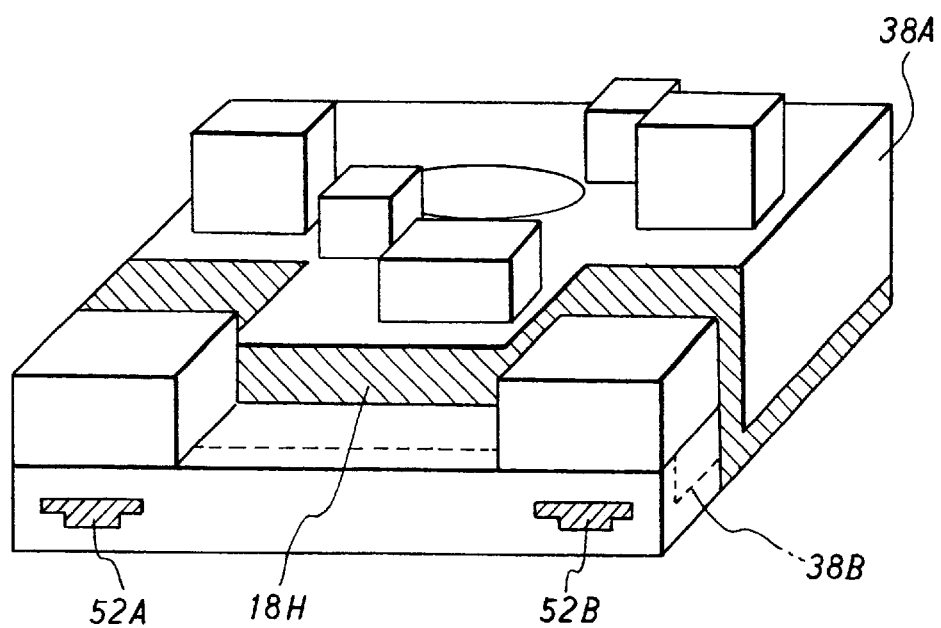
FIG. 18 shows a perspective view illustrating a state in which the wafer chamber shown in FIG. 17 is assembled.

FIG. 17 shows an exemplary arrangement in which the wafer chamber 38 shown in FIG. 6 is divided into two sections. In FIG. 17, components corresponding to those shown in FIG. 6 are designated by the same reference numerals, detailed explanation of which will be omitted. With reference to FIG. 17, the members such as the alignment sensors 27A, 27B, the AF sensors 88A, 88B, and the sensor unit 90, which do not substantially include the driving unit, are installed to a box-shaped stationary section 38A for covering the side surface portions and the upper surface portion. On the other hand, the prealignment mechanisms 92A, 92B, which include the driving unit, are installed on the front side of a flat plate-shaped movable section 38B corresponding to the bottom surface portion. The transport ports 52A, 52B for the wafers are provided corresponding thereto. The wafer stage system WST shown in FIG. 1, which includes the driving unit, is placed on the flat surface portion of the movable section 38B.

When this exemplary arrangement is assembled and adjusted, the stationary section 38A and the movable section 38B are firstly assembled separately. After that, for example, the wafer interferometers and the alignment sensors 27A, 27B, which are disposed at the inside, are adjusted in a state in which the stationary section 38A is placed on the movable section 38B, for example, in accordance with the three-point support (kinematic support). Subsequently, as shown in FIG. 18, a film-shaped soft shield member 18H is installed so that the gap portion between the stationary section 38A and the movable section 38B is completely covered therewith. After that, when the integrated wafer chamber (38A, 38B) is installed on the base plate 32 shown in FIG. 1, for example, in accordance with the three-point support, for example, the stationary section 38A is fixed to the support plate 37 on which the projection optical system PL is placed. Any support member between the stationary section 38A and the movable section 38B is removed. Accordingly, the vibration, which is generated in the movable section 38B, is not transmitted, for example, to the AF sensors 88A, 88B of the stationary section 38A. It is possible to highly accurately perform, for example, the alignment and the autofocus operation. Further, in this exemplary arrangement, the relative displacement between the stationary section 38A and the projection optical system PL is extremely minute. Therefore, for example, it is allowable that the interferometer units 57AX, 57BX as the main measuring system shown in FIG. 1 measure other positions of the stationary section 38A, for example, in place of the back surface portions (portions integrated with the reflecting mirrors) of the wafer interferometers 49AX, 49BX. Thus, the degree of freedom of the design of the main measuring system is increased.

Alternatively, in place of the exemplary arrangement shown in FIG. 17 in which the stationary section 38A is completely separated from the movable section 38B, it is also preferable that the stationary section 38A and the movable section 38B are connected with vibration-preventive mechanisms disposed at three places, and the surroundings of the vibration-preventive mechanisms are covered with the soft shield member 18H. Accordingly, it is possible to mitigate the influence of vibration by means of the simple structure.

In the embodiment described above, as shown in FIG. 3, for example, the first wafer stage 40A and the second wafer stage 40B are driven in parallel, and two sets of the alignment sensors 27A, 27B are also arranged. However, the following arrangement may be also available. That is, the alignment sensor 27B is omitted (only the alignment sensor 27A is installed). A first driving system for driving the wafer stage 40A, 40B under the projection optical system PL, and a second driving system for driving the wafer stage 40A, 40B under the alignment sensor 27A are arranged. In this case, when the exposure is performed for the wafer W2 on the wafer stage 40B after the exposure is performed for the wafer W1 on the wafer stage 40A driven by the first driving system, then the wafer stage 40A is exchanged with the wafer stage 40B, and the wafer stage 40B is driven by means of the first driving system. Accordingly, it is possible to decrease the foot print (installation area) of the wafer stage system.

The reticle stage system RST and the wafer stage system WST of the embodiment described above are based on the double-holder system or the double-stage system, in which the high throughput is obtained. However, it is also preferable that each of the reticle stage system and the wafer stage system is based on the single-stage system (single-holder system). Details of the double-stage system are disclosed, for example, in International Publication WO98/24115 filed by the present applicant. This patent document is incorporated herein by reference.

The frame or the frame mechanism in the present invention is not limited to the structure shown in FIG. 1. In place of the arrangement in which the wafer base 39 and the column 33 to install the projection optical system PL thereon are provided on the base plate 32 supported by the vibration-preventive pedestals 31A to 31D, for example, it is also preferable that the column 33 and the wafer base 39 are supported by different vibration-preventive pedestals respectively. In the embodiment described above, the wafer base 39 is arranged separately from the column. However, for example, the following arrangements may be also available. That is, the wafer base 39 is supported by the column 33 by the aid of the vibration-preventive pedestals 36, or the wafer base 39 is allowed to hang on the support plate 37 by the aid of a frame or the like. Further, it is also preferable that only the finely movable stage of the reticle stage 24 is arranged on the support plate 35, and the coarsely movable stage is provided on another base member different from the column 33. In the embodiment described above, the substantially whole region of the optical path through which the exposure light beam IL passes is filled with the purge gas. However, only a part thereof, for example, only the projection optical system and the illumination optical system may be filled with the purge gas, depending on the exposure wavelength. Alternatively, it is unnecessary to provide the mechanism for recovering the purge gas. Further, in the embodiment described above, the reticle chamber 23 and the wafer chamber 38 are the air-tight chambers. However, they may be simple casings when the purge gas is not supplied to the inside thereof.

Next, explanation will be made with reference to FIG. 20 for an example of the process for producing a semiconductor device based on the use of the projection exposure apparatus of the embodiment described above.

Figure 20:
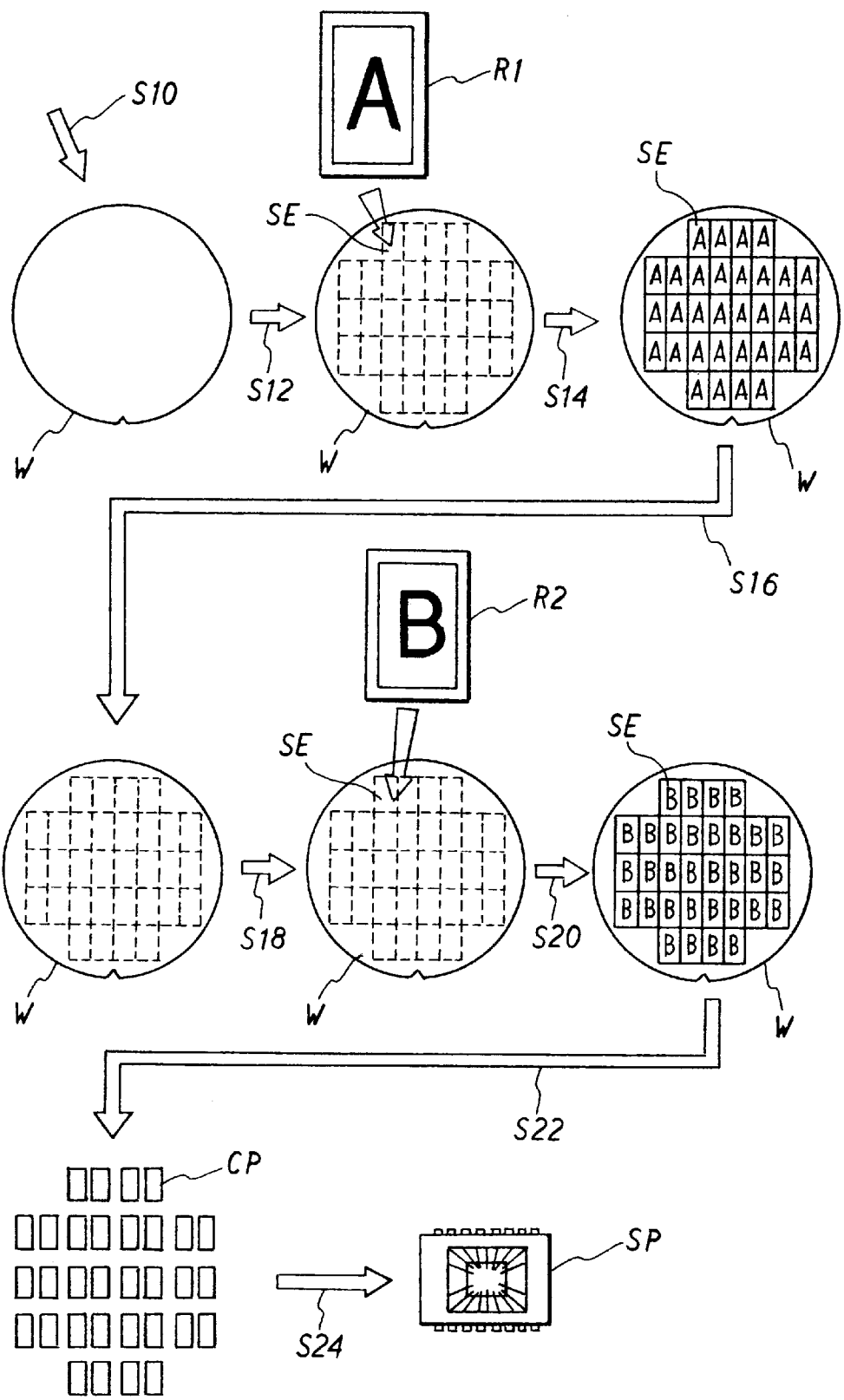
FIG. 20 shows exemplary production steps for a semiconductor device, based on the use of the projection exposure apparatus according to the embodiment.

FIG. 20 shows exemplary steps for producing a semiconductor device. In FIG. 2, the wafer W is firstly produced, for example, from silicon semiconductor. After that, photoresist is applied onto the wafer W (step S10). In the next step S12, the reticle R1 shown in FIG. 1 is moved to the position under the illumination area so that all of the shot areas SE on the wafer W are subjected to scanning exposure with a pattern (indicated by the symbol A) on the reticle R1. Subsequently, in the step S14, a predetermined pattern is formed on the respective shot areas SE on the wafer W by performing, for example, the development, the etching, and the ion implantation.

Subsequently, in the step S16, the photoresist is applied onto the wafer W. In the step S18 to be performed thereafter, the reticle R2 in place of the reticle R1 shown in FIG. 1 is moved to the position under the illumination area so that the respective shot areas SE on the wafer W are subjected to scanning exposure with a pattern (designated by the symbol B) on the reticle R2. In the step S20, for example, the development, the etching, and the ion implantation are performed for the wafer W. Thus, a predetermined pattern is formed on the respective shot areas on the wafer W.

The steps ranging from the exposure step to the pattern formation step described above (step S16 to step S20) are repeated in a necessary number of times required to produce a desired semiconductor device. For example, the dicing step (step S22) for separating one by one the respective chips CP on the wafer W, the bonding step, and the packaging step (step S24) are performed. Thus, the semiconductor device SP as a product is produced.

In the embodiment described above, the present invention is applied to the projection exposure apparatus based on the scanning exposure system. However, the present invention is not limited thereto. The present invention is equivalently applicable even in the case of the projection exposure apparatus of the full field exposure type (static exposure type) such as those based on the step-and-repeat system, the exposure apparatus based on the proximity system, the exposure apparatus to use the EUV light beam such as the X-ray as the exposure light beam, and the charged particle beam exposure apparatus to use the electron beam or the ion beam (energy beam) as the light source (energy source).

The way of the use of the exposure apparatus is not limited to the exposure apparatus for producing the semiconductor element. For example, the present invention is also widely applicable to the exposure apparatus for the liquid crystal element formed on the angular type glass plate and the display device such as the plasma display, and the exposure apparatus for producing a variety of devices such as the image pickup device (for example, CCD), the micromachine, and the thin film magnetic head. Further, the present invention is also applicable to the exposure step (exposure apparatus) for producing the mask (for example, photomask and reticle) formed with the mask pattern for various devices by using the photolithography step.

When the linear motor is used for the wafer stage system or the reticle stage system, the movable stage may be held in accordance with any system including, for example, the air-floating type based on the use of the air bearing and the magnetically floating type.

It is a matter of course that the present invention is not limited to the embodiments described above, which may be embodied in other various forms without deviating from the gist or essential characteristics of the present invention.

According to the exposure method and the exposure apparatus of the present invention, it is easy to assemble and adjust the stage system, and it is possible to assemble and adjust the entire exposure apparatus easily and quickly owing to the module system. When the covering member for covering the space between the stage chamber and the projection system is provided, when the gas for transmitting the exposure light beam is supplied to the inside of the stage chamber, then the gas is effectively utilized, and thus, it is possible to maintain a high concentration of the gas on the optical path thereof.

According to the exposure method and the exposure apparatus of the present invention, it is easy to assemble and adjust, for example, the stage system by adopting the module system, and it is possible to measure, for example, the positional relationship of the stage system easily and correctly. The stage module of the present invention makes it easy to assemble and maintain the exposure apparatus.

According to the exposure method and the exposure apparatus of the present invention, it is possible to enhance the throughput when the scanning exposure is performed, because the scanning velocity is optimized.

According to the method for producing the device concerning the present invention, it is possible to produce a variety of devices at a high throughput at low cost by using the exposure apparatus of the present invention.

What is claimed is:

1. An exposure apparatus for exposing a second object with an exposure light beam passing through a first object, the exposure apparatus comprising:
   a frame;
   a first stage chamber which accommodates a first stage system which carries the first object while holding the first object; and
   a second stage chamber which accommodates a second stage system which carries the second object while holding the second object, the second stage chamber being detachably installed to the frame independent of the first stage chamber, the first stage chamber being detachably installed to the frame independent of the second stage chamber.

2. The exposure apparatus according to claim 1, further comprising a projection system which projects an image of a pattern on the first object onto the second object, the projection system being installed to the frame.

3. The exposure apparatus according to claim 2, wherein the second object includes a first substrate and a second substrate, and the second stage system includes a first substrate stage which is movable while holding the first substrate, and a second substrate stage which is movable while holding the second substrate.

4. The exposure apparatus according to claim 2, wherein the frame includes a first base member on which the second stage chamber is placed, a second base member which is arranged on the first base member with a vibration-preventive pedestal intervening therebetween and on which the first stage chamber is placed, and a third base member which is arranged on the first base member with a vibration-preventive pedestal intervening therebetween and to which the projection system is installed.

5. The exposure apparatus according to claim 2, wherein the second stage system independently moves the different second objects respectively, and wherein the frame comprises a base member on which the second stage system is placed, and a column which is arranged on a mounting surface on which the base member is mounted via a vibration-preventive mechanism and to which the projection system is installed.

6. The exposure apparatus according to claim 5, further comprising an illumination system which illuminates the first object with the exposure light beam and of which a first portion is arranged on the mounting surface and a second portion is arranged on the column.

7. The exposure apparatus according to claim 6, wherein concentrations of light-absorbing substance in the illumination system and the projection system are set to be lower than those in the first and second stage chambers.

8. The exposure apparatus according to claim 6, further comprising a first transport system which transports the first object into the first stage chamber, a first transport chamber in which the first transport system is accommodated and which is connected to the first stage chamber, a second transport system which transports the second object into the second stage chamber, a second transport chamber in which the second transport system is accommodated and which is connected to the second stage chamber, and a sub-frame to which the first and second transport chambers are detachably installed respectively and which is provided apart from the frame.

9. The exposure apparatus according to claim 8, further comprising a temperature-adjusting unit which adjusts the temperature of the second object before the second object is transported into the second stage chamber.

10. The exposure apparatus according to claim 8, wherein concentrations of light-absorbing substance in the first and second stage chambers are set to be lower than those in the first and second transport chambers.

11. The exposure apparatus according to claim 2, wherein the projection system is detachably installed to the frame independently of the first and second stage chambers.

12. The exposure apparatus according to claim 2, wherein the second stage system has a plurality of movable members which hold different second objects respectively and which are movable independently, and wherein the exposure apparatus comprises an interferometer system which measures positional information for the respective movable members independently at a first position in which the second object is exposed with the exposure light beam via the first object and at a second position in which a mark of the second object is detected.

13. The exposure apparatus according to claim 1, wherein:
   when the first object and the second object are synchronously moved in order to scanning-expose the second object with the exposure light beam via the first object, one of the first stage system and the second stage system moves the one of the first object and the second object at a scanning velocity which is determined by a control system so that exposure time is substantially shortest depending on a rate of acceleration during movement of the one of the first object and the second object.

14. The exposure apparatus according to claim 13, wherein when LY represents a width of a rectangle area in a scanning direction to be illuminated with the exposure light beam during the scanning exposure for the first object or the second object, D represents a width of an illumination area in the scanning direction to be exposed with the exposure light beam for the first object or the second object, α represents the rate of acceleration, and V represents the scanning velocity, the scanning velocity V is determined so that a value of ΔT, which is given by ΔT=2·V/α+(LY+D)/V, is substantially minimum.

15. A method for producing a device, comprising the step of transferring a mask pattern onto a workpiece by using the exposure apparatus as defined in claim 1.

16. An exposure apparatus for exposing a second object with an exposure light beam passing through a first object, the exposure apparatus comprising:
- a frame;
- a first stage chamber which accommodates a first stage system which carries the first object while holding the first object, the first stage chamber being detachably installed to the frame;
- a second stage chamber which accommodates a second stage system which carries the second object while holding the second object, the second stage chamber being detachably installed to the frame;
- a projection system which projects an image of a pattern on the first object onto the second object, the projection system being installed to the frame;
- a gas supply apparatus which supplies a gas for transmitting the exposure light beam therethrough, to the inside of the first stage chamber, the second stage chamber, and the projection system respectively;
- a first covering member which seals space between the first stage chamber and the projection system; and
- a second covering member which seals space between the projection system and the second stage chamber.

17. The exposure apparatus according to claim 16, wherein the second stage system moves the different second objects independently, and wherein the frame comprises a base member on which the second stage system is placed, and a column which is arranged on a mounting surface on which the base member is mounted via a vibration-preventive mechanism and to which the projection system is installed.

18. The exposure apparatus according to claim 17, further comprising an illumination system which illuminates the first object with the exposure light beam and of which a first portion is arranged on the mounting surface and a second portion is arranged on the column.

19. The exposure apparatus according to claim 18, wherein concentrations of light-absorbing substance in the illumination system and the projection system are set to be lower than those in the first and second stage chambers.

20. The exposure apparatus according to claim 16, wherein the first and second stage chambers are detachably installed to the frame independently.

21. An exposure apparatus for exposing a second object with an exposure light beam passing through a first object, the exposure apparatus comprising:
- a frame;
- a first stage chamber which accommodates a first stage system which carries the first object while holding the first object, the first stage chamber being detachably installed to the frame;
- a second stage chamber which accommodates a second stage system which carries the second object while holding the second object, the second stage chamber being detachably installed to the frame;
- a transport system which transports the second object into the second stage chamber;
- a transport chamber in which the transport system is accommodated; and
- a gas supply apparatus which supplies a gas for transmitting the exposure light beam therethrough, to the inside of the first stage chamber, the second stage chamber, and the transport chamber respectively.

22. The exposure apparatus according to claim 21, wherein the gas supply apparatus supplies the gas so that a concentration of the gas in the second stage chamber is higher than that in the transport chamber.

23. The exposure apparatus according to claim 22, further comprising gas supply tubes which connect the first stage chamber, the second stage chamber, and the transport chamber to the gas supply apparatus respectively, solenoid-operated valves which are provided for the respective gas supply tubes, and a gas control system which controls operation of the solenoid-operated valves.

24. The exposure apparatus according to claim 22, further comprising a sensor which measures a concentration of a light-absorbing substance in the first stage chamber, the second stage chamber, and the transport chamber, wherein the gas supply apparatus supplies the gas to the first stage chamber, the second stage chamber, and the transport chamber on the basis of the concentration of the light-absorbing substance measured by the sensor.

25. The exposure apparatus according to claim 21, wherein the transport chamber comprises a closeable opening through which the second object passes in addition to an opening through which the second object is carried into or from the second stage chamber.

26. The exposure apparatus according to claim 21, wherein the transport chamber comprises a first chamber which communicates with the second stage chamber via a first opening and a second chamber which communicates with the first chamber via a second opening which is different than the first opening, wherein the transport system transports the second object via the first and second openings.

27. The exposure apparatus according to claim 26, further comprising an opening/closing unit which controls the first opening and the second opening independently so as to prevent the first opening and the second opening from opening simultaneously.

28. The exposure apparatus according to claim 26, further comprising an opening/closing unit which controls the first opening and the second opening respectively so that the first opening has a narrower opening area than that of the second opening when the second object passes through the first opening and the second opening.

29. The exposure apparatus according to claim 21, wherein the first and second stage chambers are detachably installed to the frame independently.

30. An exposure apparatus for exposing a second object with an exposure light beam passing through a first object, the exposure apparatus comprising:
- a frame;
- a first stage chamber which accommodates a first stage system which carries the first object while holding the first object, the first stage chamber being detachably installed to the frame;
- a second stage chamber which accommodates a second stage system which carries the second object while holding the second object, the second stage chamber being detachably installed to the frame;

a first transport system which transports the first object into the first stage chamber;

a first transport chamber in which the first transport system is accommodated and which is connected to the first stage chamber;

a second transport system which transports the second object into the second stage chamber;

a second transport chamber to which the second transport system is accommodated and which is connected to the second stage chamber; and a sub-frame in which the first and second transport chambers are detachably installed respectively and which is provided apart from the frame.

31. The exposure apparatus according to claim 30, further comprising a gas supply apparatus which supplies a gas, of which the transmissivity with respect to the exposure light beam is higher than that of the atmospheric air, into the first and second stage chambers and the first and second transport chambers, respectively.

32. The exposure apparatus according to claim 31, wherein a concentration of light-absorbing substance in the first stage chamber is set to be lower than that in the first transport chamber and a pressure in the first stage chamber is set to be higher than that in the first transport chamber, and a concentration of light-absorbing substance in the second stage chamber is set to be lower than that in the second transport chamber and a pressure in the second stage chamber is set to be higher than that in the second transport chamber.

33. The exposure apparatus according to claim 30, wherein the second stage system independently moves different second objects respectively, and wherein the frame comprises a base member on which the second stage system is placed, and a column which is arranged on a mounting surface on which the base member is mounted via a vibration-preventive mechanism and to which the projection system is installed.

34. The exposure apparatus according to claim 33, further comprising an illumination system which illuminates the first object with the exposure light beam and of which a first portion is arranged on the mounting surface and a second portion is arranged on the column.

35. The exposure apparatus according to claim 34, wherein concentrations of light-absorbing substance in the illumination system and the projection system are set to be lower than those in the first and second stage chambers.

36. The exposure apparatus according to claim 30, wherein the first and second stage chambers are detachably installed to the frame independently.

37. The exposure apparatus according to claim 1, further comprising a first transport chamber which is connected to the first stage chamber and a second transport chamber which is connected to the second stage chamber, wherein a concentration of a substance which attenuates the exposure light beam in the first and second stage chambers is set to be lower than that in the first and second transport chambers, respectively.

38. The exposure apparatus according to claim 1, further comprising a sub-frame which is provided apart from the frame, and a first transport chamber and a second transport chamber which are detachably installed to the sub-frame, respectively, wherein the first transport chamber is connected to the first stage chamber and the second transport chamber is connected to the second stage chamber.

39. The exposure apparatus according to claim 1, further comprising a projection system which is installed to the frame to project an image of a pattern on the first object onto the second object, and a illumination system a part of which is arranged in the frame.

40. The exposure apparatus according to claim 1, further comprising:

a first transport chamber which is connected to the first stage chamber; and a gas supply apparatus which is connected to the first and second stage chambers to supply a gas, of which transmissivity of the exposure light beam is higher than that of the atmospheric air, into the first and second stage chambers, respectively, wherein a pressure in the first stage chamber and a pressure in the second stage chamber are set to be higher than that in the first and second transport chambers, respectively.

41. The exposure apparatus according to claim 1, wherein the first and second objects are synchronously moved during the exposure, and one of the first stage system and the second stage system moves one of the first object and the second object at a scanning velocity which is determined so that exposure time is substantially minimum depending on a rate of acceleration of the one of the first object and the second object during the synchronous movement.

42. The exposure apparatus according to claim 41, wherein when LY represents a width of a rectangle area of one of the first object and the second object in a scanning direction which is irradiated with the exposure light beam with the synchronous movement, D represents a width of an illumination area illuminated by the exposure light beam in the scanning direction on one of the first object and the second object, $\alpha$ represents the rate of acceleration, and v represents the scanning velocity, the scanning velocity v is determined so that a value of $\Delta T$, which is given by $\Delta T = 2 \cdot v/\alpha + (LY+D)/v$, is substantially minimum.

* * * * *